(12) United States Patent
Fujii et al.

(10) Patent No.: US 9,005,358 B2
(45) Date of Patent: Apr. 14, 2015

(54) COMPOSITION FOR FERROELECTRIC THIN FILM FORMATION, METHOD FOR FORMING FERROELECTRIC THIN FILM, AND FERROELECTRIC THIN FILM FORMED BY THE METHOD THEREOF

(71) Applicant: Mitsubishi Materials Corporation, Tokyo (JP)

(72) Inventors: Jun Fujii, Naka (JP); Hideaki Sakurai, Naka (JP); Takashi Noguchi, Akita (JP); Nobuyuki Soyama, Naka (JP)

(73) Assignee: Mitsubishi Materials Corporation, Tokyo (JP)

( * ) Notice: Subject to any disclaimer, the term of this patent is extended or adjusted under 35 U.S.C. 154(b) by 24 days.

(21) Appl. No.: 13/899,111

(22) Filed: May 21, 2013

(65) Prior Publication Data

US 2013/0295414 A1    Nov. 7, 2013

Related U.S. Application Data

(62) Division of application No. 12/736,944, filed as application No. PCT/JP2009/059804 on May 28, 2009, now Pat. No. 8,859,051.

(30) Foreign Application Priority Data

| May 28, 2008 | (JP) | 2008-139623 |
| May 28, 2008 | (JP) | 2008-139641 |
| Nov. 4, 2008 | (JP) | 2008-282849 |
| Dec. 24, 2008 | (JP) | 2008-328101 |
| Jan. 20, 2009 | (JP) | 2009-009818 |
| Jan. 20, 2009 | (JP) | 2009-009819 |
| Feb. 3, 2009 | (JP) | 2009-022638 |
| Feb. 3, 2009 | (JP) | 2009-022641 |
| Feb. 4, 2009 | (JP) | 2009-023278 |
| Feb. 4, 2009 | (JP) | 2009-023280 |
| Feb. 6, 2009 | (JP) | 2009-025681 |
| Feb. 6, 2009 | (JP) | 2009-025683 |
| Mar. 12, 2009 | (JP) | 2009-059019 |
| Mar. 13, 2009 | (JP) | 2009-060348 |
| Mar. 31, 2009 | (JP) | 2009-085819 |
| Mar. 31, 2009 | (JP) | 2009-085830 |
| Apr. 21, 2009 | (JP) | 2009-102815 |
| Apr. 21, 2009 | (JP) | 2009-102817 |
| Apr. 23, 2009 | (JP) | 2009-105076 |
| Apr. 24, 2009 | (JP) | 2009-105883 |
| Apr. 24, 2009 | (JP) | 2009-105885 |

(51) Int. Cl.

| $B05D\ 3/02$ | (2006.01) |
| $H01L\ 41/187$ | (2006.01) |
| $C04B\ 24/40$ | (2006.01) |
| $C04B\ 24/42$ | (2006.01) |
| $C04B\ 35/624$ | (2006.01) |
| $H01L\ 41/18$ | (2006.01) |
| $B05D\ 3/04$ | (2006.01) |
| $C01G\ 25/00$ | (2006.01) |
| $C23C\ 18/12$ | (2006.01) |
| $H01G\ 4/12$ | (2006.01) |
| $H01G\ 4/20$ | (2006.01) |
| $H01L\ 21/02$ | (2006.01) |
| $H01L\ 21/316$ | (2006.01) |
| $H01L\ 49/02$ | (2006.01) |
| $H01L\ 41/318$ | (2013.01) |
| $C04B\ 35/491$ | (2006.01) |
| $C04B\ 35/493$ | (2006.01) |
| $C04B\ 35/632$ | (2006.01) |
| $H01B\ 3/14$ | (2006.01) |
| $C23C\ 30/00$ | (2006.01) |
| $H01L\ 27/108$ | (2006.01) |
| $C04B\ 111/92$ | (2006.01) |
| $H01L\ 27/115$ | (2006.01) |

(52) U.S. Cl.
CPC .......... $H01L\ 41/1876$ (2013.01); $C04B\ 24/40$ (2013.01); $C04B\ 24/42$ (2013.01); $C04B\ 2111/92$ (2013.01); $C04B\ 2235/44$ (2013.01); $C04B\ 35/624$ (2013.01); $H01L\ 41/18$ (2013.01); $B05D\ 3/02$ (2013.01); $B05D\ 3/0209$ (2013.01); $B05D\ 3/04$ (2013.01); $B05D\ 3/0406$ (2013.01); $B05D\ 3/0413$ (2013.01); $C01G$

25/006 (2013.01); C01P 2002/50 (2013.01); C01P 2006/40 (2013.01); C23C 18/1204 (2013.01); C23C 18/1225 (2013.01); C23C 18/1279 (2013.01); H01G 4/1245 (2013.01); H01G 4/206 (2013.01); H01L 21/02197 (2013.01); H01L 21/02282 (2013.01); H01L 21/31691 (2013.01); H01L 27/11502 (2013.01); H01L 28/55 (2013.01); H01L 41/318 (2013.01); C04B 35/491 (2013.01); C04B 35/493 (2013.01); C04B 35/632 (2013.01); C04B 35/6325 (2013.01); C04B 2235/3224 (2013.01); C04B 2235/3225 (2013.01); C04B 2235/3227 (2013.01); C04B 2235/3229 (2013.01); C04B 2235/3232 (2013.01); C04B 2235/3293 (2013.01); C04B 2235/3298 (2013.01); C04B 2235/3418 (2013.01); C04B 2235/441 (2013.01); C04B 2235/443 (2013.01); C04B 2235/447 (2013.01); C04B 2235/449 (2013.01); C04B 2235/6585 (2013.01); H01B 3/14 (2013.01); B05D 3/0453 (2013.01); B05D 3/0473 (2013.01); C23C 30/00 (2013.01); H01L 27/108 (2013.01)

(58) Field of Classification Search
None
See application file for complete search history.

(56) References Cited

U.S. PATENT DOCUMENTS

| | | | |
|---|---|---|---|
| 5,116,643 | A | 5/1992 | Miller et al. |
| 5,468,679 | A | 11/1995 | Paz de Araujo et al. |
| 6,066,581 | A | 5/2000 | Chivukula et al. |
| 6,080,592 | A | 6/2000 | Paz de Araujo et al. |
| 6,126,743 | A | 10/2000 | Saegusa et al. |
| 6,143,366 | A | 11/2000 | Lu |
| 6,203,608 | B1 | 3/2001 | Sun et al. |
| 2002/0135001 | A1 | 9/2002 | Gaucher |
| 2003/0161959 | A1 | 8/2003 | Kodas et al. |
| 2003/0227803 | A1 | 12/2003 | Natori et al. |
| 2005/0151177 | A1 | 7/2005 | Miyazawa et al. |
| 2006/0046320 | A1 | 3/2006 | Sunahara et al. |
| 2006/0204651 | A1 | 9/2006 | Wai et al. |
| 2006/0211271 | A1 | 9/2006 | Weigel et al. |
| 2007/0097182 | A1* | 5/2007 | Kubota et al. .......... 347/70 |

FOREIGN PATENT DOCUMENTS

| | | | |
|---|---|---|---|
| CN | 1830811 | A | 9/2006 |
| CN | 1969407 | A | 5/2007 |
| EP | 0674019 | A1 | 9/1995 |
| EP | 1624468 | A1 | 2/2006 |
| JP | 60-236404 | A | 11/1985 |
| JP | 04-328817 | A | 11/1992 |
| JP | 05-085704 | A | 4/1993 |
| JP | 05-343641 | A | 12/1993 |
| JP | 07-252664 | A | 10/1995 |
| JP | 08-153854 | A | 6/1996 |
| JP | 09-052713 | A | 2/1997 |
| JP | 10-231196 | A | 9/1998 |
| JP | 11-079747 | A | 3/1999 |
| JP | 11-220185 | A | 8/1999 |
| JP | 11-510855 | A | 9/1999 |
| JP | 2000-204487 | A | 7/2000 |
| JP | 2001-509766 | A | 7/2001 |
| JP | 2002-234709 | A | 8/2002 |
| JP | 2003-002647 | A | 1/2003 |
| JP | 2004-277200 | A | 10/2004 |
| JP | 2005-101491 | A | 4/2005 |
| JP | 2005-217219 | A | 8/2005 |
| JP | 2005-272294 | A | 10/2005 |
| JP | 2006-282456 | A | 10/2006 |
| JP | 2008-084581 | A | 4/2008 |
| WO | WO-97/05994 | A1 | 2/1997 |
| WO | WO-98/28466 | A1 | 7/1998 |
| WO | WO-99/25014 | A1 | 5/1999 |

OTHER PUBLICATIONS

Office Action mailed Jul. 2, 2013, issued for the Japanese Patent Application No. 2009-105076 and English translation thereof.
Office Action mailed Jul. 2, 2013, issued for the Japanese Patent Application No. 2009-105883 and English translation thereof.
Office Action mailed Jul. 2, 2013, issued for the Japanese Patent Application No. 2009-105885 and English translation thereof.
Office Action mailed Aug. 20, 2013, issued for the Japanese Patent Application No. 2009-102817 and English translation thereof.
Office Action dated Jun. 4, 2013, issued for U.S. Appl. No. 12/736,944.
K. Kurihara, "Y Doping Effect on the Dielectric Properties of BST Thin Films and Their Applications," Ceramics, vol. 42, pp. 175-180 (2007) (p. 175, left column, lines 20 to 22) with partial English translation thereof.
International Search Report dated Sep. 29, 2009, issued for PCT/JP2009/059804.
European Search Report dated Mar. 7, 2012, issued for the corresponding European patent application No. 11195995.3.
Office Action dated Dec. 5, 2012, issued for the Chinese patent application No. 200980119294.7 and English translation thereof.
Office Action dated Dec. 5, 2012, issued for the Chinese patent application No. 201110025514.9 and English translation thereof.
Office Action dated Jan. 18, 2013, issued for U.S. Appl. No. 12/736,944.
Decision for Grant of Patent dated Dec. 10, 2012, issued for the Korean patent application No. 10-2010-7029565 and English translation thereof.
S. B. Majumder, et al., "Effect of Cerium Doping on the Microstructure and Electrical Properties of Sol-Gel Derived $Pb_{1.05}(Zr_{0.53-\delta}Ce_{\delta}Ti_{0.47})O_3(\delta<10at.\%)$ Thin Films," Materials Science and Engineering, B98, 2003, pp. 25-32.
Abstract and partial machine translation of JP2003-002647, Jan. 2003.
Lee, Kwang Bae et al., "Characterization of a Bismuth-Doped Lead Zirconate Titanate Thin Film Capacitor", Journal of the Korean Physical Society, Vol.31, No. 3, Sep. 1997, pp. 532-536.
Office Action mailed Dec. 3, 2013, issued for the Japanese patent application No. 2009-059019 and English translation thereof.
Office Action mailed Dec. 3, 2013, issued for the Japanese patent application No. 2009-085819 and English translation thereof.
Office Action mailed Dec. 3, 2013, issued for the Japanese patent application No. 2009-060348 and English translation thereof.
Office Action mailed Dec. 27, 2013, issued for U.S. Appl. No. 12/736,944.
Notice of Allowance mailed Mar. 18, 2014, issued for the Japanese patent application No. 2009-105883 and English translation thereof.
Pre-Appeal Report drafted Mar. 14, 2014, issued for the Japanese patent application No. 2009-105076 and English translation thereof.
Office Action mailed May 27, 2014, issued for the Japanese patent application No. 2009-059019 and English translation thereof.
Office Action mailed May 27, 2014, issued for the Japanese patent application No. 2009-060348 and English translation thereof.
Office Action mailed Jun. 3, 2014, issued for the Japanese patent application No. 2009-085819 and English translation thereof.
Allen W. Apblett et al., "Molecular Design of Carboxylic Precursors for Zirconia," Materials Research Society, Symposium Proceedings, vol. 271, 1992, pp. 77-82 and cover sheets.

* cited by examiner

*Primary Examiner* — Erma Cameron
(74) *Attorney, Agent, or Firm* — Locke Lord LLP; James E. Armstrong, IV; Nicholas J. DiCeglie, Jr.

(57) ABSTRACT

Disclosed is a composition for ferroelectric thin film formation which is used in the formation of a ferroelectric thin film of one material selected from the group consisting of PLZT, PZT, and PT. The composition for ferroelectric thin film formation is a liquid composition for the formation of a thin film of a mixed composite metal oxide formed of a mixture of a composite metal oxide (A) represented by general formula (1): $(Pb_xLa_y)(Zr_zTi_{(1-z)})O_3$ [wherein $0.9 < x < 1.3$, $0 \leq y < 0.1$, and $0 \leq z < 0.9$ are satisfied] with a composite oxide (B) or a carboxylic acid (B) represented by general formula (2): $C_nH_{2n+1}COOH$ [wherein $3 \leq n \leq 7$ is satisfied]. The composite oxide (B) contains one or at least two elements selected from the group consisting of P (phosphorus), Si, Ce, and Bi and one or at least two elements selected from the group consisting of Sn, Sm, Nd, and Y (yttrium).

13 Claims, 11 Drawing Sheets

ε 2030

ε 2260

COMPOSITION FOR FERROELECTRIC THIN FILM FORMATION, METHOD FOR FORMING FERROELECTRIC THIN FILM, AND FERROELECTRIC THIN FILM FORMED BY THE METHOD THEREOF

This application is a divisional application of U.S. application Ser. No. 12/736,944 filed on Nov. 24, 2010 which claims the benefit of Japanese Patent Application No. 2009-105883 filed on Apr. 24, 2009, Japanese Patent Application No. 2009-085819 filed on Mar. 31, 2009, Japanese Patent Application No. 2009-105076 filed on Apr. 23, 2009, Japanese Patent Application No. 2009-060348 filed on Mar. 13, 2009, Japanese Patent Application No. 2009-105885 filed on Apr. 24, 2009, Japanese Patent Application No. 2009-102817 filed on Apr. 21, 2009, Japanese Patent Application No. 2009-085830 filed on Mar. 31, 2009, Japanese Patent Application No. 2009-102815 filed on Apr. 21, 2009, and Japanese Patent Application No. 2009-059019 filed on Mar. 12, 2009, the disclosures of which are incorporated herein in their entireties by reference.

TECHNICAL FIELD

The present invention relates to a composition for the formation of a ferroelectric thin film, a method for forming a ferroelectric thin film, and a ferroelectric thin film formed by the method thereof.

BACKGROUND ART

As a method for preparing a ferroelectric film, there is generally known a method in which an alkoxide or organic acid salt of individual constituent metals is dissolved in a polar solvent to prepare a mixed solution, and the resulting solution is applied and dried on a metal substrate to form a coated film, followed by baking at a temperature equal to or higher than its crystallization temperature, thereby forming a dielectric thin film (for example, see Patent Document 1).

Further, for the purpose of use in DRAMs or nonvolatile memories, there is known a method of producing a dielectric device which includes forming an amorphous or crystalline dielectric film on a semiconductor substrate, and doping impurities on the dielectric film by a thermal diffusion method, an ion implantation method, an ion doping method, or the like (for example, see Patent Document 2). The Patent Document 2 discloses a PZT film as a metal dielectric film, and P (phosphorus) ions as impurities. Doping of P (phosphorus) can improve memory retention characteristics of DRAMs or nonvolatile memories equipped with a dielectric capacitor.

Further, for the purpose of use in a capacitor of semiconductor memory cells, it has been disclosed a method of forming a ferroelectric film in which, upon forming a ferroelectric film of PZT by a sol-gel method, a lead-titanium double alkoxide or lead-zirconium double alkoxide is formed, the reaction product is subjected to hydrolysis and a condensation reaction to make a high-molecular weight version, a raw material solution is prepared, the raw material solution is applied, the applied raw material solution is dried to form a dried film, and the dried film is baked (for example, see Patent Document 3). The Patent Document 3 describes that, in order to suppress fatigue (decrease in residual polarization value) or leakage current due to the inversion of applied voltage upon the use of the formed PZT thin film, the fourth metal element such as lanthanum, niobium, or iron may be added to the raw material solution. According to Patent Document 3, hydrolysis and condensation reactions of individual double alkoxides uniformly proceed, and PZT thin films formed from this sol-gel solution exhibit satisfactory electrical characteristics such as smooth surface, large amount of residual polarization and small amount of leakage current, so it is possible to meet the required performance.

Further, for the purpose of use in a variety of devices taking advantage of electrical or optical properties, there is known a composition which is used in the formation of a PLZT ferroelectric thin film, wherein the composition is a liquid composition for the formation of a thin film of a mixed composite metal oxide of a composite metal compound A represented by PLZT and a composite metal oxide formed of one or more elements selected from Bi, Si, Pb, Ge, Sn, Al, Ga, In, Mg, Ca, Sr, Ba, V, Nb, Ta, Sc, Y, Ti, Zr, Hf, Cr, Mn, Fe, Co, Ni, Zn, Cd, Li, Na and K, the composition including a solution wherein a compound constituting the metal oxide is dissolved in an organic solvent in such a proportion as to provide the desired metal atom ratio (for example, see Patent Document 4). In the Patent Document 4, the use of such a composition enables the crystallization even at a low temperature of 450° C. or lower, upon the formation of a ferroelectric thin film.

In addition, for the purpose of use in nonvolatile memories, there is a disclosure of a mixed liquid for the formation of a ferroelectric thin film, wherein Ca, Sr, or La is added to PZT (for example, see Patent Document 5).

Further, when a voltage is applied to a thin film of PZT which is a representative ferroelectric substance, the leakage current density increases which is confirmed to consequently result in a dielectric breakdown.

To cope with this problem, an attempt has been made to improve leakage characteristics by the addition of trace elements to a ferroelectric thin film such as PZT film, but the results are still unsatisfactory (for example, see Patent Document 6 and 7).

In addition, an attempt has been made to decrease the leakage current density by increasing the thickness of the ferroelectric film configuration, but such an attempt has the problem of lowering the capacitance.

As countermeasures against the above-mentioned problems, it has been demonstrated that a specific permittivity of a non-doped PZT film can be improved from 400 to 700 by the doping of cerium nitrate at 1 at. % on a PZT film having a film thickness of about 1 μm, but such a specific permittivity is still low, thus being insufficient for practical use (for example, see Non-Patent Document 1).

Further, when a ferroelectric film is configured into a thin film, a sufficient specific permittivity cannot be obtained due to the action of great stress resulting from the restraint of a substrate (for example, see Non-Patent Document 2).

For these reasons, it has been attempted to improve the specific permittivity through the addition of trace elements (for example, see Non-Patent Document 1).

Further, film thickness reduction theoretically leads to an increase in capacitance, so it has been attempted to improve the capacitance through the reduction of the film thickness.

Further, it has been attempted to improve the dielectric strength voltage characteristics by doping PZT with Bi (for example, see Patent Document 6). However, the Patent Document 6 merely exemplifies Bi as a doping element, but there is no working example illustrating the practical application of doping. In addition, there is no measurement of the specific permittivity therein.

Further, it has been described that the addition of acetic acid to a PZT sol-gel liquid improves the stability of a solution in air (for example, see Patent Document 8). There has been described that upon the addition of an organic acid ester to a PZT sol-gel liquid, a PZT film with improved (111) orientation can be obtained taking advantage of lattice information of the underlying Pt(111) film (for example, see Patent Document 9).

However, there is no report showing an improvement in specific permittivity of the PZT film when organic acid is added to a PZT sol-gel liquid.

PATENT DOCUMENT

[Patent Document 1] Japanese Unexamined Patent Application, First Publication No. S 60-236404 (page 3, right bottom column, line 11 to page 4, left bottom column, line 10, page 5, right top column, line 10 to the same page, left bottom column, line 17)

[Patent Document 2] Japanese Unexamined Patent Application, First Publication No. H 5-343641 (Claims 3, 4, and 8, paragraph numbers [0001], and [0065])

[Patent Document 3] Japanese Unexamined Patent Application, First Publication No. H 7-252664 (Claims 2, 3, 7, and 8, paragraph numbers [0001], [0035], [0117], and

[Patent Document 4] Japanese Unexamined Patent Application, First Publication No. 2003-2647 (Claim 1, paragraph numbers [0001] and [0013])

[Patent Document 5] U.S. Pat. No. 6,203,608 (FIELD OF THE INVENTION, Claim 1)

[Patent Document 6] Japanese Unexamined Patent Application, First Publication No. H 8-153854 (Claim 1, and Claim 3)

[Patent Document 7] Japanese Unexamined Patent Application, First Publication No. 2005-217219 (Claim 5)

[Patent Document 8] Japanese Unexamined Patent Application, First Publication No. H 11-220185 (Claim 7, paragraph number [0008])

[Patent Document 9] Japanese Unexamined Patent Application, First Publication No. 2004-277200 (Claim 10)

NON-PATENT DOCUMENT

[Non-Patent Document 1] S. B. Majumder, D. C. Agrawal, Y. N. Mohopatra, and R. S. Katiyar, "Effect of Cerium Doping on the Microstructure and Electrical Properties of Sol-Gel Derived $Pb_{1.05}(Zr_{0.53-d}Ce_dTi_{0.47})O_3$ (d=10 at %) Thin Films", Materials Science and Engineering, B98, 2003, pp. 25-32 (FIG. 2)

[Non-Patent Document 2] Ceramics, 42, 175-180 (2007) (p. 175, left column, lines 20 to 22)

DISCLOSURE OF INVENTION

Problems to be Solved by the Invention

As shown in Patent Document 2, memory retention characteristics can be improved by doping of P (phosphorus) on a dielectric film. However, since Patent Document 2 relates to a method in which a dielectric film is formed and then P (phosphorus) is doped on the formed dielectric film, there is a risk associated with non-uniform distribution of dopants in the film or incorporation of impurities other than dopants into the film, and there is also a risk associated with the degradation of film quality of the dielectric film. Further, the operation may be complicated due to multiple processes such as the heat treatment process.

Further, as shown in Patent Document 3 to 5, techniques of adding various elements to improve characteristics of a dielectric film have been developed, but when a ferroelectric thin film is intended for use in a thin film capacitor with a high capacity density, it has been a requirement for balanced improvement of both leakage current characteristics and dielectric strength voltage characteristics, i.e. reduction of leakage current and improvement of dielectric strength voltage, or improvement of specific permittivity.

Further, if a film thickness of the formed ferroelectric thin film is not sufficient, this may result in a high leakage current density and the occurrence of a dielectric breakdown, and therefore it is impossible to sufficiently exert the performance as a capacitor.

Further, if a film thickness is excessively thick, sufficient capacitance could not be obtained.

Further, if a film thickness of the formed ferroelectric thin film is decreased in order to increase the capacitance, this may result in an increase in leakage current density and consequently the occurrence of dielectric breakdown, and therefore it is impossible to sufficiently exert the performance as a capacitor. In addition, it cannot be said that an attempt of adding trace elements to increase the specific permittivity is sufficiently carried out.

Further, Patent Document 4 describes the addition of various elements to a dielectric film, but the object thereof is to lower its crystallization temperature and only the results of a residual polarization value are described therein. In addition, in order to secure a high specific permittivity necessary for use as a thin film capacitor having a high capacity density, there is no disclosure of which element is used as a dopant for a dielectric film, and what amount of the dopant is added to contribute to improvement of the specific permittivity.

An object of the present invention is to provide a composition for the formation of a ferroelectric thin film, which is suitable for use in a thin film capacitor having a high capacity density, a method for forming a ferroelectric thin film, and a ferroelectric thin film formed by the same method.

Another object of the present invention is to provide a composition for the formation of a ferroelectric thin film, which is capable of achieving a balanced improvement of both leakage current characteristics and dielectric strength voltage characteristics, such as reduction of leakage current and improvement of dielectric strength voltage, by a simplified method and which is suitable for use in a thin film capacitor having a high capacity density, a method for forming a ferroelectric thin film, and a ferroelectric thin film formed by the same method.

A further object of the present invention is to provide a composition for the formation of a ferroelectric thin film, which is capable of achieving a specific permittivity equivalent to that of a conventional ferroelectric thin film and a lower leakage current density by a simplified method and which is suitable for use in a thin film capacitor having a high capacity density, a method for forming a ferroelectric thin film, and a ferroelectric thin film formed by the same method.

Yet another object of the present invention is to provide a composition for the formation of a ferroelectric thin film, which is capable of significantly improving a specific permittivity as compared to a conventional ferroelectric thin film by a simplified method and which is suitable for use in a thin film capacitor having a high capacity density, a method for forming a ferroelectric thin film, and a ferroelectric thin film formed by the same method.

Means for Solving the Problem

[Group 1]

A first embodiment of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), 0.9<x<1.3, 0≤y<0.1, and 0≤z<0.9] with a composite oxide B including one or more selected from the group consisting of P (phosphorus), Si, Ce, and Bi, the composition including an organometallic compound solution wherein the raw material constituting the composite metal oxide A and the raw material constituting the composite oxide B are dissolved in an organic solvent in such a proportion as to provide the metal atom ratio represented by the general formula (1).

The embodiment of A-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), 0.9<x<1.3, 0≤y<0.1, and 0≤z<0.9] with a composite oxide B including P (phosphorus), the composition including an organometallic compound solution wherein the raw material constituting the composite metal oxide A and the raw material constituting the composite oxide B are dissolved in an organic solvent in such a proportion as to provide the metal atom ratio represented by the general formula (1).

The embodiment of A-2 of the present invention is an invention based on the embodiment of A-1, wherein the raw material constituting the composite metal oxide A is a compound whose organic radical is bound to a metal element through oxygen or nitrogen atoms thereof.

The embodiment of A-3 of the present invention is an invention based on the embodiment of A-2, wherein the raw material constituting the composite metal oxide A is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of A-4 of the present invention is an invention based on the embodiment of A-1, wherein the raw material constituting the composite oxide B is a compound whose organic radical is bound to a P (phosphorus) element through oxygen or nitrogen atoms thereof.

The embodiment of A-5 of the present invention is an invention based on the embodiment of A-4, wherein the raw material constituting the composite oxide B is one or more selected from the group consisting of an alkoxide compound, a diol compound, a triol compound, a carboxylate compound, a β-diketonato compound, a β-diketoester compound, a β-iminoketo compound, and an amino compound.

The embodiment of A-6 of the present invention is an invention based on any one of the embodiment of A-1 to the embodiment of A-5, further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of A-7 of the present invention is an invention based on any one of the embodiment of A-1 to the embodiment of A-6, wherein the molar ratio B/A of the composite oxide B to the composite metal oxide A is in the range of 0<B/A<0.2.

The embodiment of A-8 of the present invention is an invention based on the embodiment of the embodiment of A-7, wherein the molar ratio B/A of the composite oxide B to the composite metal oxide A is in the range of 0.003≤B/A≤0.1.

The embodiment of A-9 of the present invention is a method for forming a ferroelectric thin film, including applying a ferroelectric thin film-forming composition based on any one of the embodiment of A-1 to the embodiment of A-8 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of A-10 of the present invention is a ferroelectric thin film formed by a method based on the embodiment of A-9.

The embodiment of A-11 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of A-10.

The embodiment of A-12 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of A-11 and corresponding to a frequency band of 100 MHz or higher.

The embodiment of B-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), 0.9<x<1.3, 0≤y<0.1, and 0≤z<0.9] with a composite oxide B (composite metal oxide) including Si, the composition including an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1).

The embodiment of B-2 of the present invention is an invention based on the embodiment of B-1, wherein the raw material constituting the composite metal oxide A and the composite oxide B (composite metal oxide) is a compound whose organic radical is bound to a metal element through oxygen or nitrogen atoms thereof.

The embodiment of B-3 of the present invention is an invention based on the embodiment of B-2, wherein the raw material constituting the composite metal oxide A and the composite oxide B (composite metal oxide) is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of B-4 of the present invention is an invention based on any one of the embodiment of B-1 to the embodiment of B-3, further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of B-5 of the present invention is an invention based on any one of the embodiment of B-1 to the embodiment of B-4, wherein the organic solvent is one or more selected from the group consisting of carboxylic acids, alcohols, esters, ketones, esters, cycloalkanes, aromatics and tetrahydrofurans.

The embodiment of B-6 of the present invention is an invention based on any one of the embodiment of B-1 to the embodiment of B-5, wherein the organic solvent includes propylene glycol.

The embodiment of B-7 of the present invention is an invention based on any one of the embodiment of B-1 to the embodiment of B-6, wherein the molar ratio B/A of the composite oxide B (composite metal oxide) to the composite metal oxide A is in the range of $0<B/A<0.1$.

The embodiment of B-8 of the present invention is an invention based on the embodiment of B-7, the molar ratio B/A of the composite oxide B (composite metal oxide) to the composite metal oxide A is in the range of $0.005 \leq B/A \leq 0.05$.

The embodiment of B-9 of the present invention is a method for forming a ferroelectric thin film, including applying a ferroelectric thin film-forming composition based on any one of the embodiment of B-1 to the embodiment of B-8 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of B-10 of the present invention is a ferroelectric thin film formed by a method based on the embodiment of B-9.

The embodiment of B-11 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of B-10.

The embodiment of B-12 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of B-11 and corresponding to a frequency band of 100 MHz or higher.

The embodiment of C-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0 \leq y<0.1$, and $0 \leq z<0.9$] with a composite oxide B (composite metal oxide) including Ce, the composition including an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1).

The embodiment of C-2 of the present invention is an invention based on the embodiment of C-1, wherein the raw material constituting the composite metal oxide A and the composite oxide B (composite metal oxide) is a compound whose organic radical is bound to a metal element through oxygen or nitrogen atoms thereof.

The embodiment of C-3 of the present invention is an invention based on the embodiment of C-2, wherein the raw material constituting the composite metal oxide A and the composite oxide B (composite metal oxide) is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of C-4 of the present invention is an invention based on any one of the embodiment of C-1 to the embodiment of C-3, further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of C-5 of the present invention is an invention based on any one of the embodiment of C-1 to the embodiment of C-4, wherein the molar ratio B/A of the composite oxide B (composite metal oxide) to the composite metal oxide A is in the range of $0<B/A<0.05$.

The embodiment of C-6 of the present invention is an invention based on the embodiment of C-5, the molar ratio B/A of the composite oxide B (composite metal oxide) to the composite metal oxide A is in the range of $0.005 \leq B/A \leq 0.03$.

The embodiment of C-7 of the present invention is a method for forming a ferroelectric thin film, including applying a ferroelectric thin film-forming composition based on any one of the embodiment of C-1 to the embodiment of C-6 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of C-8 of the present invention is a ferroelectric thin film formed by a method based on the embodiment of C-7.

The embodiment of C-9 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of C-8.

The embodiment of C-10 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of C-9 and corresponding to a frequency band of 100 MHz or higher.

The embodiment of D-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0\leq y<0.1$, and $0\leq z<0.9$] with a composite oxide B (composite metal oxide) including Bi, the composition including an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1).

The embodiment of D-2 of the present invention is an invention based on the embodiment of D-1, and is a composition for the formation of a ferroelectric thin film wherein the raw material constituting the composite metal oxide A and the composite oxide B (composite metal oxide) is a compound whose organic radical is bound to a metal element through oxygen or nitrogen atoms thereof.

The embodiment of D-3 of the present invention is an invention based on the embodiment of D-2, and is a composition for the formation of a ferroelectric thin film wherein the raw material constituting the composite metal oxide A and the composite oxide B (composite metal oxide) is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of D-4 of the present invention is an invention based on any one of the embodiment of D-1 to the embodiment of D-3, and is a composition for the formation of a ferroelectric thin film further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of D-5 of the present invention is an invention based on any one of the embodiment of D-1 to the embodiment of D-4, wherein the molar ratio B/A of the composite oxide B (composite metal oxide) to the composite metal oxide A is in the range of $0<B/A<0.2$.

The embodiment of D-6 of the present invention is an invention based on the embodiment of D-5, the molar ratio B/A of the composite oxide B (composite metal oxide) to the composite metal oxide A is in the range of $0.005\leq B/A\leq 0.1$.

The embodiment of D-7 of the present invention is a method for forming a ferroelectric thin film, including applying a ferroelectric thin film-forming composition based on any one of the embodiment of D-1 to the embodiment of D-6 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of D-8 of the present invention is a ferroelectric thin film formed by a method based on the embodiment of D-7.

The embodiment of D-9 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of D-8.

The embodiment of D-10 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of D-9 and corresponding to a frequency band of 100 MHz or higher.

[Group 2]

An embodiment of Group 2 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0\leq y<0.1$, and $0\leq z<0.9$] with a composite oxide B including one or more selected from the group consisting of Sn, Sm, Nd, and Y (yttrium), the composition including an organometallic compound solution wherein the raw material constituting the composite metal oxide A and the raw material constituting the composite oxide B are dissolved in an organic solvent in such a proportion as to provide the metal atom ratio represented by the general formula (1), and in such a manner that when the composite oxide B includes Sn, the molar ratio B/A of the composite oxide B to the composite metal oxide A is in the range of $0.003\leq B/A\leq 0.05$, or when the composite oxide B includes one or more selected from the group consisting of Sm, Nd, and Y (yttrium), the molar ratio B/A of the composite oxide B to the composite metal oxide A is in the range of $0.005\leq B/A\leq 0.03$.

The embodiment of E-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0\leq y<0.1$, and $0\leq z<0.9$] with a composite oxide B (composite metal oxide) including Sn, the composition including an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1), and in such a manner that the molar ratio B/A of the composite oxide B to the composite metal oxide A is in the range of $0.003\leq B/A\leq 0.05$.

The embodiment of E-2 of the present invention is an invention based on the embodiment of E-1, wherein the raw material constituting the composite metal oxide A and the composite oxide B (composite metal oxide) is a compound whose organic radical is bound to a metal element through oxygen or nitrogen atoms thereof.

The embodiment of E-3 of the present invention is an invention based on the embodiment of E-2, wherein the raw material constituting the composite metal oxide A and the composite oxide B (composite metal oxide) is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of E-4 of the present invention is an invention based on any one of the embodiment of E-1 to the embodiment of E-3, further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of E-5 of the present invention is a method for forming a ferroelectric thin film, including applying a ferroelectric thin film-forming composition based on any one of the embodiment of E-1 to the embodiment of E-4 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of E-6 of the present invention is a ferroelectric thin film formed by a method based on the embodiment of E-5.

The embodiment of E-7 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of E-6.

The embodiment of E-8 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of E-7 and corresponding to a frequency band of 100 MHz or higher.

The embodiment of F-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0 \leq y<0.1$, and $0 \leq z<0.9$] with a composite oxide B (composite metal oxide) including Sm, the composition including an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1), and in such a manner that the molar ratio B/A of B to A is in the range of $0.005 \leq B/A \leq 0.03$.

The embodiment of F-2 of the present invention is an invention based on the embodiment of F-1, and is a composition for the formation of a ferroelectric thin film wherein the raw material constituting the composite metal oxide A and the composite oxide B (composite metal oxide) is a compound whose organic radical is bound to a metal element through oxygen or nitrogen atoms thereof.

The embodiment of F-3 of the present invention is an invention based on the embodiment of F-2, and is a composition for the formation of a ferroelectric thin film wherein the raw material constituting the composite metal oxide A and the composite oxide B (composite metal oxide) is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of F-4 of the present invention is an invention based on any one of the embodiment of F-1 to the embodiment of F-3, and is a composition for the formation of a ferroelectric thin film further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of F-5 of the present invention is a method for forming a ferroelectric thin film, including applying a ferroelectric thin film-forming composition based on any one of the embodiment of F-1 to the embodiment of F-4 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of F-6 of the present invention is a ferroelectric thin film formed by a method based on the embodiment of F-5.

The embodiment of F-7 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of F-6.

The embodiment of F-8 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of F-7 and corresponding to a frequency band of 100 MHz or higher.

The embodiment of G-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0 \leq y<0.1$, and $0 \leq z<0.9$] with a composite oxide B (composite metal oxide) including Nd, the composition including an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1), and in such a manner that the molar ratio B/A of B to A is in the range of $0.005 \leq B/A \leq 0.03$.

The embodiment of G-2 of the present invention is an invention based on the embodiment of G-1, and is a composition for the formation of a ferroelectric thin film wherein the raw material constituting the composite metal oxide A and the composite oxide B (composite metal oxide) is a compound whose organic radical is bound to a metal element through oxygen or nitrogen atoms thereof.

The embodiment of G-3 of the present invention is an invention based on the embodiment of G-2, and is a composition for the formation of a ferroelectric thin film wherein the raw material constituting the composite metal oxide A and the composite oxide B (composite metal oxide) is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of G-4 of the present invention is an invention based on any one of the embodiment of G-1 to the embodiment of G-3, and is a composition for the formation of a ferroelectric thin film further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of G-5 of the present invention is a method for forming a ferroelectric thin film, including applying a ferroelectric thin film-forming composition based on any one of the embodiment of G-1 to the embodiment of G-4 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of G-6 of the present invention is a ferroelectric thin film formed by a method based on the embodiment of G-5.

The embodiment of G-7 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of G-6.

The embodiment of G-8 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of G-7 and corresponding to a frequency band of 100 MHz or higher.

The embodiment of H-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0 \leq y<0.1$, and $0 \leq z<0.9$] with a composite oxide B (composite metal oxide) including Y (yttrium), the composition including an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1), and in such a manner that the molar ratio B/A of B to A is in the range of $0.005 \leq B/A \leq 0.03$.

The embodiment of H-2 of the present invention is an invention based on the embodiment of H-1, and is a composition for the formation of a ferroelectric thin film wherein the raw material constituting the composite metal oxide A and the composite oxide B (composite metal oxide) is a compound whose organic radical is bound to a metal element through oxygen or nitrogen atoms thereof.

The embodiment of H-3 of the present invention is an invention based on the embodiment of H-2, and is a composition for the formation of a ferroelectric thin film wherein the raw material constituting the composite metal oxide A and the composite oxide B (composite metal oxide) is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of H-4 of the present invention is an invention based on any one of the embodiment of H-1 to the embodiment of H-3, and is a composition for the formation of a ferroelectric thin film further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of H-5 of the present invention is a method for forming a ferroelectric thin film, including applying a ferroelectric thin film-forming composition based on any one of the embodiment of H-1 to the embodiment of H-4 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of H-6 of the present invention is a ferroelectric thin film formed by a method based on the embodiment of H-5.

The embodiment of H-7 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of H-6.

The embodiment of H-8 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of H-7 and corresponding to a frequency band of 100 MHz or higher.

[Group 3]

The embodiment of I-1 of the present invention is a composition for the formation of a ferroelectric thin film which is used in the formation of a ferroelectric thin film of one material selected from the group consisting of PLZT, PZT, and PT, wherein the composition is a liquid composition for the formation of a thin film of a composite metal oxide formed of a mixture of a composite metal oxide A represented by the general formula (1): $(Pb_xLa_y)(Zr_zTi_{(1-z)})O_3$ [In the formula (1), $0.9<x<1.3, 0\leq y<0.1,$ and $0\leq z<0.9$] with a carboxylic acid B which is represented by the general formula (2): $C_nH_{2n+1}COOH$ (wherein $3\leq n\leq 7$) and is capable of taking the structure of the following general Chemical Formula (3) upon coordination with the metal, the composition including an organometallic compound solution wherein the raw material constituting the composite metal oxide A, and the carboxylic acid B are dissolved in an organic solvent in such a manner that the molar ratio B/A of the carboxylic acid B to the composite metal oxide A is in the range of $0<B/A<0.2$.

[Chemical Formula. 1]

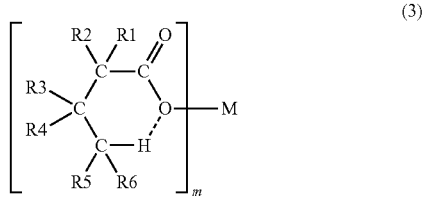

(3)

In the Chemical Formula (3), within the range satisfying "n" of the general formula (2): $C_nH_{2n+1}$ COOH, R1, R2, R3, R4, R5, and R6 represent hydrogen, a methyl group or an ethyl group, M represents Pb, La, Zr or Ti, and m represents a valence of M.

The embodiment of I-2 of the present invention is an invention based on the embodiment of I-1, and is a composition for the formation of a ferroelectric thin film wherein the raw material constituting the composite metal oxide A is a compound whose organic radical is bound to a metal element through oxygen or nitrogen atoms thereof.

The embodiment of I-3 of the present invention is an invention based on the embodiment of I-2, and is a composition for the formation of a ferroelectric thin film wherein the raw material constituting the composite metal oxide A is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

The embodiment of I-4 of the present invention is an invention based on any one of the embodiment of I-1 to the embodiment of I-3, and is a composition for the formation of a ferroelectric thin film further including one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

The embodiment of I-5 of the present invention is an invention based on any one of the embodiment of I-1 to the embodiment of I-4, wherein the molar ratio B/A of the carboxylic acid B to the composite metal oxide A is in the range of $0.001\leq B/A\leq 0.1$.

The embodiment of I-6 of the present invention is an invention based on the embodiment of I-5, wherein the molar ratio B/A of the carboxylic acid B to the composite metal oxide A is in the range of $0.03\leq B/A\leq 0.1$.

The embodiment of I-7 of the present invention is an invention based on the embodiment of I-6, wherein the molar ratio B/A of the carboxylic acid B to the composite metal oxide A is in the range of $0.05\leq B/A\leq 0.1$.

The embodiment of I-8 of the present invention is a method for forming a ferroelectric thin film, including applying a ferroelectric thin film-forming composition based on any one of the embodiment of I-1 to the embodiment of I-7 to a heat-resistant substrate; heating the substrate in air or under an oxidative atmosphere or water vapor-containing atmosphere, wherein the applying and the heating is performed once or is repeated until the film reaches the desired thickness; and baking the film at its crystallization temperature or higher, at least during or after heating in the final step.

The embodiment of I-9 of the present invention is a ferroelectric thin film formed by a method based on the embodiment of I-8.

The embodiment of I-10 of the present invention is a composite electronic component of a thin-film condenser, a capacitor, an IPD (Integrated Passive Device), a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of I-9.

The embodiment of I-11 of the present invention is a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device which has a ferroelectric thin film based on the embodiment of I-10 and corresponding to a frequency band of 100 MHz or higher.

Effects of the Invention

Through the formation of a ferroelectric thin film using a composition for the formation of a ferroelectric thin film in accordance with the present invention, it is possible to obtain a ferroelectric thin film which is suitable for use in a thin film capacitor having a high capacity density, in a simple manner.

As another effect of the present invention, through the formation of a ferroelectric thin film using a composition for the formation of a ferroelectric thin film in accordance with the present invention, it is possible to obtain a ferroelectric thin film with balanced improvement of both leakage current characteristics and dielectric strength voltage characteristics, such as reduction of leakage current and improvement of dielectric strength voltage, which is suitable for use in a thin film capacitor having a high capacity density, by a simplified method.

As another effect of the present invention, through the formation of a ferroelectric thin film using a composition for the formation of a ferroelectric thin film in accordance with the present invention, it is possible to obtain a ferroelectric thin film which is capable of achieving a specific permittivity equivalent to that of a conventional ferroelectric thin film and a lower leakage current density and which is suitable for use in a thin film capacitor having a high capacity density, by a simplified method. Accordingly, when it is configured to have a leakage current density equivalent to that of the conventional art, the thickness of the film can be further reduced and therefore a higher specific permittivity can be obtained.

As another effect of the present invention, through the formation of a ferroelectric thin film using a composition for the formation of a ferroelectric thin film in accordance with the present invention, it is possible to obtain a ferroelectric thin film which has a significantly improved specific permittivity as compared to a conventional ferroelectric thin film and which is suitable for use in a thin film capacitor having a high capacity density, by a simplified method.

BEST MODE FOR CARRYING OUT THE INVENTION

Figure 1:
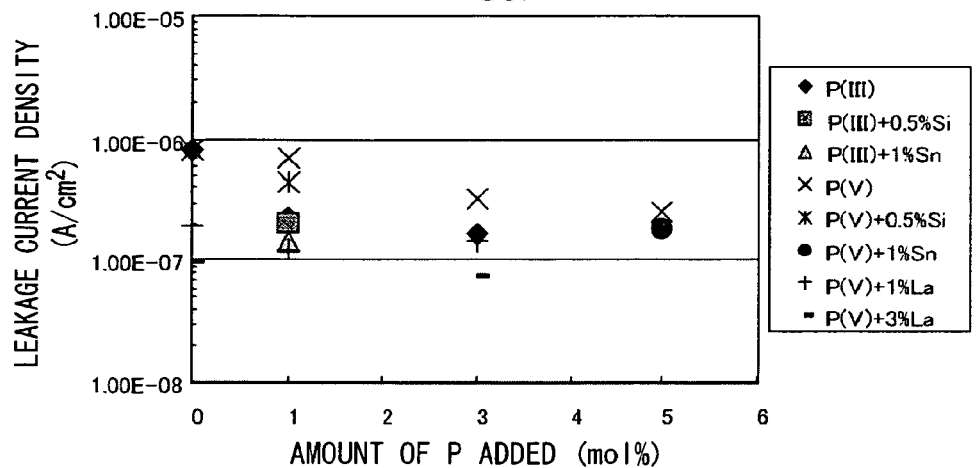
FIG. 1 is a view showing the relationship between the leakage current density and the P (phosphorus) additive amount, upon application of 5 V in Example A-1 to Example A-29, and Comparative Example A-1 to Comparative Example A-8.

Hereinafter, embodiments for carrying out the present invention will be described.

[Group 1]

The composition for the formation of a ferroelectric thin film in Group 1 of the present invention is a composition for the formation of a ferroelectric thin film of one material selected from the group consisting of PLZT, PZT, and PT. A ferroelectric thin film formed using this composition is in the form of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0\le y<0.1$, and $0\le z<0.9$] with a composite oxide B including one or more selected from the group consisting of P (phosphorus), Si, Ce, and Bi. In addition, the film-forming material is PLZT when $y\ne 0$ and $z\ne 0$ in the formula (1), the film-forming material is PZT when $y=0$ and $z\ne 0$, and the film-forming material is PT when $y=0$ and $z=0$. The composition is composed of an organometallic compound solution wherein the raw material constituting the composite metal oxide A and the raw material constituting the composite oxide B are dissolved in an organic solvent in such a proportion as to provide the metal atom ratio represented by the general formula (1).

When the composite oxide B contains one or more selected from the group consisting of Si, Ce and Bi, the composite oxide B is a composite metal oxide.

When the composite oxide B contains P (phosphorus), the raw material for the composite metal oxide A is preferably a compound whose organic radical is bound to each metal element of Pb, La, Zr and Ti through oxygen or nitrogen atoms thereof. For example, such a compound is exemplified by one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex. The particularly preferred compound is a metal alkoxide, a partial hydrolysate thereof, or an organic acid salt thereof. Among them, examples of the Pb compound and the La compound include organic acid salts such as acetic acid salts (lead acetate, lanthanum acetate), and alkoxides such as lead diisopropoxide. Examples of the Ti compound include alkoxides such as titanium tetraethoxide, titanium tetraisopropoxide, titanium tetrabutoxide, and titanium dimethoxy diisopropoxide. Examples of the Zr compound preferably include alkoxides as in the Ti compound. The metal alkoxide may be used without further processing, or may be used in the form of a partial hydrolysate thereof for the purpose of facilitating the decomposition thereof.

When the composite oxide B contains P (phosphorus), the raw material for the composite oxide B is preferably a compound whose organic radical is bound to a P (phosphorus) element through oxygen or nitrogen atoms thereof. For example, such a compound is exemplified by one or more selected from the group consisting of an alkoxide compound, a diol compound, a triol compound, a carboxylate compound, a β-diketonato compound, a β-diketoester compound, a β-iminoketo compound, and an amino compound. The particularly preferred compound is an alkoxide compound or a partial hydrolysate thereof.

When the composite oxide B is a composite metal oxide containing one or more selected from the group consisting of Si, Ce and Bi, the raw material for the composite metal oxide A and the raw material for the composite oxide B is preferably a compound whose organic radical is bound to each metal element of Pb, La, Zr, Ti, Si, Ce and Bi through oxygen or nitrogen atoms thereof. For example, such a compound is exemplified by one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex. The particularly preferred compound is a metal alkoxide, a partial hydrolysate thereof, or an organic acid salt thereof. Among them, examples of the Pb compound and the La compound include organic acid salts such as acetic acid salts (lead acetate, lanthanum acetate), and alkoxides such as lead diisopropoxide. Examples of the Si compound include organic acid salts such as silicon 2-ethyl hexanoate and silicon 2-ethyl butyrate, alkoxides such as silicon tetraethoxide and silicon tetra-n-butoxide, and metal β-diketonato complexes such as tetrakis (acetylacetonate) silicon. Examples of the Ce compound include organic acid salts such as cerium 2-ethyl hexanoate and cerium 2-ethyl butyrate, alkoxides such as cerium tri-n-butoxide and cerium triethoxide, and metal β-diketonato complex such as tris (acetylacetonate) cerium. Examples of the Bi compound include organic acid salts such as bismuth 2-ethyl hexanoate and bismuth 2-ethyl butyrate, alkoxides such as bismuth tri-isopropoxide and bismuth tri-t-pentoxide, and metal β-diketonato complexes such as tetra (methyl heptanedionate) bismuth. Examples of the Ti compound include alkoxides such as titanium tetraethoxide, titanium tetraisopropoxide, titanium tetrabutoxide, and titanium dimethoxy diisopropoxide. Examples of the Zr compound preferably include alkoxides as in the Ti compound. The metal alkoxide may be used without further processing, or may be used in the form of a partial hydrolysate thereof for the purpose of facilitating the decomposition thereof.

In order to prepare the composition for the formation of a ferroelectric thin film in accordance with the present invention, these raw materials are dissolved in a suitable solvent at the ratio corresponding to a desired ferroelectric thin film composition, thereby preparing a solution at a concentration suitable for application.

When the composite oxide B contains P (phosphorus), the molar ratio B/A of the composite oxide B to the composite metal oxide A is adjusted to be in the range of $0<B/A<0.2$. If the molar ratio B/A is within the above-specified range, it is possible to achieve balanced improvement of both leakage current characteristics and dielectric strength voltage characteristics of a ferroelectric thin film, i.e. reduction of leakage current and improvement of dielectric strength voltage which are the effects of the present invention. On the other hand, if the molar ratio B/A is higher than the upper limit, this results in problems associated with the degradation of a specific permittivity. Particularly preferred is the range of $0.003 \leq B/A \leq 0.1$.

When the composite oxide B contains Si, the molar ratio B/A of the composite oxide B to the composite metal oxide A is adjusted to be in the range of $0<B/A<0.1$. If the molar ratio B/A is within the above-specified range, it is possible to achieve a low leakage current density and a high dielectric strength voltage which are the effects of the present invention. Particularly preferred is the range of $0.005 \leq B/A \leq 0.05$.

When the composite oxide B contains Ce, the molar ratio B/A of the composite oxide B to the composite metal oxide A is adjusted to be in the range of $0<B/A<0.05$. If the molar ratio B/A is within the above-specified range, it is possible to achieve a specific permittivity equivalent to that of a conventional ferroelectric thin film, and a low leakage current density, which are the effects of the present invention. On the other hand, if the molar ratio B/A is higher than the upper limit, this results in inconveniences associated with the degradation of a specific permittivity. Particularly preferred is the range of $0.005 \leq B/A \leq 0.03$.

When the composite oxide B contains Bi, the molar ratio B/A of the composite oxide B to the composite metal oxide A is adjusted to be in the range of $0<B/A<0.2$. If the molar ratio B/A is within the above-specified range, it is possible to significantly improve the specific permittivity as compared to a conventional ferroelectric thin film. On the other hand, if the molar ratio B/A is lower than the lower limit or higher than the upper limit, there is no significant difference as compared to no addition of bismuth, so it is not suitable for use in a thin film capacitor having a high capacity density. Particularly preferred is the range of $0.005 \leq B/A \leq 0.1$.

Although the solvent for a composition for the formation of a ferroelectric thin film used in Group 1 is appropriately determined depending on the type of the raw materials to be used, there may be generally used carboxylic acid, alcohol, ester, ketones (for example, acetone, methyl ethyl ketone), ethers (for example, dimethyl ether, diethyl ether), cycloalkanes (for example, cyclohexane, cyclohexanol), aromatics (for example, benzene, toluene, xylene), tetrahydrofuran, or a mixed solvent of two or more thereof. When the composite oxide B contains Si, propylene glycol may be used.

As the carboxylic acid, specifically, it is preferred to use n-butyric acid, α-methyl butyric acid, i-valeric acid, 2-ethyl butyric acid, 2,2-dimethyl butyric acid, 3,3-dimethyl butyric acid, 2,3-dimethyl butyric acid, 3-methyl pentanoic acid, 4-methyl pentanoic acid, 2-ethyl pentanoic acid, 3-ethyl pentanoic acid, 2,2-dimethyl pentanoic acid, 3,3-dimethyl pentanoic acid, 2,3-dimethyl pentanoic acid, 2-ethyl hexanoic acid, or 3-ethyl hexanoic acid.

As the ester, it is preferred to use ethyl acetate, propyl acetate, n-butyl acetate, sec-butyl acetate, tert-butyl acetate, isobutyl acetate, n-amyl acetate, sec-amyl acetate, tert-amyl acetate, or isoamyl acetate. As the alcohol, it is preferred to use 1-propanol, 2-propanol, 1-butanol, 2-butanol, iso-butyl alcohol, 1-pentanol, 2-pentanol, 2-methyl-2-pentanol, or 2-methoxy ethanol.

In addition, the total concentration of an organometallic compound in an organometallic compound solution of the composition for the formation of a ferroelectric thin film is preferably in the range of 0.1 to 20% by mass, in terms of the metal oxides.

The organometallic compound solution may contain, if necessary, a stabilizer selected from the group consisting of β-diketones (for example, acetylacetone, heptafluorobutanoyl pyvaloyl methane, dipyvaloyl methane, trifluoro acetylacetone, benzoyl acetone, etc.), β-ketonic acids (for example, acetoacetic acid, propionyl acetic acid, benzoyl acetic acid, etc.), β-ketoesters (for example, lower alkyl esters such as methyl, propyl, butyl esters and the like of the above-mentioned ketonic acids), oxy-acids (for example, lactic acid, glycolic acid, α-oxy butyric acid, salicylic acid, etc.), lower alkyl esters of the above-mentioned oxy-acids, oxy ketones (for example, diacetone alcohol, acetoin, etc.), diol, triol, higher carboxylic acid, alkanol amines (for example, diethanolamine, triethanolamine, monoethanolamine), and polyamine, in a proportion of 0.2 to 3 (in terms of number of stabilizer molecules)/(number of metal atoms).

In the present invention, the above-prepared organometallic compound solution is preferably subjected to filtration or the like to remove particles, such that the number of particles having a particle diameter of 0.5 μm or more (particularly 0.3 μm or more, and more particularly 0.2 μm or more) is 50 particles/mL or less per 1 mL of the solution.

Further, the number of particles in the corresponding organometallic compound solution is measured using a light scattering particle counter.

If the number of particles having a particle diameter of 0.5 μm or more in the organometallic compound solution is higher than 50 particles/mL, the long-term storage stability is deteriorated. The smaller number of particles having a particle diameter of 0.5 µm or more in the organometallic compound solution is preferable. Particularly preferred is 30 particles/mL or less.

Although there is no particular limitation to the method of treating an organometallic compound solution to achieve the above-mentioned particle number after preparation thereof, for example, the following methods may be employed. The first method is a filtration method of transferring a solution to a syringe, using a commercially available membrane filter having a pore diameter of 0.2 µm. The second method is a pressure filtration method with combination of a commercially available membrane filter having a pore diameter of 0.05 µm and a pressurized tank. The third method is a cycle filtration with combination of the filter used in the second method and a solution circulation bath.

In any one of the above methods, the particle capture rate of the filter varies depending on the solution transfer pressure. It is generally known that lower pressure leads to a higher capture rate. In particular, with regard to the first and second methods, in order to achieve the condition that the number of particles having a particle diameter of 0.5 µm or more is 50 or less, the solution is preferably passed through a filter at a very low rate under a low pressure.

By using the composition for the formation of a ferroelectric thin film in accordance with the present invention, it is possible to conveniently form a ferroelectric thin film in the form of a mixed composite metal oxide formed of a mixture of a composite metal oxide A of one material selected from the group consisting of PLZT, PZT, and PT with a composite oxide B including one or more selected from the group consisting of P (phosphorus), Si, Ce, and Bi.

In order to prepare a ferroelectric thin film using the composition for the formation of a ferroelectric thin film in accordance with the present invention, the above composition is applied to a heat-resistant substrate by an application method such as spin coating, dip coating, or LSMCD (Liquid Source Misted Chemical Deposition), followed by drying (pre-baking) and main baking.

Specific examples of the heat-resistant substrate that can be used herein include, but are not limited to, substrates whose substrate surface part employs a perovskite-type conductive oxide such as single-crystalline Si, polycrystalline Si, Pt, Pt (uppermost layer)/Ti, Pt (uppermost layer)/Ta, Ru, $RuO_2$, Ru (uppermost layer)/$RuO_2$, $RuO_2$ (uppermost layer)/Ru, Ir, $IrO_2$, Ir (uppermost layer)/$IrO_2$, Pt(uppermost layer)/Ir, Pt (uppermost layer)/$IrO_2$, $SrRuO_3$ or $(La_xSr_{(1-x)})CoO_3$.

In addition, when a desired film thickness cannot be obtained by one time of application, the application and drying processes are repeated several times, and then main baking is carried out. As used herein, the term "desired film thickness" refers to a thickness of the ferroelectric thin film which is obtained after the main baking. For use in a thin film capacitor with a high capacity density, a film thickness of the ferroelectric thin film after the main baking is in the range of 50 to 500 nm.

Further, since the pre-baking is carried out for the removal of the solvent and for the conversion of an organometallic compound or organic compound into a composite oxide by pyrolysis or hydrolysis, the pre-baking is carried out in air or under an oxidative atmosphere or water vapor-containing atmosphere. Also with regard to heating in air, moisture necessary for hydrolysis is sufficiently secured from moisture in air. The heating may be carried out in two steps, i.e. low-temperature heating for the removal of the solvent and high-temperature heating for the decomposition of the organometallic compound or organic compound.

The main baking is a process for baking to crystallize the thin film obtained by the pre-baking at a temperature equal to or higher than its crystallization temperature. Thereby, a ferroelectric thin film can be obtained. A baking atmosphere for this crystallization process is preferably $O_2$, $N_2$, Ar, $N_2O$ or $H_2$, or a mixed gas thereof.

When the composite oxide B contains P (phosphorus), the pre-baking is carried out at a temperature of 150 to 550° C. for 1 to 30 minutes, and the main baking is carried out at a temperature of 450 to 800° C. for 1 to 10 minutes. The main baking may also be carried out by rapid thermal annealing (RTA treatment). When the main baking is carried out by RTA treatment, the temperature elevation rate is preferably in the range of 10 to 100° C./sec.

When the composite oxide B contains one or more selected from the group consisting of Si, Ce and Bi, the pre-baking is carried out at a temperature of 150 to 550° C. for 5 to 10 minutes, and the main baking is carried out at a temperature of 450 to 800° C. for 1 to 60 minutes. The main baking may also be carried out by rapid thermal annealing (RTA treatment). When the main baking is carried out by RTA treatment, the temperature elevation rate is preferably in the range of 10 to 100° C./sec.

When the composite oxide B contains P (phosphorus), the thus formed ferroelectric thin film of the present invention exhibits balanced improvement of both leakage current characteristics and dielectric strength voltage characteristics, i.e. reduction of leakage current and improvement of dielectric strength voltage, has excellent basic characteristics as a capacitor, and is very suitable for use in a thin film capacitor with a high capacity density. Further, the ferroelectric thin film of the present invention is excellent in basic characteristics as IPD.

When the composite oxide B contains Si, the thus formed ferroelectric thin film of the present invention can achieve a lower leakage current density and a higher dielectric strength voltage as compared to a conventional ferroelectric thin film, and is therefore very suitable for use in a thin film capacitor. Accordingly, when it is configured to have a leakage current density equivalent to that of a conventional ferroelectric thin film, the thickness of the film can be further reduced, a higher capacity density can be obtained, and basic characteristics as a capacitor are excellent. In addition, thickness reduction of the film has another advantage in that the amount of raw materials to be used can also be reduced. Further, the ferroelectric thin film of the present invention is also excellent in basic characteristics as IPD.

When the composite oxide B contains Ce, the thus formed ferroelectric thin film of the present invention can achieve a specific permittivity equivalent to that of a conventional ferroelectric thin film and a low leakage current density, and is therefore very suitable for use in a thin film capacitor having a high capacity density. Accordingly, when it is configured to have a leakage current density equivalent to that of a conventional ferroelectric thin film, the thickness of the film can be further reduced, a higher capacity density can be obtained, and basic characteristics as a capacitor are excellent. In addition, thickness reduction of the film has another advantage in that the amount of raw materials to be used can also be reduced. Further, the ferroelectric thin film of the present invention is also excellent in basic characteristics as IPD.

When the composite oxide B contains Bi, the thus formed ferroelectric thin film of the present invention has a significantly improved specific permittivity as compared to a conventional ferroelectric thin film and is excellent in basic characteristics as a capacitor, and is therefore preferable for use in a thin film capacitor having a high capacity density. Further, the ferroelectric thin film of the present invention is also excellent in basic characteristics as IPD.

Further, the ferroelectric thin film of Group 1 can be used as a constituent material for a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device. In particular, the ferroelectric thin film of Group 1 can be used in the composite electronic component which corresponds to a frequency band of 100 MHz or higher.

[Group 2]

The composition for the formation of a ferroelectric thin film in Group 2 of the present invention is a composition for the formation of a ferroelectric thin film of one material selected from the group consisting of PLZT, PZT, and PT. A ferroelectric thin film formed using this composition is in the form of a mixed composite metal oxide formed of a mixture of a composite metal oxide A represented by the general formula (1): $(Pb_xLa_y)(Zr_zTi_{(1-z)})O_3$ [In the formula (1), $0.9<x<1.3$, $0\leq y<0.1$, and $0\leq z<0.9$] with a composite oxide B (composite metal oxide) including one or more selected from the group consisting of Sn, Sm, Nd and Y (yttrium). In addition, the film-forming material is PLZT when $y\neq 0$ and $z\neq 0$ in the formula (1), the film-forming material is PZT when $y=0$ and $z\neq 0$, and the film-forming material is PT when $y=0$ and $z=0$.

When the composite oxide B contains Sn, the composition is composed of an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1), and in such a manner that the molar ratio B/A of the composite oxide B (composite metal oxide) to the composite metal oxide A is in the range of $0.003\leq B/A\leq 0.05$, and particularly preferably $0.006\leq B/A\leq 0.04$. If the molar ratio B/A is within the above-specified range, it is possible to significantly improve the specific permittivity as compared to a conventional ferroelectric thin film. On the other hand, if the molar ratio B/A is lower than the lower limit or higher than the upper limit, there is no significant difference as compared to no addition of tin, so it is not suitable for use in a thin film capacitor having a high capacity density.

When the composite oxide B contains one or more selected from the group consisting of Sm, Nd and Y (yttrium), the composition is composed of an organometallic compound solution wherein the raw material constituting the composite metal oxide A and the raw material constituting the composite oxide B (composite metal oxide) are dissolved in an organic solvent in such a proportion as to provide the metal atom ratio represented by the general formula (1), and in such a manner that the molar ratio B/A of the composite oxide B to the composite metal oxide A is in the range of $0.005\leq B/A\leq 0.03$, and particularly preferably $0.005\leq B/A\leq 0.02$. If the molar ratio B/A is within the above-specified range, it is possible to significantly improve the specific permittivity as compared to a conventional ferroelectric thin film. On the other hand, if the molar ratio B/A is lower than the lower limit or higher than the upper limit, there is no significant difference as compared to no addition of two or more selected from the group consisting of samarium, neodymium and yttrium, so it is not suitable for use in a thin film capacitor having a high capacity density.

When the composite oxide B contains one or more selected from the group consisting of Sn, Sm, Nd and Y (yttrium), the composite oxide B is a composite metal oxide.

The raw material for the composite metal oxide A and the raw material for the composite oxide B (composite metal oxide) are preferably a compound whose organic radical is bound to each metal element of Pb, La, Zr, Ti, Sn, Sm, Nd and Y (yttrium) through oxygen or nitrogen atoms thereof. For example, the raw material for the composite metal oxide is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex. The particularly preferred compound is a metal alkoxide, a partial hydrolysate thereof, or an organic acid salt thereof.

Among them, examples of the Pb compound and the La compound include organic acid salts such as acetic acid salts (lead acetate, lanthanum acetate), and alkoxides such as lead diisopropoxide. Examples of the Sn compound include organic acid salts such as acetate (tin acetate), nitrate (tin nitrate), and tin octylate, and alkoxides such as tin tetra-n-butoxide, and tin ethoxide.

Examples of the Sm compound include organic acid salts such as 2-ethyl hexanoate (samarium 2-ethyl hexanoate), and 2-ethyl butyrate (samarium 2-ethyl butyrate), alkoxides such as samarium tetra n-butoxide, and samarium ethoxide, and metal β-diketonato complexes such as tris (acetylacetonate).

Examples of the Nd compound include organic acid salts such as 2-ethyl hexanoate (neodymium 2-ethyl hexanoate), and 2-ethyl butyrate (neodymium 2-ethyl butyrate), alkoxides such as neodymium tetra n-butoxide, and neodymium ethoxide, and metal β-diketonato complexes such as tris (acetylacetonate).

Examples of the Y (yttrium) compound include organic acid salts such as 2-ethyl hexanoate (yttrium 2-ethyl hexanoate), and 2-ethyl butyrate (yttrium 2-ethyl butyrate), alkoxides such as yttrium tri-n-butoxide, and yttrium ethoxide, and metal 3-diketonato complexes such as tris (acetylacetonate).

Examples of the Ti compound include alkoxides such as titanium tetraethoxide, titanium tetraisopropoxide, titanium tetrabutoxide, and titanium dimethoxy diisopropoxide.

Examples of the Zr compound preferably include alkoxides as in the Ti compound. The metal alkoxide may be used without further processing, or may be used in the form of a partial hydrolysate thereof for the purpose of facilitating the decomposition thereof.

In order to prepare the composition for the formation of a ferroelectric thin film in accordance with the present invention, these raw materials are dissolved in a suitable solvent at the ratio corresponding to a desired ferroelectric thin film composition, thereby preparing a solution at a concentration suitable for application.

Although the solvent for a composition for the formation of a ferroelectric thin film used herein is appropriately determined depending on the type of the raw materials to be used, there may be generally used a carboxylic acid, alcohol, ester, ketones (for example, acetone, methyl ethyl ketone), ethers (for example, dimethyl ether, diethyl ether), cycloalkanes (for example, cyclohexane, cyclohexanol), aromatics (for example, benzene, toluene, xylene), tetrahydrofuran, or a mixed solvent of two or more thereof.

As the carboxylic acid, specifically, it is preferred to use n-butyric acid, α-methyl butyric acid, i-valeric acid, 2-ethyl butyric acid, 2,2-dimethyl butyric acid, 3,3-dimethyl butyric acid, 2,3-dimethyl butyric acid, 3-methyl pentanoic acid, 4-methyl pentanoic acid, 2-ethyl pentanoic acid, 3-ethyl pentanoic acid, 2,2-dimethyl pentanoic acid, 3,3-dimethyl pentanoic acid, 2,3-dimethyl pentanoic acid, 2-ethyl hexanoic acid, or 3-ethyl hexanoic acid.

As the ester, it is preferred to use ethyl acetate, propyl acetate, n-butyl acetate, sec-butyl acetate, tert-butyl acetate, isobutyl acetate, n-amyl acetate, sec-amyl acetate, tert-amyl acetate, or isoamyl acetate. As the alcohol, it is preferred to use 1-propanol, 2-propanol, 1-butanol, 2-butanol, iso-butyl alcohol, 1-pentanol, 2-pentanol, 2-methyl-2-pentanol, or 2-methoxy ethanol.

In addition, the total concentration of an organometallic compound in an organometallic compound solution of the composition for the formation of a ferroelectric thin film is preferably in the range of 0.1 to 20% by weight, in terms of the metal oxides.

The organometallic compound solution may contain, if necessary, a stabilizer selected from the group consisting of β-diketones (for example, acetylacetone, heptafluorobutanoyl pyvaloyl methane, dipyvaloyl methane, trifluoro acetylacetone, benzoyl acetone, etc.), β-ketonic acids (for example, acetoacetic acid, propionyl acetic acid, benzoyl acetic acid, etc.), β-ketoesters (for example, lower alkyl esters such as methyl, propyl, butyl esters and the like of the above-mentioned ketonic acids), oxy-acids (for example, lactic acid, glycolic acid, α-oxy butyric acid, salicylic acid, etc.), lower alkyl esters of the above-mentioned oxy-acids, oxy ketones (for example, diacetone alcohol, acetoin, etc.), diol, triol, higher carboxylic acid, alkanol amines (for example, diethanolamine, triethanolamine, monoethanolamine), and polyamine, in a proportion of 0.2 to 3 (in terms of number of stabilizer molecules)/(number of metal atoms).

In the present invention, the above-prepared organometallic compound solution is preferably subjected to filtration or the like to remove particles, such that the number of particles having a particle diameter of 0.5 μm or more (particularly 0.3 μm or more, and more particularly 0.2 μm or more) is 50 particles/mL or less per 1 mL of the solution.

Further, the number of particles in the corresponding organometallic compound solution is measured using a light scattering particle counter.

If the number of particles having a particle diameter of 0.5 μm or more in the organometallic compound solution is higher than 50 particles/mL, the long-term storage stability is deteriorated. The smaller number of particles having a particle diameter of 0.5 μm or more in the organometallic compound solution is preferable. Particularly preferred is 30 particles/mL or less.

Although there is no particular limitation to the method of treating an organometallic compound solution to achieve the above-mentioned particle number after preparation thereof, for example, the following methods may be employed. The first method is a filtration method of transferring a solution to a syringe, using a commercially available membrane filter having a pore diameter of 0.2 μm. The second method is a pressure filtration method with combination of a commercially available membrane filter having a pore diameter of 0.05 μm and a pressurized tank. The third method is a cycle filtration with combination of the filter used in the second method and a solution circulation bath.

In any one of the above methods, the particle capture rate of the filter varies depending on the solution transfer pressure. It is generally known that lower pressure leads to a higher capture rate. In particular, with regard to the first and second methods, in order to achieve the condition that the number of particles having a particle diameter of 0.5 μm or more is 50 or less, the solution is preferably passed through a filter at a very low rate under a low pressure.

By using the composition for the formation of a ferroelectric thin film in accordance with the present invention, it is possible to conveniently form a ferroelectric thin film in the form of a mixed composite metal oxide formed of a mixture of a composite metal oxide A of one material selected from the group consisting of PLZT, PZT, and PT with a composite oxide B (composite metal oxide) including one or more selected from the group consisting of Sn, Sm, Nd and Y (yttrium).

In order to prepare a ferroelectric thin film using the composition for the formation of a ferroelectric thin film in accordance with the present invention, the above composition is applied to a heat-resistant substrate by an application method such as spin coating, dip coating, or Liquid Source Misted Chemical Deposition (LSMCD), followed by drying (pre-baking) and main baking.

Specific examples of the heat-resistant substrate that can be used herein include, but are not limited to, substrates whose substrate surface part employs a perovskite-type conductive oxide such as single-crystalline Si, polycrystalline Si, Pt, Pt (uppermost layer)/Ti, Pt (uppermost layer)/Ta, Ru, $RuO_2$, Ru (uppermost layer)/$RuO_2$, $RuO_2$ (uppermost layer)/Ru, Ir, $IrO_2$, Ir (uppermost layer)/$IrO_2$, Pt(uppermost layer)/Ir, Pt (uppermost layer)/$IrO_2$, $SrRuO_3$ or $(La_xSr_{(1-x)}) CoO_3$.

In addition, when a desired film thickness cannot be obtained by one time of application, the application and drying processes are repeated several times, and then main baking is carried out. As used herein, the term "desired film thickness" refers to a thickness of the ferroelectric thin film which is obtained after the main baking. For use in a thin film capacitor with a high capacity density, a film thickness of the ferroelectric thin film after the main baking is in the range of 50 to 500 nm.

Further, since the pre-baking is carried out for the removal of the solvent and for the conversion of an organometallic compound into a composite oxide by pyrolysis or hydrolysis, the pre-baking is carried out in air or under an oxidative atmosphere or water vapor-containing atmosphere. Also with regard to heating in air, moisture necessary for hydrolysis is sufficiently secured from moisture in air. The heating may be carried out in two steps, i.e. low-temperature heating for the removal of the solvent and high-temperature heating for the decomposition of the organometallic compound.

The main baking is a process for baking to crystallize the thin film obtained by the pre-baking at a temperature equal to or higher than its crystallization temperature. Thereby, a ferroelectric thin film can be obtained. A baking atmosphere for this crystallization process is preferably $O_2$, $N_2$, Ar, $N_2O$ or $H_2$, or a mixed gas thereof.

When the composite oxide B contains Sn, the pre-baking is carried out at a temperature of 150 to 550° C. for 1 to 30 minutes, and the main baking is carried out at a temperature of 450 to 800° C. for 1 to 10 minutes. The main baking may also be carried out by rapid thermal annealing (RTA treatment). When the main baking is carried out by RTA treatment, the temperature elevation rate is preferably in the range of 10 to 100° C./sec.

When the composite oxide B contains one or more selected from the group consisting of Sm, Nd and Y (yttrium), the pre-baking is carried out at a temperature of 150 to 550° C. for 5 to 10 minutes, and the main baking is carried out at a temperature of 450 to 800° C. for 1 to 60 minutes. The main baking may also be carried out by rapid thermal annealing (RTA treatment). When the main baking is carried out by RTA treatment, the temperature elevation rate is preferably in the range of 10 to 100° C./sec.

The thus formed ferroelectric thin film of the present invention containing one or more selected from the group consisting of Sn, Sm, Nd and Y (yttrium) has a significantly improved specific permittivity as compared to a conventional ferroelectric thin film and is excellent in basic characteristics as a capacitor, and is therefore preferable for use in a thin film capacitor having a high capacity density. Further, the ferroelectric thin film of the present invention is also excellent in basic characteristics as IPD.

Further, the ferroelectric thin film in Group 2 of the present invention can be used as a constituent material for a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device. In particular, the ferroelectric thin film of Group 2 can be used in the composite electronic component which corresponds to a frequency band of 100 MHz or higher.

[Group 3]

The composition for the formation of a ferroelectric thin film in Group 3 is a composition for the formation of a ferroelectric thin film of one material selected from the group consisting of PLZT, PZT, and PT. A ferroelectric thin film formed using this composition is in the form of a mixed composite metal oxide formed of a mixture of a composite metal oxide A represented by the general formula (1): $(Pb_x La_y)(Zr_z Ti_{(1-z)})O_3$ [In the formula (1), $0.9<x<1.3$, $0 \leq y<0.1$, and $0 \leq z<0.9$] with a carboxylic acid B which is represented by the general formula (2): $C_n H_{2n+1} COOH$ (wherein $3 \leq n \leq 7$) and is capable of taking the structure of the following general Chemical Formula (3) upon coordination with the metal.

[Chemical Formula. 2]

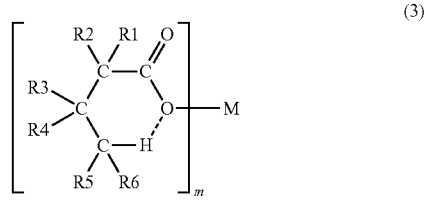

(3)

[In the Chemical Formula (3), within the range satisfying "n" of the general formula (2): $C_n H_{2n+1} COOH$, R1, R2, R3, R4, R5, and R6 represent hydrogen, a methyl group or an ethyl group, M represents Pb, La, Zr or Ti, and m represents a valence of M].

In addition, the film-forming material is PLZT when $y \neq 0$ and $z \neq 0$ in the formula (1), the film-forming material is PZT when $y=0$ and $z \neq 0$, and the film-forming material is PT when $y=0$ and $z=0$. The composition is composed of an organometallic compound solution wherein the raw material constituting the composite metal oxide A and the carboxylic acid B are dissolved in an organic solvent in such a manner that the molar ratio B/A of the carboxylic acid B to the composite metal oxide A is in the range of $0<B/A<0.2$, preferably $0.001 \leq B/A \leq 0.1$, more preferably $0.03 \leq B/A \leq 0.1$, and more particularly preferably $0.05 \leq B/A \leq 0.1$.

Since the carboxylic acid B is mixed within the above-specified range, the carboxylic acid (pseudo-carboxylate) coordinated to the metal element takes a structure of a 6-membered ring by the action of a hydrogen bond, which results in ideal decomposition of the carbon bond at a low temperature (for example, the specification of Japanese Patent Application Laid-Open Publication No. Hei 9-52713, paragraph number [0023]; and Allen W. Apblett et al., Mat. Res. Soc. Symp. Proc. Vol. 271 pp. 77, etc.), so low-temperature crystallization becomes possible, and crystal growth is sufficiently carried out when baking. Thereby, it is believed that the specific permittivity is improved.

Further, it is believed that the presence of a 6-membered ring-formed carboxylic acid coordinated to a sterically bulky metal element on the substrate interface inhibits the formation of crystal nuclei upon pre-baking and baking. For these reasons, a crystal nucleation density is decreased, so crystal growth at the substrate interface is predominant over the formation of crystal nuclei at the substrate interface, thus achieving sufficient grain growth upon baking. Also based on this reason, it is believed that the specific permittivity is improved.

Therefore, the ferroelectric thin film formed using the composition for the formation of a ferroelectric thin film in accordance with the present invention can significantly improve the specific permittivity, as compared to a conventional ferroelectric thin film. In addition, if the molar ratio B/A of the carboxylic acid B to the composite metal oxide A is lower than the lower limit or higher than the upper limit, there is no significant difference as compared to no addition of the carboxylic acid B, so it is not suitable for use in a thin film capacitor having a high capacity density.

The raw material for the composite metal oxide A is preferably a compound whose organic radical is bound to each metal element of Pb, La, Zr and Ti through oxygen or nitrogen atoms thereof. For example, the raw material for the composite metal oxide is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex. The particularly preferred compound is a metal alkoxide, a partial hydrolysate thereof, or an organic acid salt thereof. Among them, examples of the Pb compound and the La compound include organic acid salts such as acetic acid salts (lead acetate, lanthanum acetate), and alkoxides such as lead diisopropoxide. Examples of the Ti compound include alkoxides such as titanium tetraethoxide, titanium tetraisopropoxide, titanium tetrabutoxide, and titanium dimethoxy diisopropoxide. Examples of the Zr compound preferably include alkoxides as in the Ti compound. The metal alkoxide may be used without further processing, or may be used in the form of a partial hydrolysate thereof for the purpose of facilitating the decomposition thereof.

Examples of the carboxylic acid B that can be used in the composition for the formation of a ferroelectric thin film in accordance with the present invention include compounds shown in Table 1 below.

TABLE 1

| Number of n in $C_n H_{2n+1} COOH$ | Compound name |
|---|---|
| n = 3 | n-butyric acid (In the formula (3), R1 to R6 represent hydrogen) |
| n = 4 | α-methyl butyric acid (In the formula (3), R1 represents a methyl group, and R2 to R6 represent hydrogen) iso-valeric acid |

TABLE 1-continued

| Number of n in $C_nH_{2n+1}COOH$ | Compound name |
|---|---|
| | (In the formula (3), R1, R2 and R4 to R6 represent hydrogen, and R3 represents a methyl group) |
| n = 5 | 2-ethyl butyric acid |
| | (In the formula (3), R1 represents an ethyl group, and R2 to R6 represent hydrogen) |
| | 2,2-dimethyl butyric acid |
| | (In the formula (3), R1 and R2 represent a methyl group, and R3 to R6 represent hydrogen) |
| | 3,3-dimethyl butyric acid |
| | (In the formula (3), R3 and R4 represent a methyl group, and R1, R2, R5 and R6 represent hydrogen) |
| | 2,3-dimethyl butyric acid |
| | (In the formula (3), R1 and R3 represent methyl group, and R2 and R4 to R6 represent hydrogen) |
| | 3-methyl pentanoic acid |
| | (In the formula (3), R3 and R5 represent a methyl group, and R1, R2, R4 and R6 represent hydrogen) |
| | 4-methyl pentanoic acid |
| | (In the formula (3), R5 and R6 represent a methyl group, and R1 to R4 represent hydrogen) |
| n = 6 | 2-ethyl pentanoic acid |
| | (In the formula (3), R1 represents an ethyl group, R5 represents a methyl group, and R2 to R4 and R6 represent hydrogen) |
| | 3-ethyl pentanoic acid |
| | (In the formula (3), R3 represents an ethyl group, R5 represents a methyl group, and R1, R2, R4 and R6 represent hydrogen) |
| | 2,2-dimethyl pentanoic acid |
| | (In the formula (3)), R1, R2 and R5 represent a methyl group, and R3, R4 and R6 represent hydrogen) |
| | 3,3-dimethyl pentanoic acid |
| | (In the formula (3), R3, R4 and R5 represent a methyl group, and R1, R2 and R6 represent hydrogen) |
| | 2,3-dimethyl pentanoic acid |
| | (In the formula (3), R1, R3 and R5 represent a methyl group, and R2, R4 and R6 represent hydrogen) |
| | 4-methyl hexanoic acid |
| | (In the formula (3), R5 represents a methyl group, R6 represents an ethyl group, and R1 to R4 represent hydrogen) |
| n = 7 | 2-ethyl hexanoic acid |
| | (In the formula (3), R1 and R5 represent an ethyl group, and R2 to R4 and R6 represent hydrogen) |
| | 3-ethyl hexanoic acid |
| | (In the formula (3), R3 and R5 represent an ethyl group, and R1, R2, R4 and R6 represent hydrogen) |
| | 2,2-dimethyl hexanoic acid |
| | (In the formula (3), R1 and R2 represent a methyl group, R5 represent an ethyl group, and R3, R4 and R6 represent hydrogen) |
| | 3,3-dimethyl hexanoic acid |
| | (In the formula (3), R3 and R4 represent a methyl group, R5 represents an ethyl group, and R1, R2 and R6 represent hydrogen) |

In order to prepare the composition for the formation of a ferroelectric thin film in accordance with the present invention, these raw materials are dissolved in a suitable solvent at the ratio corresponding to a desired ferroelectric thin film composition, thereby preparing a solution at a concentration suitable for application.

Although the solvent for a composition for the formation of a ferroelectric thin film used herein is appropriately determined depending on the type of the raw materials to be used, there may be generally used alcohol, ester, ketones (for example, acetone, methyl ethyl ketone), ethers (for example, dimethyl ether, diethyl ether), cycloalkanes (for example, cyclohexane, cyclohexanol), aromatics (for example, benzene, toluene, xylene), tetrahydrofuran, or a mixed solvent of two or more thereof.

As the ester, it is preferred to use ethyl acetate, propyl acetate, n-butyl acetate, sec-butyl acetate, tert-butyl acetate, isobutyl acetate, n-amyl acetate, sec-amyl acetate, tert-amyl acetate, or isoamyl acetate. As the alcohol, it is preferred to use 1-propanol, 2-propanol, 1-butanol, 2-butanol, iso-butyl alcohol, 1-pentanol, 2-pentanol, 2-methyl-2-pentanol, or 2-methoxy ethanol.

In addition, the total concentration of an organometallic compound in an organometallic compound solution of the composition for the formation of a ferroelectric thin film is preferably in the range of 0.1 to 20% by mass, in terms of the metal oxides.

The organometallic compound solution may contain, if necessary, a stabilizer selected from the group consisting of β-diketones (for example, acetylacetone, heptafluorobutanoyl pyvaloyl methane, dipyvaloyl methane, trifluoro acetylacetone, benzoyl acetone, etc.), β-ketonic acids (for example, acetoacetic acid, propionyl acetic acid, benzoyl acetic acid, etc.), β-ketoesters (for example, lower alkyl esters such as methyl, propyl, butyl esters and the like of the above-mentioned ketonic acids), oxy-acids (for example, lactic acid, glycolic acid, α-oxy butyric acid, salicylic acid, etc.), lower alkyl esters of the above-mentioned oxy-acids, oxy ketones (for example, diacetone alcohol, acetoin, etc.), diol, triol, alkanol amines (for example, diethanolamine, triethanolamine, monoethanolamine), and polyamine, in a proportion of 0.2 to 3 (in terms of (number of stabilizer molecules)/(number of metal atoms)).

In the present invention, the above-prepared organometallic compound solution is preferably subjected to filtration or the like to remove particles, such that the number of particles having a particle diameter of 0.5 μm or more (particularly 0.3 μm or more, and more particularly 0.2 μm or more) is 50 particles/mL or less per 1 mL of the solution.

If the number of particles having a particle diameter of 0.5 μm or more in the organometallic compound solution is higher than 50 particles/mL, the long-term storage stability is deteriorated. The smaller number of particles having a particle diameter of 0.5 μm or more in the organometallic compound solution is preferable. Particularly preferred is 30 particles/mL or less.

Although there is no particular limitation to the method of treating an organometallic compound solution to achieve the above-mentioned particle number after preparation thereof, for example, the following methods may be employed. The first method is a filtration method of transferring a solution to a syringe, using a commercially available membrane filter having a pore diameter of 0.2 μm. The second method is a pressure filtration method with combination of a commercially available membrane filter having a pore diameter of 0.05 μm and a pressurized tank. The third method is a cycle filtration with combination of the filter used in the second method and a solution circulation bath.

In any one of the above methods, the particle capture rate of the filter varies depending on the solution transfer pressure. It is generally known that lower pressure leads to a higher capture rate. In particular, with regard to the first and second methods, in order to achieve the condition that the number of particles having a particle diameter of 0.5 μm or more is 50 or less, the solution is preferably passed through a filter at a very low rate under a low pressure.

By using the composition for the formation of a ferroelectric thin film in accordance with the present invention, it is possible to conveniently form a ferroelectric thin film in the form of a composite metal oxide A of one material selected from the group consisting of PLZT, PZT, and PT.

In order to prepare a ferroelectric thin film using the composition for the formation of a ferroelectric thin film in accordance with the present invention, the above composition is applied to a heat-resistant substrate by an application method such as spin coating, dip coating, or Liquid Source Misted Chemical Deposition (LSMCD), followed by drying (pre-baking) and main baking.

Specific examples of the heat-resistant substrate that can be used herein include, but are not limited to, substrates whose substrate surface part employs a perovskite-type conductive oxide such as single-crystalline Si, polycrystalline Si, Pt, Pt (uppermost layer)/Ti, Pt (uppermost layer)/Ta, Ru, $RuO_2$, Ru (uppermost layer)/$RuO_2$, $RuO_2$ (uppermost layer)/Ru, Ir, $IrO_2$, Ir (uppermost layer)/$IrO_2$, Pt(uppermost layer)/Ir, Pt (uppermost layer)/$IrO_2$, $SrRuO_3$ or $(La_xSr_{(1-x)})CoO_3$.

In addition, when a desired film thickness cannot be obtained by one time of application, the application and drying processes are repeated several times, and then main baking is carried out. As used herein, the term "desired film thickness" refers to a thickness of the ferroelectric thin film which is obtained after the main baking. For use in a thin film capacitor with a high capacity density, a film thickness of the ferroelectric thin film after the main baking is in the range of 50 to 500 nm.

Further, since the pre-baking is carried out for the removal of the solvent and for the conversion of an organometallic compound into a composite oxide by pyrolysis or hydrolysis, the pre-baking is carried out in air or under an oxidative atmosphere or water vapor-containing atmosphere. Also with regard to heating in air, moisture necessary for hydrolysis is sufficiently secured from moisture in air. The heating may be carried out in two steps, i.e. low-temperature heating for the removal of the solvent and high-temperature heating for the decomposition of the organometallic compound.

The main baking is a process for baking to crystallize the thin film obtained by the pre-baking at a high temperature equal to or higher than its crystallization temperature. Thereby, a ferroelectric thin film can be obtained. A baking atmosphere for this crystallization process is preferably $O_2$, $N_2$, Ar, $N_2O$ or $H_2$, or a mixed gas thereof.

The pre-baking is carried out at a temperature of 150 to 550° C. for 5 to 10 minutes, and the main baking is carried out at a temperature of 450 to 800° C. for 1 to 60 minutes. The main baking may also be carried out by rapid thermal annealing (RTA treatment). When the main baking is carried out by RTA treatment, the temperature elevation rate is preferably in the range of 10 to 100° C./sec.

The thus formed ferroelectric thin film of Group 3 has a significantly improved specific permittivity as compared to a conventional ferroelectric thin film and is excellent in basic characteristics as a capacitor, and is therefore preferable for use in a thin film capacitor having a high capacity density. Further, the ferroelectric thin film of the present invention also has excellent in basic characteristics as IPD.

Further, the ferroelectric thin film of Group 3 can be used as a constituent material for a composite electronic component of a thin-film condenser, a capacitor, an IPD, a DRAM memory condenser, a multilayer capacitor, a transistor gate insulator, a nonvolatile memory, a pyroelectric infrared detection device, a piezoelectric device, an electro-optical device, an actuator, a resonator, an ultrasonic motor, or an LC noise filter device. In particular, the ferroelectric thin film of Group 3 can be used in the composite electronic component which corresponds to a frequency band of 100 MHz or higher.

EXAMPLES

[Group 1]

Hereinafter, Examples A-1 to A-29 of the present invention in conjunction with Comparative Examples A-1 to A-8 will be described in more detail.

The following Examples A-1 to A-29 and Comparative Examples A-1 to A-8 were carried out using the raw materials below.

Pb compound: lead acetate trihydrate

La compound: lanthanum acetate 1.5 hydrate

Zr compound: zirconium tetra-t-butoxide

Ti compound: titanium tetraisopropoxide

P (phosphorus) compound: P (phosphorus) triisopropoxide, triethyl phosphate

Examples A-1 to A-29 and Comparative Examples A-1 to A-8

An organometallic compound (Pb, La compound, etc.) in the form of an organic acid salt was dissolved in sufficiently dehydrated 2-methoxy ethanol as an organic solvent, and water of crystallization was removed by azeotropic distillation. Then, an organometallic compound or organic compound (Zr, Ti, P (phosphorus) compound, etc.) in the form of an alkoxide was added and dissolved in the resulting solution. For the purpose of solution stabilization, a 2-fold mol of acetylacetone or diethanolamine was added relative to the alkoxide. Each element was added to PZT according to the addition element species and additive amount as given in Table 2 or 3 below, thereby preparing a solution for the formation of a thin film such that the total concentration of organometallic compounds in terms of the metal oxides was about 10% by weight.

Using each solution, a thin film was formed by a CSD method, according to the following procedure.

That is, each solution was applied by a spin coating method at 500 rpm for 3 seconds and then at 3000 rpm for 15 seconds to a 6 inch silicon substrate where a Pt thin film was sputtered on the surface thereof.

Then, pre-baking was carried out by heating the substrate on a hot plate at 350° C. for 10 minutes. After the application and pre-baking processes were repeated 6 times, the substrate was subjected to baking in a rapid thermal annealer (RTA) under a 100% oxygen atmosphere or dry air atmosphere at 700° C. for 1 minute, thereby forming a ferroelectric thin film having a film thickness of 300 nm.

Next, a Pt upper electrode of about 250 μm☐ was fabricated on the surface of the substrate by a sputtering method using a metal mask, a DC voltage was applied between Pt lower electrodes immediately under the ferroelectric thin film, and I-V characteristics (voltage dependence of leakage current density and dielectric strength voltage) were evaluated. The measurement of I-V characteristics was carried out using a 236 SMU (manufactured by Keithley) under the conditions of Bias step 0.5 V, a delay time of 0.1 sec, a temperature of 23° C., and a hygrometry of 50±0%. The term "dielectric strength voltage" is defined as a voltage at the $_{(n-1)th}$ Bias step where the leakage current density exceeds 1 A/cm². The results are given in Tables 2 and 3 below and FIGS. 1 to 4.

TABLE 2

| | Addition element species/Additive amount (mol %) | Added P (Phosphorus) compound form | Added stabilizer | Baking atmosphere | Leakage current density (A/cm$^2$) at 5 V | at 20 V | at 50 V | Dielectric strength voltage (V) |
|---|---|---|---|---|---|---|---|---|
| Example A-1 | P(III) 1% | P(phosphorus) triisopropoxide | Acetylacetone | Oxygen | $2.31 \times 10^{-7}$ | $3.89 \times 10^{-7}$ | $2.15 \times 10^{-6}$ | 81.5 |
| Example A-2 | P(III) 3% | P(phosphorus) triisopropoxide | Acetylacetone | Oxygen | $1.67 \times 10^{-7}$ | $2.22 \times 10^{-7}$ | $7.99 \times 10^{-7}$ | 72 |
| Example A-3 | P(V) 1% | Triethyl phosphate | Acetylacetone | Oxygen | $6.96 \times 10^{-7}$ | $6.03 \times 10^{-6}$ | $6.49 \times 10^{-5}$ | 74 |
| Example A-4 | P(V) 3% | Triethyl phosphate | Acetylacetone | Oxygen | $3.17 \times 10^{-7}$ | $7.84 \times 10^{-7}$ | $4.79 \times 10^{-6}$ | 86 |
| Example A-5 | P(V) 5% | Triethyl phosphate | Acetylacetone | Oxygen | $2.57 \times 10^{-7}$ | $4.99 \times 10^{-7}$ | $2.84 \times 10^{-6}$ | 84.5 |
| Example A-6 | P(III) 1%, Sn 1% | P(phosphorus) triisopropoxide | Acetylacetone | Oxygen | $1.41 \times 10^{-7}$ | $1.10 \times 10^{-6}$ | — | 25.5 |
| Example A-7 | P(V) 1%, Sn 1% | Triethyl phosphate | Acetylacetone | Oxygen | $3.80 \times 10^{-6}$ | — | — | 19.5 |
| Example A-8 | P(V) 5%, Sn 1% | Triethyl phosphate | Acetylacetone | Oxygen | $1.81 \times 10^{-7}$ | $1.76 \times 10^{-6}$ | — | 27 |
| Example A-9 | P(III) 1%, Si 0.5% | P(phosphorus) triisopropoxide | Acetylacetone | Oxygen | $2.05 \times 10^{-7}$ | $3.11 \times 10^{-7}$ | $7.73 \times 10^{-7}$ | 83.5 |
| Example A-10 | P(V) 1%, Si 0.5% | Triethyl phosphate | Acetylacetone | Oxygen | $4.31 \times 10^{-7}$ | $1.02 \times 10^{-6}$ | $6.84 \times 10^{-6}$ | 83.5 |
| Example A-11 | P(V) 1%, La 1% | Triethyl phosphate | Acetylacetone | Oxygen | $1.22 \times 10^{-7}$ | $7.34 \times 10^{-7}$ | $6.59 \times 10^{-6}$ | 82 |
| Example A-12 | P(V) 3%, La 1% | Triethyl phosphate | Acetylacetone | Oxygen | $1.41 \times 10^{-7}$ | $5.43 \times 10^{-7}$ | $4.15 \times 10^{-6}$ | 81.5 |
| Example A-13 | P(V) 3%, La 3% | Triethyl phosphate | Acetylacetone | Oxygen | $7.49 \times 10^{-8}$ | $1.78 \times 10^{-7}$ | $1.57 \times 10^{-6}$ | 82 |
| Comparative Example A-1 | Non dope PZT (110/52/48) | — | Acetylacetone | Oxygen | $8.08 \times 10^{-7}$ | $1.00 \times 10^{-5}$ | $2.06 \times 10^{-4}$ | 70 |
| Comparative Example A-2 | La 3% | — | Acetylacetone | Oxygen | $9.57 \times 10^{-8}$ | $4.73 \times 10^{-7}$ | $6.43 \times 10^{-6}$ | 73.5 |
| Comparative Example A-3 | La 1% | — | Acetylacetone | Oxygen | $1.99 \times 10^{-7}$ | $8.91 \times 10^{-7}$ | $1.11 \times 10^{-5}$ | 61.5 |
| Comparative Example A-4 | Sn 1% | — | Acetylacetone | Oxygen | $8.66 \times 10^{-6}$ | — | — | 16 |

TABLE 3

| | Addition element species/Additive amount (mol %) | Added P (phosphorus) compound form | Added stabilizer | Baking atmosphere | Leakage current density (A/cm$^2$) at 20 V | Dielectric strength voltage (V) |
|---|---|---|---|---|---|---|
| Example A-14 | P(III) 0.3% | P(phosphorus) triisopropoxide | Acetylacetone | Dry air | $9.23 \times 10^{-6}$ | 70 |
| Example A-15 | P(III) 1% | P(phosphorus) triisopropoxide | Acetylacetone | Dry air | $6.23 \times 10^{-7}$ | 72 |
| Example A-16 | P(III) 3% | P(phosphorus) triisopropoxide | Acetylacetone | Dry air | $3.45 \times 10^{-7}$ | 75 |
| Example A-17 | P(III) 5% | P(phosphorus) triisopropoxide | Acetylacetone | Dry air | $2.14 \times 10^{-7}$ | 75 |
| Example A-18 | P(III) 10% | P(phosphorus) triisopropoxide | Acetylacetone | Dry air | $2.34 \times 10^{-7}$ | 84 |
| Example A-19 | P(III) 20% | P(phosphorus) triisopropoxide | Acetylacetone | Dry air | $3.43 \times 10^{-7}$ | 83 |
| Example A-20 | P(V) 0.3% | Triethyl phosphate | Diethanolamine | Oxygen | $8.55 \times 10^{-6}$ | 71 |
| Example A-21 | P(V) 1% | Triethyl phosphate | Diethanolamine | Oxygen | $6.23 \times 10^{-6}$ | 71 |
| Example A-22 | P(V) 3% | Triethyl phosphate | Diethanolamine | Oxygen | $3.76 \times 10^{-6}$ | 75 |
| Example A-23 | P(V) 5% | Triethyl phosphate | Diethanolamine | Oxygen | $1.12 \times 10^{-6}$ | 78 |
| Example A-24 | P(V) 10% | Triethyl phosphate | Diethanolamine | Oxygen | $9.34 \times 10^{-7}$ | 80 |
| Example A-25 | P(V) 20% | Triethyl phosphate | Diethanolamine | Oxygen | $1.23 \times 10^{-6}$ | 81 |
| Example A-26 | P(V) 1%, La 1% | Triethyl phosphate | Acetylacetone | Dry air | $8.92 \times 10^{-7}$ | 80 |
| Example A-27 | P(V) 3%, La 3% | Triethyl phosphate | Acetylacetone | Dry air | $8.23 \times 10^{-7}$ | 82 |
| Example A-28 | P(V) 3%, La 1% | Triethyl phosphate | Acetylacetone | Dry air | $7.23 \times 10^{-7}$ | 78 |
| Example A-29 | P(V) 3%, La 3% | Triethyl phosphate | Acetylacetone | Dry air | $2.44 \times 10^{-7}$ | 80 |
| Comparative Example A-5 | Non dope PZT (110/52/48) | — | Acetylacetone | Dry air | $1.35 \times 10^{-6}$ | 65 |
| Comparative Example A-6 | Non dope PZT (110/52/48) | — | Diethanolamine | Oxygen | $1.26 \times 10^{-6}$ | 63 |
| Comparative Example A-7 | La 1% | — | Acetylacetone | Dry air | $9.23 \times 10^{-7}$ | 65 |
| Comparative Example A-8 | La 3% | — | Acetylacetone | Dry air | $5.24 \times 10^{-7}$ | 71 |

As can be seen from Table 2 and FIGS. 1 to 4, the ferroelectric thin films of Examples A-1 to A-5 with an addition of P (phosphorus) exhibited a decrease in leakage current density and simultaneously an improvement in dielectric strength voltage, as compared to the ferroelectric thin film of Comparative Example A-1 with no addition of P (phosphorus).

Further, the same tendency was also observed from the comparison between the ferroelectric thin films of Comparative Examples A-2 and A-3 with an addition of La and the ferroelectric thin films of Examples A-11 to A-13 with co-addition of P (phosphorus) and La.

As can be seen from Comparative Examples A-1 and A-4, the addition of Sn results in an increase in leakage current density, but as shown in Examples A-6 to A-8, coexistence of Sn with P (phosphorus) also exhibited a decrease in leakage current density and simultaneously an improvement in dielectric strength voltage.

In addition, as can be seen from the results of the ferroelectric thin films of Examples A-6 to A-10, coexistence of P (phosphorus) with another ingredient (such as Sn or Si) in an amount of about 1% also exhibited favorable effects of P (phosphorus), and P (phosphorus) was found as an addition element which exerts effects in a very unique fashion.

Further, as can be seen from the results of the ferroelectric thin films of Examples A-14 to A-19, Examples A-20 to A-25, and Comparative Examples A-5 and A-6, a reduced leakage current density and an improved dielectric strength voltage could be simultaneously achieved irrespective of the added P (phosphorus) compound form, stabilizer type, and baking atmosphere.

Further, as can be seen from the results of the ferroelectric thin films of Examples A-26 to A-29 and Comparative Examples A-7 and A-8, a satisfactory tendency was also observed even under the coexistence of La.

From these results, the ferroelectric thin films of Examples A-1 to A-29 are excellent in leakage strength voltage and dielectric strength voltage and can realize a film thickness reduction, thus achieving a high capacity density.

The ferroelectric thin films prepared in Examples A-1 to A-29 exhibit excellent basic characteristics as a capacitor, and can be used for a thin film capacitor with a high capacity density.

Hereinafter, Examples B-1 to B-75 of the present invention in conjunction with Comparative Examples B-1 to B-6 will be described in more detail.

Examples B-1 to B-5

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various silicon compounds (silicon 2-ethyl hexanoate, silicon 2-ethyl butyrate, silicon tetraethoxide, silicon tetra-n-butoxide, tetrakis (acetylacetonate) silicon) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples B-6 to B-10

Ferroelectric thin films were formed on substrates in the same manner as in Examples B-1 to B-5, except that 1.0 mol % (in outer percent) of various silicon compounds was added to the sol-gel liquids to prepare thin film-forming solutions.

Examples B-11 to B-15

Ferroelectric thin films were formed on substrates in the same manner as in Examples B-1 to B-5, except that 3.0 mol % (in outer percent) of various silicon compounds was added to the sol-gel liquids to prepare thin film-forming solutions.

Examples B-16 to B-20

Ferroelectric thin films were formed on substrates in the same manner as in Examples B-1 to B-5, except that 5.0 mol % (in outer percent) of various silicon compounds was added to the sol-gel liquids to prepare thin film-forming solutions.

Examples B-21 to B-25

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate, lanthanum acetate 1.5 hydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/La/Zr/Ti=110/3/52/48 in terms of oxides.

Next, the sol-gel liquid was divided into five equal portions, and 0.5 mol % (in outer percent) of various silicon compounds (silicon 2-ethyl hexanoate, silicon 2-ethyl butyrate, silicon tetraethoxide, silicon tetra-n-butoxide, tetrakis (acetylacetonate) silicon) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Comparative Example B-1

A ferroelectric thin film was formed on a substrate in the same manner as in Examples B-1 to B-5, except that a thin film-forming solution was prepared with no addition of silicon compounds to the sol-gel liquid.

Comparative Example B-2

A ferroelectric thin film was formed on a substrate in the same manner as in Examples B-21 to B-25, except that a thin film-forming solution was prepared with no addition of silicon compounds to the sol-gel liquid.

Examples B-26 to B-30

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various silicon compounds (silicon 2-ethyl hexanoate, silicon 2-ethyl butyrate, silicon tetraethoxide, silicon tetra-n-butoxide, tetrakis (acetylacetonate) silicon) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples B-31 to B-35

Ferroelectric thin films were formed on substrates in the same manner as in Examples B-26 to B-30, except that 1.0 mol % (in outer percent) of various silicon compounds was added to the sol-gel liquids to prepare thin film-forming solutions.

Examples B-36 to B-40

Ferroelectric thin films were formed on substrates in the same manner as in Examples B-26 to B-30, except that 3.0 mol % (in outer percent) of various silicon compounds was added to the sol-gel liquids to prepare thin film-forming solutions.

Examples B-41 to B-45

Ferroelectric thin films were formed on substrates in the same manner as in Examples B-26 to B-30, except that 5.0 mol % (in outer percent) of various silicon compounds was added to the sol-gel liquids to prepare thin film-forming solutions.

Examples B-46 to B-50

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate, lanthanum acetate 1.5 hydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/La/Zr/Ti=110/3/52/48 in terms of oxides.

Next, the sol-gel liquid was divided into five equal portions, and 0.5 mol % (in outer percent) of various silicon compounds (silicon 2-ethyl hexanoate, silicon 2-ethyl butyrate, silicon tetraethoxide, silicon tetra-n-butoxide, tetrakis (acetylacetonate) silicon) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Comparative Example B-3

A ferroelectric thin film was formed on a substrate in the same manner as in Examples B-26 to B-30, except that a thin film-forming solution was prepared with no addition of silicon compounds to the sol-gel liquid.

Comparative Example B-4

A ferroelectric thin film was formed on a substrate in the same manner as in Examples B-46 to B-50, except that a thin film-forming solution was prepared with no addition of silicon compounds to the sol-gel liquid.

Examples B-51 to B-55

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various silicon compounds (silicon 2-ethyl hexanoate, silicon 2-ethyl butyrate, silicon tetraethoxide, silicon tetra-n-butoxide, tetrakis (acetylacetonate) silicon) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/$TiO_2$/$SiO_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a dry air atmosphere at 700° C. for 1 minute, thereby forming a ferroelectric thin film having a film thickness of 270 nm.

Examples B-56 to B-60

Ferroelectric thin films were formed on substrates in the same manner as in Examples B-51 to B-55, except that 1.0 mol % (in outer percent) of various silicon compounds was added to the sol-gel liquids to prepare thin film-forming solutions.

Examples B-61 to B-65

Ferroelectric thin films were formed on substrates in the same manner as in Examples B-51 to B-55, except that 3.0 mol % (in outer percent) of various silicon compounds was added to the sol-gel liquids to prepare thin film-forming solutions.

Examples B-66 to B-70

Ferroelectric thin films were formed on substrates in the same manner as in Examples B-51 to B-55, except that 5.0 mol % (in outer percent) of various silicon compounds was added to the sol-gel liquids to prepare thin film-forming solutions.

Examples B-71 to B-75

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate, lanthanum acetate 1.5 hydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/La/Zr/Ti=110/3/52/48 in terms of oxides.

Next, the sol-gel liquid was divided into five equal portions, and 0.5 mol % (in outer percent) of various silicon compounds (silicon 2-ethyl hexanoate, silicon 2-ethyl butyrate, silicon tetraethoxide, silicon tetra-n-butoxide, tetrakis (acetylacetonate) silicon) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/$TiO_2$/$SiO_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a dry air atmosphere at 700° C. for 1 minute, thereby forming a ferroelectric thin film having a film thickness of 270 nm.

Comparative Example B-5

A ferroelectric thin film was formed on a substrate in the same manner as in Examples B-51 to B-55, except that a thin film-forming solution was prepared with no addition of silicon compounds to the sol-gel liquid.

Comparative Example B-6

A ferroelectric thin film was formed on a substrate in the same manner as in Examples B-71 to B-75, except that a thin film-forming solution was prepared with no addition of silicon compounds to the sol-gel liquid.

<Comparative Evaluation>

For a substrate on which each of the ferroelectric thin films prepared in Examples B-1 to B-75 and Comparative Examples B-1 to B-6 was formed, a Pt upper electrode of about 250 μm☐ was fabricated on the surface of the substrate by a sputtering method using a metal mask, a DC voltage was applied between Pt lower electrodes immediately under the ferroelectric thin film, and I-V characteristics (voltage dependence of leakage current density and dielectric strength voltage) were evaluated. The results obtained are given in Tables 4 to 6 below, respectively. In addition, I-V characteristic diagrams of Examples B-3, B-8, B-13, B-18 and B-23, and Comparative Examples B-1 and B-2 are given in FIGS. 5 to 11, respectively. The measurement of I-V characteristics was carried out using a 236 SMU (manufactured by Keithley) under the conditions of a bias step of 0.5 V, a delay time of 0.1 sec, a temperature of 23° C., and a hygrometry of 50±0%. The term "dielectric strength voltage" is defined as a voltage at the $(n-1)_{th}$ bias step where the leakage current density exceeds 1 A/$cm^2$. In addition, ">99.5" in Tables 4 to 6 represents a voltage measurement limit of a measuring device.

TABLE 4

| | Addition element species/Additive amount (mol %) | Added P (Phosphorus) compound form | Added stabilizer | Baking atmosphere | Leakage current density (A/cm$^2$) at 5 V | at 20 V | at 50 V | Dielectric strength voltage (V) |
|---|---|---|---|---|---|---|---|---|
| Example B-1 | PZT + Si 0.5% | 2-ethyl hexanoate | Acetylacetone | Oxygen | $6.12 \times 10^{-7}$ | $3.10 \times 10^{-6}$ | $2.01 \times 10^{-5}$ | 77.0 |
| Example B-2 | PZT + Si 0.5% | 2-ethyl butyrate | Acetylacetone | Oxygen | $5.84 \times 10^{-7}$ | $2.86 \times 10^{-6}$ | $1.86 \times 10^{-5}$ | 80.0 |
| Example B-3 | PZT + Si 0.5% | Ethoxide | Acetylacetone | Oxygen | $5.77 \times 10^{-7}$ | $2.99 \times 10^{-6}$ | $1.97 \times 10^{-5}$ | 78.0 |
| Example B-4 | PZT + Si 0.5% | n-butoxide | Acetylacetone | Oxygen | $5.97 \times 10^{-7}$ | $2.94 \times 10^{-6}$ | $2.05 \times 10^{-5}$ | 79.5 |
| Example B-5 | PZT + Si 0.5% | Acetylacetonate | Acetylacetone | Oxygen | $6.01 \times 10^{-7}$ | $2.79 \times 10^{-6}$ | $1.96 \times 10^{-5}$ | 78.0 |
| Example B-6 | PZT + Si 1% | 2-ethyl hexanoate | Acetylacetone | Oxygen | $3.53 \times 10^{-7}$ | $6.25 \times 10^{-7}$ | $3.32 \times 10^{-6}$ | 88.0 |
| Example B-7 | PZT + Si 1% | 2-ethyl butyrate | Acetylacetone | Oxygen | $4.01 \times 10^{-7}$ | $6.63 \times 10^{-7}$ | $3.36 \times 10^{-6}$ | 89.0 |
| Example B-8 | PZT + Si 1% | Ethoxide | Acetylacetone | Oxygen | $3.74 \times 10^{-7}$ | $6.50 \times 10^{-7}$ | $3.43 \times 10^{-6}$ | 87.5 |
| Example B-9 | PZT + Si 1% | n-butoxide | Acetylacetone | Oxygen | $3.82 \times 10^{-7}$ | $6.33 \times 10^{-7}$ | $3.46 \times 10^{-6}$ | 86.5 |
| Example B-10 | PZT + Si 1% | Acetylacetonate | Acetylacetone | Oxygen | $3.69 \times 10^{-7}$ | $6.84 \times 10^{-7}$ | $3.51 \times 10^{-5}$ | 86.5 |
| Example B-11 | PZT + Si 3% | 2-ethyl hexanoate | Acetylacetone | Oxygen | $2.33 \times 10^{-7}$ | $4.31 \times 10^{-7}$ | $1.35 \times 10^{-6}$ | 94.0 |
| Example B-12 | PZT + Si 3% | 2-ethyl butyrate | Acetylacetone | Oxygen | $2.62 \times 10^{-7}$ | $4.03 \times 10^{-7}$ | $1.40 \times 10^{-6}$ | 97.5 |
| Example B-13 | PZT + Si 3% | Ethoxide | Acetylacetone | Oxygen | $2.49 \times 10^{-7}$ | $4.16 \times 10^{-7}$ | $1.31 \times 10^{-6}$ | 95.0 |
| Example B-14 | PZT + Si 3% | n-butoxide | Acetylacetone | Oxygen | $2.47 \times 10^{-7}$ | $4.18 \times 10^{-7}$ | $1.50 \times 10^{-6}$ | 95.5 |
| Example B-15 | PZT + Si 3% | Acetylacetonate | Acetylacetone | Oxygen | $2.41 \times 10^{-7}$ | $4.08 \times 10^{-7}$ | $1.46 \times 10^{-6}$ | 95.0 |
| Example B-16 | PZT + Si 5% | 2-ethyl hexanoate | Acetylacetone | Oxygen | $2.46 \times 10^{-7}$ | $2.84 \times 10^{-7}$ | $7.32 \times 10^{-7}$ | >99.5 |
| Example B-17 | PZT + Si 5% | 2-ethyl butyrate | Acetylacetone | Oxygen | $2.61 \times 10^{-7}$ | $2.74 \times 10^{-7}$ | $7.15 \times 10^{-7}$ | >99.5 |
| Example B-18 | PZT + Si 5% | Ethoxide | Acetylacetone | Oxygen | $2.52 \times 10^{-7}$ | $2.79 \times 10^{-7}$ | $7.22 \times 10^{-7}$ | >99.5 |
| Example B-19 | PZT + Si 5% | n-butoxide | Acetylacetone | Oxygen | $2.42 \times 10^{-7}$ | $2.75 \times 10^{-7}$ | $7.32 \times 10^{-7}$ | >99.5 |
| Example B-20 | PZT + Si 5% | Acetylacetonate | Acetylacetone | Oxygen | $2.51 \times 10^{-7}$ | $2.86 \times 10^{-7}$ | $7.31 \times 10^{-7}$ | >99.5 |
| Example B-21 | PLZT + Si 0.5% | 2-ethyl hexanoate | Acetylacetone | Oxygen | $7.21 \times 10^{-8}$ | $2.05 \times 10^{-7}$ | $1.25 \times 10^{-6}$ | 84.0 |
| Example B-22 | PLZT + Si 0.5% | 2-ethyl butyrate | Acetylacetone | Oxygen | $7.47 \times 10^{-8}$ | $2.28 \times 10^{-7}$ | $1.30 \times 10^{-6}$ | 85.5 |
| Example B-23 | PLZT + Si 0.5% | Ethoxide | Acetylacetone | Oxygen | $7.34 \times 10^{-8}$ | $2.15 \times 10^{-7}$ | $1.20 \times 10^{-6}$ | 83.5 |
| Example B-24 | PLZT + Si 0.5% | n-butoxide | Acetylacetone | Oxygen | $7.38 \times 10^{-8}$ | $2.20 \times 10^{-7}$ | $1.25 \times 10^{-6}$ | 84.0 |
| Example B-25 | PLZT + Si 0.5% | Acetylacetonate | Acetylacetone | Oxygen | $7.29 \times 10^{-8}$ | $2.19 \times 10^{-7}$ | $1.14 \times 10^{-6}$ | 84.0 |
| Comparative Example B-1 | Non dope PZT (110/52/48) | — | Acetylacetone | Oxygen | $8.08 \times 10^{-7}$ | $1.00 \times 10^{-6}$ | $2.06 \times 10^{-4}$ | 70.0 |
| Comparative Example B-2 | Non dope PLZT (110/3/52/48) | — | Acetylacetone | Oxygen | $9.57 \times 10^{-8}$ | $4.73 \times 10^{-7}$ | $6.43 \times 10^{-6}$ | 73.5 |

TABLE 5

| | Addition element species/Additive amount (mol %) | Added P (Phosphorus) compound form | Added stabilizer | Baking atmosphere | Leakage current density (A/cm$^2$) at 5 V | at 20 V | at 50 V | Dielectric strength voltage (V) |
|---|---|---|---|---|---|---|---|---|
| Example B-26 | PZT + Si 0.5% | 2-ethyl hexanoate | Diethanolamine | Oxygen | $6.03 \times 10^{-7}$ | $2.99 \times 10^{-6}$ | $1.98 \times 10^{-6}$ | 78.5 |
| Example B-27 | PZT + Si 0.5% | 2-ethyl butyrate | Diethanolamine | Oxygen | $5.73 \times 10^{-7}$ | $2.95 \times 10^{-6}$ | $1.95 \times 10^{-5}$ | 79.5 |
| Example B-28 | PZT + Si 0.5% | Ethoxide | Diethanolamine | Oxygen | $5.93 \times 10^{-7}$ | $3.05 \times 10^{-6}$ | $2.00 \times 10^{-5}$ | 79.5 |
| Example B-29 | PZT + Si 0.5% | n-butoxide | Diethanolamine | Oxygen | $5.72 \times 10^{-7}$ | $2.85 \times 10^{-6}$ | $1.90 \times 10^{-5}$ | 80.0 |
| Example B-30 | PZT + Si 0.5% | Acetylacetonate | Diethanolamine | Oxygen | $5.83 \times 10^{-7}$ | $2.88 \times 10^{-6}$ | $2.03 \times 10^{-5}$ | 80.0 |
| Example B-31 | PZT + Si 1% | 2-ethyl hexanoate | Diethanolamine | Oxygen | $3.93 \times 10^{-7}$ | $6.60 \times 10^{-7}$ | $3.61 \times 10^{-6}$ | 88.0 |
| Example B-32 | PZT + Si 1% | 2-ethyl butyrate | Diethanolamine | Oxygen | $3.62 \times 10^{-7}$ | $6.71 \times 10^{-7}$ | $3.41 \times 10^{-6}$ | 87.5 |
| Example B-33 | PZT + Si 1% | Ethoxide | Diethanolamine | Oxygen | $3.71 \times 10^{-7}$ | $6.55 \times 10^{-7}$ | $3.48 \times 10^{-6}$ | 87.0 |
| Example B-34 | PZT + Si 1% | n-butoxide | Diethanolamine | Oxygen | $3.91 \times 10^{-7}$ | $6.61 \times 10^{-7}$ | $3.50 \times 10^{-6}$ | 88.0 |
| Example B-35 | PZT + Si 1% | Acetylacetonate | Diethanolamine | Oxygen | $3.83 \times 10^{-7}$ | $6.39 \times 10^{-7}$ | $3.35 \times 10^{-6}$ | 88.5 |
| Example B-36 | PZT + Si 3% | 2-ethyl hexanoate | Diethanolamine | Oxygen | $2.41 \times 10^{-7}$ | $4.25 \times 10^{-7}$ | $1.31 \times 10^{-6}$ | 96.5 |
| Example B-37 | PZT + Si 3% | 2-ethyl butyrate | Diethanolamine | Oxygen | $2.63 \times 10^{-7}$ | $4.35 \times 10^{-7}$ | $1.28 \times 10^{-6}$ | 96.0 |
| Example B-38 | PZT + Si 3% | Ethoxide | Diethanolamine | Oxygen | $2.48 \times 10^{-7}$ | $4.12 \times 10^{-7}$ | $1.35 \times 10^{-6}$ | 96.0 |
| Example B-39 | PZT + Si 3% | n-butoxide | Diethanolamine | Oxygen | $2.61 \times 10^{-7}$ | $4.23 \times 10^{-7}$ | $1.41 \times 10^{-6}$ | 95.5 |
| Example B-40 | PZT + Si 3% | Acetylacetonate | Diethanolamine | Oxygen | $2.35 \times 10^{-7}$ | $4.08 \times 10^{-7}$ | $1.25 \times 10^{-6}$ | 97.0 |
| Example B-41 | PZT + Si 5% | 2-ethyl hexanoate | Diethanolamine | Oxygen | $2.41 \times 10^{-7}$ | $2.65 \times 10^{-7}$ | $7.31 \times 10^{-7}$ | >99.5 |
| Example B-42 | PZT + Si 5% | 2-ethyl butyrate | Diethanolamine | Oxygen | $2.48 \times 10^{-7}$ | $2.75 \times 10^{-7}$ | $7.22 \times 10^{-7}$ | >99.5 |
| Example B-43 | PZT + Si 5% | Ethoxide | Diethanolamine | Oxygen | $2.37 \times 10^{-7}$ | $2.77 \times 10^{-7}$ | $7.20 \times 10^{-7}$ | >99.5 |
| Example B-44 | PZT + Si 5% | n-butoxide | Diethanolamine | Oxygen | $2.25 \times 10^{-7}$ | $2.69 \times 10^{-7}$ | $7.40 \times 10^{-7}$ | >99.5 |
| Example B-45 | PZT + Si 5% | Acetylacetonate | Diethanolamine | Oxygen | $2.31 \times 10^{-7}$ | $2.81 \times 10^{-7}$ | $7.25 \times 10^{-7}$ | >99.5 |
| Example B-46 | PLZT + Si 0.5% | 2-ethyl hexanoate | Diethanolamine | Oxygen | $7.38 \times 10^{-8}$ | $2.10 \times 10^{-7}$ | $1.21 \times 10^{-6}$ | 84.5 |
| Example B-47 | PLZT + Si 0.5% | 2-ethyl butyrate | Diethanolamine | Oxygen | $7.21 \times 10^{-8}$ | $2.31 \times 10^{-7}$ | $1.13 \times 10^{-6}$ | 85.0 |
| Example B-48 | PLZT + Si 0.5% | Ethoxide | Diethanolamine | Oxygen | $7.35 \times 10^{-8}$ | $2.25 \times 10^{-7}$ | $1.18 \times 10^{-6}$ | 85.0 |
| Example B-49 | PLZT + Si 0.5% | n-butoxide | Diethanolamine | Oxygen | $7.50 \times 10^{-8}$ | $2.23 \times 10^{-7}$ | $1.25 \times 10^{-6}$ | 84.5 |
| Example B-50 | PLZT + Si 0.5% | Acetylacetonate | Diethanolamine | Oxygen | $7.43 \times 10^{-8}$ | $2.18 \times 10^{-7}$ | $1.23 \times 10^{-6}$ | 84.0 |
| Comparative Example B-3 | Non dope PZT (110/52/48) | — | Diethanolamine | Oxygen | $8.21 \times 10^{-7}$ | $1.03 \times 10^{-5}$ | $2.12 \times 10^{-4}$ | 70.5 |
| Comparative Example B-4 | Non dope PLZT (110/3/52/48) | — | Diethanolamine | Oxygen | $1.02 \times 10^{-7}$ | $4.63 \times 10^{-7}$ | $6.51 \times 10^{-6}$ | 72.0 |

TABLE 6

| | Addition element species/Additive amount (mol %) | Added P (Phosphorus) compound form | Added stabilizer | Baking atmosphere | Leakage current density (A/cm²) | | | Dielectric strength voltage (V) |
|---|---|---|---|---|---|---|---|---|
| | | | | | at 5 V | at 20 V | at 50 V | |
| Example B-51 | PZT + Si 0.5% | 2-ethyl hexanoate | Acetylacetone | Dry air | $5.92 \times 10^{-7}$ | $2.91 \times 10^{-6}$ | $1.91 \times 10^{-5}$ | 78.0 |
| Example B-52 | PZT + Si 0.5% | 2-ethyl butyrate | Acetylacetone | Dry air | $5.80 \times 10^{-7}$ | $2.88 \times 10^{-6}$ | $1.95 \times 10^{-5}$ | 80.0 |
| Example B-53 | PZT + Si 0.5% | Ethoxide | Acetylacetone | Dry air | $5.83 \times 10^{-7}$ | $3.01 \times 10^{-6}$ | $1.83 \times 10^{-5}$ | 78.5 |
| Example B-54 | PZT + Si 0.5% | n-butoxide | Acetylacetone | Dry air | $5.85 \times 10^{-7}$ | $2.85 \times 10^{-6}$ | $1.79 \times 10^{-5}$ | 78.0 |
| Example B-55 | PZT + Si 0.5% | Acetylacetonate | Acetylacetone | Dry air | $6.00 \times 10^{-7}$ | $2.81 \times 10^{-6}$ | $1.97 \times 10^{-5}$ | 79.0 |
| Example B-56 | PZT + Si 1% | 2-ethyl hexanoate | Acetylacetone | Dry air | $3.69 \times 10^{-7}$ | $6.53 \times 10^{-7}$ | $3.28 \times 10^{-6}$ | 89.0 |
| Example B-57 | PZT + Si 1% | 2-ethyl butyrate | Acetylacetone | Dry air | $3.83 \times 10^{-7}$ | $6.35 \times 10^{-7}$ | $3.31 \times 10^{-6}$ | 87.5 |
| Example B-58 | PZT + Si 1% | Ethoxide | Acetylacetone | Dry air | $3.85 \times 10^{-7}$ | $6.41 \times 10^{-7}$ | $3.41 \times 10^{-6}$ | 88.0 |
| Example B-59 | PZT + Si 1% | n-butoxide | Acetylacetone | Dry air | $3.61 \times 10^{-7}$ | $6.31 \times 10^{-7}$ | $3.35 \times 10^{-6}$ | 88.0 |
| Example B-60 | PZT + Si 1% | Acetylacetonate | Acetylacetone | Dry air | $3.75 \times 10^{-7}$ | $6.61 \times 10^{-7}$ | $3.25 \times 10^{-6}$ | 89.0 |
| Example B-61 | PZT + Si 3% | 2-ethyl hexanoate | Acetylacetone | Dry air | $2.48 \times 10^{-7}$ | $4.25 \times 10^{-7}$ | $1.51 \times 10^{-6}$ | 96.0 |
| Example B-62 | PZT + Si 3% | 2-ethyl butyrate | Acetylacetone | Dry air | $2.51 \times 10^{-7}$ | $4.11 \times 10^{-7}$ | $1.38 \times 10^{-6}$ | 97.0 |
| Example B-63 | PZT + Si 3% | Ethoxide | Acetylacetone | Dry air | $2.40 \times 10^{-7}$ | $4.08 \times 10^{-7}$ | $1.48 \times 10^{-6}$ | 95.5 |
| Example B-64 | PZT + Si 3% | n-butoxide | Acetylacetone | Dry air | $2.31 \times 10^{-7}$ | $4.15 \times 10^{-7}$ | $1.43 \times 10^{-6}$ | 96.0 |
| Example B-65 | PZT + Si 3% | Acetylacetonate | Acetylacetone | Dry air | $2.43 \times 10^{-7}$ | $4.28 \times 10^{-7}$ | $1.33 \times 10^{-6}$ | 97.0 |
| Example B-66 | PZT + Si 5% | 2-ethyl hexanoate | Acetylacetone | Dry air | $2.51 \times 10^{-7}$ | $2.86 \times 10^{-7}$ | $7.35 \times 10^{-7}$ | >99.5 |
| Example B-67 | PZT + Si 5% | 2-ethyl butyrate | Acetylacetone | Dry air | $2.53 \times 10^{-7}$ | $2.73 \times 10^{-7}$ | $7.26 \times 10^{-7}$ | >99.5 |
| Example B-68 | PZT + Si 5% | Ethoxide | Acetylacetone | Dry air | $2.45 \times 10^{-7}$ | $2.69 \times 10^{-7}$ | $7.21 \times 10^{-7}$ | >99.5 |
| Example B-69 | PZT + Si 5% | n-butoxide | Acetylacetone | Dry air | $2.50 \times 10^{-7}$ | $2.80 \times 10^{-7}$ | $7.32 \times 10^{-7}$ | >99.5 |
| Example B-70 | PZT + Si 5% | Acetylacetonate | Acetylacetone | Dry air | $2.61 \times 10^{-7}$ | $2.83 \times 10^{-7}$ | $7.13 \times 10^{-7}$ | >99.5 |
| Example B-71 | PLZT + Si 0.5% | 2-ethyl hexanoate | Acetylacetone | Dry air | $7.25 \times 10^{-8}$ | $2.13 \times 10^{-7}$ | $1.21 \times 10^{-6}$ | 85.0 |
| Example B-72 | PLZT + Si 0.5% | 2-ethyl butyrate | Acetylacetone | Dry air | $7.31 \times 10^{-8}$ | $2.28 \times 10^{-7}$ | $1.26 \times 10^{-6}$ | 84.0 |
| Example B-73 | PLZT + Si 0.5% | Ethoxide | Acetylacetone | Dry air | $7.38 \times 10^{-8}$ | $2.05 \times 10^{-7}$ | $1.31 \times 10^{-6}$ | 85.0 |
| Example B-74 | PLZT + Si 0.5% | n-butoxide | Acetylacetone | Dry air | $7.35 \times 10^{-8}$ | $2.30 \times 10^{-7}$ | $1.28 \times 10^{-6}$ | 84.5 |
| Example B-75 | PLZT + Si 0.5% | Acetylacetonate | Acetylacetone | Dry air | $7.40 \times 10^{-8}$ | $2.21 \times 10^{-7}$ | $1.09 \times 10^{-6}$ | 84.0 |
| Comparative Example B-5 | Non dope PZT (110/52/48) | — | Acetylacetone | Dry air | $8.52 \times 10^{-7}$ | $9.85 \times 10^{-4}$ | $2.16 \times 10^{-4}$ | 72.0 |
| Comparative Example B-6 | Non dope PLZT (110/3/52/48) | — | Acetylacetone | Dry air | $9.82 \times 10^{-8}$ | $4.82 \times 10^{-7}$ | $6.55 \times 10^{-6}$ | 71.5 |

As can be seen from Tables 4 to 6 and FIGS. 5 to 11, the PZT ferroelectric thin films of Examples B-1 to B-20, B-26 to B-45, and B-51 to B-70 with an addition of Si exhibited a decrease in leakage current density and simultaneously an improvement in dielectric strength voltage, as compared to the PZT ferroelectric thin films of Comparative Examples B-1, B-3 and B-5 with no addition of Si.

Further, the same tendency was also observed from the comparison between the PLZT ferroelectric thin films of Comparative Examples B-2, B-4 and B-6 with an addition of La and the PLZT ferroelectric thin films of Examples B-21 to B-25, B-46 to B-50, and B-71 to B-75 with the co-addition of Si and La.

From these results, it can be seen that the ferroelectric thin films of Examples B-1 to B-75 are excellent in leakage current density and dielectric strength voltage. Further, when the ferroelectric thin films of Examples B-1 to B-75 are configured to have a leakage current density equivalent to that of the ferroelectric thin films of Comparative Examples B-1 to B-6, there are advantages in that the thickness of the film can be further reduced, and a higher specific permittivity can be obtained due to thickness reduction of the film. In addition, the amount of raw materials to be used can also be reduced.

The ferroelectric thin films prepared in Examples B-1 to B-75 exhibit excellent basic characteristics as a capacitor, and can be used for a capacitor with a high density and a high dielectric breakdown voltage.

Hereinafter, Examples C-1 to C-51 of the present invention in conjunction with Comparative Examples C-1 to C-6 will be described in more detail.

Examples C-1 to C-5

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various cerium compounds (cerium 2-ethyl hexanoate, cerium 2-ethyl butyrate, cerium triethoxide, cerium tri-n-butoxide, tris (acetylacetonate) cerium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples C-6 to C-10

Ferroelectric thin films were formed on substrates in the same manner as in Examples C-1 to C-5, except that 1.0 mol % (in outer percent) of various cerium compounds was added to the sol-gel liquids to prepare thin film-forming solutions.

Examples C-11 to C-15

Ferroelectric thin films were formed on substrates in the same manner as in Examples C-1 to C-5, except that 3.0 mol % (in outer percent) of various cerium compounds was added to the sol-gel liquids to prepare thin film-forming solutions.

Example C-16

A ferroelectric thin film was formed on a substrate in the same manner as in Examples C-1 to C-5, except that 1.0 mol % (in outer percent) of a lanthanum compound (lanthanum acetate 1.5 hydrate) and 1.0 mol % (in outer percent) of a cerium compound (cerium 2-ethyl hexanoate) were added to the sol-gel liquid to prepare a thin film-forming solution.

Example C-17

A ferroelectric thin film was formed on a substrate in the same manner as in Examples C-1 to C-5, except that 1.0 mol % (in outer percent) of a lanthanum compound (lanthanum acetate 1.5 hydrate) and 1.0 mol % (in outer percent) of a cerium compound (cerium triethoxide) were added to the sol-gel liquid to prepare a thin film-forming solution.

Comparative Example C-1

A ferroelectric thin film was formed on a substrate in the same manner as in Examples C-1 to C-5, except that a thin film-forming solution was prepared with no addition of cerium compounds to the sol-gel liquid.

Comparative Example C-2

A ferroelectric thin film was formed on a substrate in the same manner as in Examples C-1 to C-5, except that a thin film-forming solution was prepared with no addition of cerium compounds to the sol-gel liquid, but with addition of 1.0 mol % (in outer percent) of a lanthanum compound (lanthanum acetate 1.5 hydrate).

Examples C-18 to C-22

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various cerium compounds (cerium 2-ethyl hexanoate, cerium 2-ethyl butyrate, cerium triethoxide, cerium tri-n-butoxide, tris (acetylacetonate) cerium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate ($Pt/TiO_2/SiO_2/Si(100)$ substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples C-23 to C-27

Ferroelectric thin films were formed on substrates in the same manner as in Examples C-18 to C-22, except that 1.0 mol % (in outer percent) of various cerium compounds was added to the sol-gel liquids to prepare thin film-forming solutions.

Examples C-28 to C-32

Ferroelectric thin films were formed on substrates in the same manner as in Examples C-18 to C-22, except that 3.0 mol % (in outer percent) of various cerium compounds was added to the sol-gel liquids to prepare thin film-forming solutions.

Example C-33

A ferroelectric thin film was formed on a substrate in the same manner as in Examples C-18 to C-22, except that 1.0 mol % (in outer percent) of a lanthanum compound (lanthanum acetate 1.5 hydrate) and 1.0 mol % (in outer percent) of a cerium compound (cerium 2-ethyl hexanoate) were added to the sol-gel liquid to prepare a thin film-forming solution.

Example C-34

A ferroelectric thin film was formed on a substrate in the same manner as in Examples C-18 to C-22, except that 1.0 mol % (in outer percent) of a lanthanum compound (lanthanum acetate 1.5 hydrate) and 1.0 mol % (in outer percent) of a cerium compound (cerium triethoxide) were added to the sol-gel liquid to prepare a thin film-forming solution.

Comparative Example C-3

A ferroelectric thin film was formed on a substrate in the same manner as in Examples C-18 to C-22, except that a thin film-forming solution was prepared with no addition of cerium compounds to the sol-gel liquid.

Comparative Example C-4

A ferroelectric thin film was formed on a substrate in the same manner as in Examples C-18 to C-22, except that a thin film-forming solution was prepared with no addition of cerium compounds to the sol-gel liquid, but with addition of 1.0 mol % (in outer percent) of a lanthanum compound (lanthanum acetate 1.5 hydrate).

Examples C-35 to C-39

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various cerium compounds (cerium 2-ethyl hexanoate, cerium 2-ethyl butyrate, cerium triethoxide, cerium tri-n-butoxide, tris (acetylacetonate) cerium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a dry air atmosphere at 700° C. for 1 minute, thereby forming a ferroelectric thin film having a film thickness of 270 nm.

Examples C-40 to C-44

Ferroelectric thin films were formed on substrates in the same manner as in Examples C-35 to C-39, except that 1.0 mol % (in outer percent) of various cerium compounds was added to the sol-gel liquids to prepare thin film-forming solutions.

Examples C-45 to C-49

Ferroelectric thin films were formed on substrates in the same manner as in Examples C-35 to C-39, except that 3.0 mol % (in outer percent) of various cerium compounds was added to the sol-gel liquids to prepare thin film-forming solutions.

Example C-50

A ferroelectric thin film was formed on a substrate in the same manner as in Examples C-35 to C-39, except that 1.0 mol % (in outer percent) of a lanthanum compound (lanthanum acetate 1.5 hydrate) and 1.0 mol % (in outer percent) of a cerium compound (cerium 2-ethyl hexanoate) were added to the sol-gel liquid to prepare a thin film-forming solution.

Example C-51

A ferroelectric thin film was formed on a substrate in the same manner as in Examples C-35 to C-39, except that 1.0 mol % (in outer percent) of a lanthanum compound (lanthanum acetate 1.5 hydrate) and 1.0 mol % (in outer percent) of a cerium compound (cerium triethoxide) were added to the sol-gel liquid to prepare a thin film-forming solution.

Comparative Example C-5

A ferroelectric thin film was formed on a substrate in the same manner as in Examples C-35 to C-39, except that a thin film-forming solution was prepared with no addition of cerium compounds to the sol-gel liquid.

Comparative Example C-6

A ferroelectric thin film was formed on a substrate in the same manner as in Examples C-35 to C-39, except that a thin film-forming solution was prepared with no addition of cerium compounds to the sol-gel liquid, but with addition of 1.0 mol % (in outer percent) of a lanthanum compound (lanthanum acetate 1.5 hydrate).

<Comparative Evaluation>

For a substrate on which each of the ferroelectric thin films prepared in Examples C-1 to C-51 and Comparative Examples C-1 to C-6 was formed, a Pt upper electrode of about 250 μm was fabricated on the surface of the substrate by a sputtering method using a metal mask, a DC voltage was applied between Pt lower electrodes immediately under the ferroelectric thin film, and I-V characteristics (voltage dependence of leakage current density) were evaluated. In addition, C-V characteristics (voltage dependence of capacitance) were evaluated at a frequency of 1 kHz and at a voltage of −5 to 5 V, between Pt lower electrodes immediately under the ferroelectric thin film. The specific permittivity ∈r was calculated from the maximum value of capacitance. The results obtained are given in Tables 7 to 9 below, respectively. The measurement of I-V characteristics was carried out using a 236 SMU (manufactured by Keithley) under the conditions of Bias step 0.5 V, Delay time 0.1 sec, Temperature 23° C., and Hygrometry 50±10%. The measurement of C-V characteristics was carried out using a 4284A precision LCR meter (manufactured by HP) under the conditions of a bias step of 0.1 V, a frequency of 1 kHz, an oscillation level of 30 mV, a delay time of 0.2 sec, a temperature of 23° C., and a hygrometry of 50±10%.

TABLE 7

| | Addition element species/Additive amount (mol %) | Added Ce compound form | Added stabilizer | Baking atmosphere | Capacitance ($\mu F/cm^2$) | Specific permittivity $\epsilon r$ | Leakage current density ($A/cm^2$) at 5 V | Leakage current density ($A/cm^2$) at 20 V |
|---|---|---|---|---|---|---|---|---|
| Example C-1 | Ce 0.5% | 2-ethyl hexanoate | Acetylacetone | Oxygen | 4.91 | 1500 | $2.37 \times 10^{-7}$ | $4.32 \times 10^{-7}$ |
| Example C-2 | Ce 0.5% | 2-ethyl butyrate | Acetylacetone | Oxygen | 4.85 | 1480 | $2.16 \times 10^{-7}$ | $4.57 \times 10^{-7}$ |
| Example C-3 | Ce 0.5% | Ethoxide | Acetylacetone | Oxygen | 4.92 | 1500 | $2.41 \times 10^{-7}$ | $4.24 \times 10^{-7}$ |
| Example C-4 | Ce 0.5% | n-butoxide | Acetylacetone | Oxygen | 4.88 | 1490 | $2.05 \times 10^{-7}$ | $4.79 \times 10^{-7}$ |
| Example C-5 | Ce 0.5% | Acetylacetonate | Acetylacetone | Oxygen | 4.79 | 1460 | $1.97 \times 10^{-7}$ | $4.19 \times 10^{-7}$ |
| Example C-6 | Ce 1% | 2-ethyl hexanoate | Acetylacetone | Oxygen | 5.09 | 1550 | $1.65 \times 10^{-7}$ | $1.95 \times 10^{-7}$ |
| Example C-7 | Ce 1% | 2-ethyl butyrate | Acetylacetone | Oxygen | 5.13 | 1570 | $1.89 \times 10^{-7}$ | $1.88 \times 10^{-7}$ |
| Example C-8 | Ce 1% | Ethoxide | Acetylacetone | Oxygen | 5.01 | 1530 | $1.97 \times 10^{-7}$ | $1.79 \times 10^{-7}$ |
| Example C-9 | Ce 1% | n-butoxide | Acetylacetone | Oxygen | 4.98 | 1520 | $1.61 \times 10^{-7}$ | $2.02 \times 10^{-7}$ |
| Example C-10 | Ce 1% | Acetylacetonate | Acetylacetone | Oxygen | 4.99 | 1520 | $1.58 \times 10^{-7}$ | $1.96 \times 10^{-7}$ |
| Example C-11 | Ce 3% | 2-ethyl hexanoate | Acetylacetone | Oxygen | 4.35 | 1330 | $1.81 \times 10^{-7}$ | $2.26 \times 10^{-7}$ |
| Example C-12 | Ce 3% | 2-ethyl butyrate | Acetylacetone | Oxygen | 4.38 | 1340 | $2.03 \times 10^{-7}$ | $2.15 \times 10^{-7}$ |
| Example C-13 | Ce 3% | Ethoxide | Acetylacetone | Oxygen | 4.26 | 1300 | $2.31 \times 10^{-7}$ | $2.06 \times 10^{-7}$ |
| Example C-14 | Ce 3% | n-butoxide | Acetylacetone | Oxygen | 4.52 | 1380 | $2.15 \times 10^{-7}$ | $2.08 \times 10^{-7}$ |
| Example C-15 | Ce 3% | Acetylacetonate | Acetylacetone | Oxygen | 4.35 | 1330 | $2.05 \times 10^{-7}$ | $2.11 \times 10^{-7}$ |
| Example C-16 | Ce 1%, La 1% | 2-ethyl hexanoate | Acetylacetone | Oxygen | 5.12 | 1560 | $1.55 \times 10^{-7}$ | $1.98 \times 10^{-7}$ |
| Example C-17 | Ce 1%, La 1% | Ethoxide | Acetylacetone | Oxygen | 5.17 | 1570 | $1.67 \times 10^{-7}$ | $2.03 \times 10^{-7}$ |
| Comparative Example C-1 | Non dope PZT (110/52/48) | — | Acetylacetone | Oxygen | 5.02 | 1530 | $8.08 \times 10^{-7}$ | $1.00 \times 10^{-5}$ |
| Comparative Example C-2 | La 1% | — | Acetylacetone | Oxygen | 5.27 | 1610 | $2.61 \times 10^{-7}$ | $2.17 \times 10^{-6}$ |

TABLE 8

| | Addition element species/Additive amount (mol %) | Added Ce compound form | Added stabilizer | Baking atmosphere | Capacitance ($\mu F/cm^2$) | Specific permittivity $\epsilon r$ | Leakage current density ($A/cm^2$) at 5 V | Leakage current density ($A/cm^2$) at 20 V |
|---|---|---|---|---|---|---|---|---|
| Example C-18 | Ce 0.5% | 2-ethyl hexanoate | Diethanolamine | Oxygen | 4.88 | 1490 | $2.21 \times 10^{-7}$ | $4.57 \times 10^{-7}$ |
| Example C-19 | Ce 0.5% | 2-ethyl butyrate | Diethanolamine | Oxygen | 4.88 | 1490 | $2.02 \times 10^{-7}$ | $4.35 \times 10^{-7}$ |
| Example C-20 | Ce 0.5% | Ethoxide | Diethanolamine | Oxygen | 4.94 | 1510 | $2.26 \times 10^{-7}$ | $4.12 \times 10^{-7}$ |
| Example C-21 | Ce 0.5% | n-butoxide | Diethanolamine | Oxygen | 4.91 | 1500 | $2.15 \times 10^{-7}$ | $4.33 \times 10^{-7}$ |
| Example C-22 | Ce 0.5% | Acetylacetonate | Diethanolamine | Oxygen | 4.91 | 1500 | $2.08 \times 10^{-7}$ | $4.47 \times 10^{-7}$ |
| Example C-23 | Ce 1% | 2-ethyl hexanoate | Diethanolamine | Oxygen | 5.11 | 1560 | $1.71 \times 10^{-7}$ | $1.80 \times 10^{-7}$ |
| Example C-24 | Ce 1% | 2-ethyl butyrate | Diethanolamine | Oxygen | 5.07 | 1550 | $1.86 \times 10^{-7}$ | $1.92 \times 10^{-7}$ |
| Example C-25 | Ce 1% | Ethoxide | Diethanolamine | Oxygen | 5.07 | 1550 | $1.86 \times 10^{-7}$ | $1.92 \times 10^{-7}$ |
| Example C-26 | Ce 1% | n-butoxide | Diethanolamine | Oxygen | 5.04 | 1540 | $1.81 \times 10^{-7}$ | $2.01 \times 10^{-7}$ |
| Example C-27 | Ce 1% | Acetylacetonate | Diethanolamine | Oxygen | 5.04 | 1540 | $1.78 \times 10^{-7}$ | $1.91 \times 10^{-7}$ |
| Example C-28 | Ce 3% | 2-ethyl hexanoate | Diethanolamine | Oxygen | 4.48 | 1370 | $2.18 \times 10^{-7}$ | $2.03 \times 10^{-7}$ |
| Example C-28 | Ce 3% | 2-ethyl butyrate | Diethanolamine | Oxygen | 4.48 | 1370 | $2.25 \times 10^{-7}$ | $2.06 \times 10^{-7}$ |
| Example C-30 | Ce 3% | Ethoxide | Diethanolamine | Oxygen | 4.52 | 1380 | $2.20 \times 10^{-7}$ | $2.12 \times 10^{-7}$ |
| Example C-31 | Ce 3% | n-butoxide | Diethanolamine | Oxygen | 4.45 | 1360 | $2.13 \times 10^{-7}$ | $2.15 \times 10^{-7}$ |
| Example C-32 | Ce 3% | Acetylacetonate | Diethanolamine | Oxygen | 4.45 | 1360 | $2.05 \times 10^{-7}$ | $2.18 \times 10^{-7}$ |
| Example C-33 | Ce 1%, La 1% | 2-ethyl hexanoate | Diethanolamine | Oxygen | 5.14 | 1570 | $1.61 \times 10^{-7}$ | $1.93 \times 10^{-7}$ |
| Example C-34 | Ce 1%, La 1% | Ethoxide | Diethanolamine | Oxygen | 5.14 | 1570 | $1.53 \times 10^{-7}$ | $2.09 \times 10^{-7}$ |
| Comparative Example C-3 | Non dope PZT (110/52/48) | — | Diethanolamine | Oxygen | 4.94 | 1510 | $8.51 \times 10^{-7}$ | $1.04 \times 10^{-5}$ |
| Comparative Example C-4 | La 1% | — | Diethanolamine | Oxygen | 5.20 | 1590 | $2.65 \times 10^{-7}$ | $2.31 \times 10^{-6}$ |

TABLE 9

| | Addition element species/Additive amount (mol %) | Added Ce compound form | Added stabilizer | Baking atmosphere | Capacitance ($\mu F/cm^2$) | Specific permittivity $\epsilon r$ | Leakage current density ($A/cm^2$) at 5 V | Leakage current density ($A/cm^2$) at 20 V |
|---|---|---|---|---|---|---|---|---|
| Example C-35 | Ce 0.5% | 2-ethyl hexanoate | Acetylacetone | Dry air | 4.94 | 1510 | $2.15 \times 10^{-7}$ | $4.72 \times 10^{-7}$ |
| Example C-36 | Ce 0.5% | 2-ethyl butyrate | Acetylacetone | Dry air | 4.88 | 1490 | $2.03 \times 10^{-7}$ | $4.20 \times 10^{-7}$ |

TABLE 9-continued

| | Addition element species/Additive amount (mol %) | Added Ce compound form | Added stabilizer | Baking atmosphere | Capacitance ($\mu$F/cm$^2$) | Specific permittivity $\epsilon$r | Leakage current density (A/cm$^2$) at 5 V | Leakage current density (A/cm$^2$) at 20 V |
|---|---|---|---|---|---|---|---|---|
| Example C-37 | Ce 0.5% | Ethoxide | Acetylacetone | Dry air | 4.84 | 1480 | $2.21 \times 10^{-7}$ | $4.65 \times 10^{-7}$ |
| Example C-38 | Ce 0.5% | n-butoxide | Acetylacetone | Dry air | 4.88 | 1490 | $2.09 \times 10^{-7}$ | $4.50 \times 10^{-7}$ |
| Example C-39 | Ce 0.5% | Acetylacetonate | Acetylacetone | Dry air | 4.88 | 1490 | $2.29 \times 10^{-7}$ | $4.33 \times 10^{-7}$ |
| Example C-40 | Ce 1% | 2-ethyl hexanoate | Acetylacetone | Dry air | 5.07 | 1550 | $1.65 \times 10^{-7}$ | $1.93 \times 10^{-7}$ |
| Example C-41 | Ce 1% | 2-ethyl butyrate | Acetylacetone | Dry air | 5.11 | 1560 | $1.90 \times 10^{-7}$ | $1.85 \times 10^{-7}$ |
| Example C-42 | Ce 1% | Ethoxide | Acetylacetone | Dry air | 5.01 | 1530 | $1.60 \times 10^{-7}$ | $2.00 \times 10^{-7}$ |
| Example C-43 | Ce 1% | n-butoxide | Acetylacetone | Dry air | 5.01 | 1530 | $2.05 \times 10^{-7}$ | $1.80 \times 10^{-7}$ |
| Example C-44 | Ce 1% | Acetylacetonate | Acetylacetone | Dry air | 5.14 | 1570 | $1.83 \times 10^{-7}$ | $1.72 \times 10^{-7}$ |
| Example C-45 | Ce 3% | 2-ethyl hexanoate | Acetylacetone | Dry air | 4.39 | 1340 | $2.13 \times 10^{-7}$ | $2.18 \times 10^{-7}$ |
| Example C-46 | Ce 3% | 2-ethyl butyrate | Acetylacetone | Dry air | 4.48 | 1370 | $2.03 \times 10^{-7}$ | $2.09 \times 10^{-7}$ |
| Example C-47 | Ce 3% | Ethoxide | Acetylacetone | Dry air | 4.42 | 1350 | $1.92 \times 10^{-7}$ | $2.03 \times 10^{-7}$ |
| Example C-48 | Ce 3% | n-butoxide | Acetylacetone | Dry air | 4.42 | 1350 | $1.95 \times 10^{-7}$ | $1.98 \times 10^{-7}$ |
| Example C-49 | Ce 3% | Acetylacetonate | Acetylacetone | Dry air | 4.39 | 1340 | $1.98 \times 10^{-7}$ | $2.01 \times 10^{-7}$ |
| Example C-50 | Ce 1%, La 1% | 2-ethyl hexanoate | Acetylacetone | Dry air | 5.07 | 1550 | $1.63 \times 10^{-7}$ | $2.05 \times 10^{-7}$ |
| Example C-51 | Ce 1%, La 1% | Ethoxide | Acetylacetone | Dry air | 5.07 | 1550 | $1.81 \times 10^{-7}$ | $1.98 \times 10^{-7}$ |
| Comparative Example C-5 | Non dope PZT (110/52/48) | — | Acetylacetone | Dry air | 4.94 | 1510 | $8.31 \times 10^{-7}$ | $1.07 \times 10^{-5}$ |
| Comparative Example C-6 | La 1% | — | Acetylacetone | Dry air | 5.17 | 1580 | $2.73 \times 10^{-7}$ | $2.26 \times 10^{-6}$ |

As can be seen from Tables 7 to 9, the ferroelectric thin films of Examples C-1 to C-51 with an addition of Ce exhibited a lower leakage current density at a thin film thickness of about 270 nm, as compared to the PZT ferroelectric thin films of Comparative Examples C-1 to C-6 with no addition of Ce.

In addition, from the comparison with the PLZT ferroelectric thin films of Comparative Examples C-2, C-4, and C-6 with an addition of La, all exhibited a decrease in leakage current density, upon application of 5 V and 20 V.

With regard to capacitance and specific permittivity, upon comparison with the ferroelectric thin films of Comparative Examples C-1 to C-6, the ferroelectric thin films of Examples C-1 to C-51 also exhibited some cases of slight low values which are generally, however, not inferior results. It can be said that the resulting numerical values are in no way inferior to those of conventionally known ferroelectric thin films.

However, when the ferroelectric thin films of Examples C-1 to B-51 are configured to have a leakage current density equivalent to that of the ferroelectric thin films of Comparative Examples C-1 to C-6, there are advantages in that the thickness of the film can be further reduced, and a higher specific permittivity can be obtained due to thickness reduction of the film.

From these results, the ferroelectric thin films of Examples C-1 to C-51 are excellent in reduction of a leakage current density without a decrease in specific permittivity, and can achieve a high capacity density from the viewpoint of being capable of realizing thickness reduction of the film.

The ferroelectric thin films prepared in Examples C-1 to C-51 exhibit excellent basic characteristics as a capacitor, and can be used for a capacitor with a high density and a high dielectric breakdown voltage.

Hereinafter, Examples D-1 to D-75 of the present invention in conjunction with Comparative Examples D-1 to D-3 will be described in more detail.

Examples D-1 to D-5

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various bismuth compounds (bismuth 2-ethyl hexanoate, bismuth 2-ethyl butyrate, bismuth triisopropoxide, bismuth tri-t-pentoxide, tetra (methyl heptanedionate) bismuth) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples D-6 to D-10

Ferroelectric thin films were formed on substrates in the same manner as in Examples D-1 to D-5, except that 1.0 mol % (in outer percent) of various bismuth compounds was added to the sol-gel liquids to prepare thin film-forming solutions.

Examples D-11 to D-15

Ferroelectric thin films were formed on substrates in the same manner as in Examples D-1 to D-5, except that 3.0 mol % (in outer percent) of various bismuth compounds was added to the sol-gel liquids to prepare thin film-forming solutions.

Examples D-16 to D-20

Ferroelectric thin films were formed on substrates in the same manner as in Examples D-1 to D-5, except that 5.0 mol % (in outer percent) of various bismuth compounds was added to the sol-gel liquids to prepare thin film-forming solutions.

Examples D-21 to D-25

Ferroelectric thin films were formed on substrates in the same manner as in Examples D-1 to D-5, except that 10.0 mol % (in outer percent) of various bismuth compounds was added to the sol-gel liquids to prepare thin film-forming solutions.

Comparative Example D-1

A ferroelectric thin film was formed on a substrate in the same manner as in Examples D-1 to D-5, except that a thin film-forming solution was prepared with no addition of bismuth compounds to the sol-gel liquid of Example D-1.

Examples D-26 to D-30

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various bismuth compounds (bismuth 2-ethyl hexanoate, bismuth 2-ethyl butyrate, bismuth triisopropoxide, bismuth tri-t-pentoxide, tetra (methyl heptanedionate) bismuth) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples D-31 to D-35

Ferroelectric thin films were formed on substrates in the same manner as in Examples D-26 to D-30, except that 1.0 mol % (in outer percent) of various bismuth compounds was added to the sol-gel liquids to prepare thin film-forming solutions.

Examples D-36 to D-40

Ferroelectric thin films were formed on substrates in the same manner as in Examples D-26 to D-30, except that 3.0 mol % (in outer percent) of various bismuth compounds was added to the sol-gel liquids to prepare thin film-forming solutions.

Examples D-41 to D-45

Ferroelectric thin films were formed on substrates in the same manner as in Examples D-26 to D-30, except that 5.0 mol % (in outer percent) of various bismuth compounds was added to the sol-gel liquids to prepare thin film-forming solutions.

Examples D-46 to D-50

Ferroelectric thin films were formed on substrates in the same manner as in Examples D-26 to D-30, except that 10.0 mol % (in outer percent) of various bismuth compounds was added to the sol-gel liquids to prepare thin film-forming solutions.

Comparative Example D-2

A ferroelectric thin film was formed on a substrate in the same manner as in Examples D-26 to D-30, except that a thin film-forming solution was prepared with no addition of bismuth compounds to the sol-gel liquid of Example D-26.

Examples D-51 to D-55

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various bismuth compounds (bismuth 2-ethyl hexanoate, bismuth 2-ethyl butyrate, bismuth triisopropoxide, bismuth tri-t-pentoxide, tetra (methyl heptanedionate) bismuth) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a dry air atmosphere at 700° C. for 1 minute, thereby forming a ferroelectric thin film having a film thickness of 270 nm.

Examples D-56 to D-60

Ferroelectric thin films were formed on substrates in the same manner as in Examples D-51 to D-55, except that 1.0 mol % (in outer percent) of various bismuth compounds was added to the sol-gel liquids to prepare thin film-forming solutions.

Examples D-61 to D-65

Ferroelectric thin films were formed on substrates in the same manner as in Examples D-51 to D-55, except that 3.0 mol % (in outer percent) of various bismuth compounds was added to the sol-gel liquids to prepare thin film-forming solutions.

Examples D-66 to D-70

Ferroelectric thin films were formed on substrates in the same manner as in Examples D-51 to D-55, except that 5.0 mol % (in outer percent) of various bismuth compounds was added to the sol-gel liquids to prepare thin film-forming solutions.

Examples D-71 to D-75

Ferroelectric thin films were formed on substrates in the same manner as in Examples D-51 to D-55, except that 10.0 mol % (in outer percent) of various bismuth compounds was added to the sol-gel liquids to prepare thin film-forming solutions.

Comparative Example D-3

A ferroelectric thin film was formed on a substrate in the same manner as in Examples D-51 to D-55, except that a thin film-forming solution was prepared with no addition of bismuth compounds to the sol-gel liquid of Example D-51.

<Comparative Evaluation>

For a substrate on which each of the ferroelectric thin films prepared in Examples D-1 to D-75 and Comparative Examples D-1 to D-3 was formed, a Pt upper electrode of about 250 μm☐ was fabricated on the surface of the substrate by a sputtering method using a metal mask, and C-V characteristics (voltage dependence of capacitance) were evaluated at a frequency of 1 kHz and at a voltage of −5 to 5 V, between Pt lower electrodes immediately under the ferroelectric thin film. The specific permittivity ∈r was calculated from the maximum value of capacitance. The measurement of C-V characteristics was carried out using a 4284A precision LCR meter (manufactured by HP) under the conditions of a bias step 0.1 of V, a frequency of 1 kHz, an oscillation level of 30 mV, a delay time of 0.2 sec, a temperature of 23° C., and a hygrometry of 50±10%. The results obtained are given in Tables 10 to 12 below.

TABLE 10

| | Addition element species/Additive amount (mol %) | Added Bi compound form | Added stabilizer | Baking atmosphere | Capacitance (μF/cm$^2$) | Specific permittivity ∈r |
|---|---|---|---|---|---|---|
| Example D-1 | Bi 0.5% | 2-ethyl hexanoate | Acetylacetone | Oxygen | 5.24 | 1590 |
| Example D-2 | Bi 0.5% | 2-ethyl butyrate | Acetylacetone | Oxygen | 5.17 | 1570 |
| Example D-3 | Bi 0.5% | Isopropoxide | Acetylacetone | Oxygen | 5.21 | 1580 |
| Example D-4 | Bi 0.5% | t-pentoxide | Acetylacetone | Oxygen | 5.21 | 1580 |
| Example D-5 | Bi 0.5% | Tetramethyl heptanedionate | Acetylacetone | Oxygen | 5.21 | 1580 |
| Example D-6 | Bi 1% | 2-ethyl hexanoate | Acetylacetone | Oxygen | 5.22 | 1580 |
| Example D-7 | Bi 1% | 2-ethyl butyrate | Acetylacetone | Oxygen | 5.27 | 1600 |
| Example D-8 | Bi 1% | Isopropoxide | Acetylacetone | Oxygen | 5.21 | 1580 |
| Example D-9 | Bi 1% | t-pentoxide | Acetylacetone | Oxygen | 5.24 | 1590 |
| Example D-10 | Bi 1% | Tetramethyl heptanedionate | Acetylacetone | Oxygen | 5.24 | 1590 |
| Example D-11 | Bi 3% | 2-ethyl hexanoate | Acetylacetone | Oxygen | 5.84 | 1780 |
| Example D-12 | Bi 3% | 2-ethyl butyrate | Acetylacetone | Oxygen | 5.93 | 1800 |
| Example D-13 | Bi 3% | Isopropoxide | Acetylacetone | Oxygen | 5.93 | 1800 |
| Example D-14 | Bi 3% | t-pentoxide | Acetylacetone | Oxygen | 5.90 | 1790 |
| Example D-15 | Bi 3% | Tetramethyl heptanedionate | Acetylacetone | Oxygen | 5.87 | 1780 |
| Example D-16 | Bi 5% | 2-ethyl hexanoate | Acetylacetone | Oxygen | 6.20 | 1880 |
| Example D-17 | Bi 5% | 2-ethyl butyrate | Acetylacetone | Oxygen | 6.20 | 1880 |
| Example D-18 | Bi 5% | Isopropoxide | Acetylacetone | Oxygen | 6.16 | 1870 |
| Example D-19 | Bi 5% | t-pentoxide | Acetylacetone | Oxygen | 6.20 | 1880 |
| Example D-20 | Bi 5% | Tetramethyl heptanedionate | Acetylacetone | Oxygen | 6.20 | 1880 |
| Example D-21 | Bi 10% | 2-ethyl hexanoate | Acetylacetone | Oxygen | 5.77 | 1750 |
| Example D-22 | Bi 10% | 2-ethyl butyrate | Acetylacetone | Oxygen | 5.77 | 1750 |
| Example D-23 | Bi 10% | Isopropoxide | Acetylacetone | Oxygen | 5.80 | 1760 |
| Example D-24 | Bi 10% | t-pentoxide | Acetylacetone | Oxygen | 5.80 | 1760 |
| Example D-25 | Bi 10% | Tetramethyl heptanedionate | Acetylacetone | Oxygen | 5.83 | 1770 |

TABLE 10-continued

|  | Addition element species/Additive amount (mol %) | Added Bi compound form | Added stabilizer | Baking atmosphere | Capacitance (μF/cm²) | Specific permittivity εr |
|---|---|---|---|---|---|---|
| Comparative Example D-1 | Non dope PZT (110/52/48) | — | Acetylacetone | Oxygen | 5.07 | 1540 |

TABLE 11

|  | Addition element species/Additive amount (mol %) | Added Bi compound form | Added stabilizer | Baking atmosphere | Capacitance (μF/cm²) | Specific permittivity εr |
|---|---|---|---|---|---|---|
| Example D-26 | Bi 0.5% | 2-ethyl hexanoate | Diethanolamine | Oxygen | 5.17 | 1570 |
| Example D-27 | Bi 0.5% | 2-ethyl butyrate | Diethanolamine | Oxygen | 5.14 | 1560 |
| Example D-28 | Bi 0.5% | Isopropoxide | Diethanolamine | Oxygen | 5.17 | 1570 |
| Example D-29 | Bi 0.5% | t-pentoxide | Diethanolamine | Oxygen | 5.20 | 1580 |
| Example D-30 | Bi 0.5% | Tetramethyl heptanedionate | Diethanolamine | Oxygen | 5.20 | 1580 |
| Example D-31 | Bi 1% | 2-ethyl hexanoate | Diethanolamine | Oxygen | 5.27 | 1600 |
| Example D-32 | Bi 1% | 2-ethyl butyrate | Diethanolamine | Oxygen | 5.27 | 1600 |
| Example D-33 | Bi 1% | Isopropoxide | Diethanolamine | Oxygen | 5.23 | 1590 |
| Example D-34 | Bi 1% | t-pentoxide | Diethanolamine | Oxygen | 5.23 | 1590 |
| Example D-35 | Bi 1% | Tetramethyl heptanedionate | Diethanolamine | Oxygen | 5.23 | 1590 |
| Example D-36 | Bi 3% | 2-ethyl hexanoate | Diethanolamine | Oxygen | 5.93 | 1800 |
| Example D-37 | Bi 3% | 2-ethyl butyrate | Diethanolamine | Oxygen | 5.93 | 1800 |
| Example D-38 | Bi 3% | Isopropoxide | Diethanolamine | Oxygen | 5.89 | 1790 |
| Example D-39 | Bi 3% | t-pentoxide | Diethanolamine | Oxygen | 5.93 | 1800 |
| Example D-40 | Bi 3% | Tetramethyl heptanedionate | Diethanolamine | Oxygen | 5.89 | 1790 |
| Example D-41 | Bi 5% | 2-ethyl hexanoate | Diethanolamine | Oxygen | 6.26 | 1900 |
| Example D-42 | Bi 5% | 2-ethyl butyrate | Diethanolamine | Oxygen | 6.22 | 1890 |
| Example D-43 | Bi 5% | Isopropoxide | Diethanolamine | Oxygen | 6.26 | 1900 |
| Example D-44 | Bi 5% | t-pentoxide | Diethanolamine | Oxygen | 6.29 | 1910 |
| Example D-45 | Bi 5% | Tetramethyl heptanedionate | Diethanolamine | Oxygen | 6.19 | 1880 |
| Example D-46 | Bi 10% | 2-ethyl hexanoate | Diethanolamine | Oxygen | 5.79 | 1760 |
| Example D-47 | Bi 10% | 2-ethyl butyrate | Diethanolamine | Oxygen | 5.79 | 1760 |
| Example D-48 | Bi 10% | Isopropoxide | Diethanolamine | Oxygen | 5.76 | 1750 |
| Example D-49 | Bi 10% | t-pentoxide | Diethanolamine | Oxygen | 5.83 | 1770 |
| Example D-50 | Bi 10% | Tetramethyl heptanedionate | Diethanolamine | Oxygen | 5.83 | 1770 |
| Comparative Example D-2 | Non dope PZT (110/52/48) | — | Diethanolamine | Oxygen | 5.04 | 1530 |

TABLE 12

|  | Addition element species/Additive amount (mol %) | Added Bi compound form | Added stabilizer | Baking atmosphere | Capacitance (μF/cm²) | Specific permittivity εr |
|---|---|---|---|---|---|---|
| Example D-51 | Bi 0.5% | 2-ethyl hexanoate | m Acetylacetone | Dry air | 5.20 | 1580 |
| Example D-52 | Bi 0.5% | 2-ethyl butyrate | Acetylacetone | Dry air | 5.20 | 1580 |
| Example D-53 | Bi 0.5% | Isopropoxide | Acetylacetone | Dry air | 5.23 | 1590 |
| Example D-54 | Bi 0.5% | t-pentoxide | Acetylacetone | Dry air | 5.17 | 1570 |
| Example D-55 | Bi 0.5% | Tetramethyl heptanedionate | Acetylacetone | Dry air | 5.23 | 1590 |
| Example D-56 | Bi 1% | 2-ethyl hexanoate | Acetylacetone | Dry air | 5.23 | 1590 |
| Example D-57 | Bi 1% | 2-ethyl butyrate | Acetylacetone | Dry air | 5.30 | 1610 |
| Example D-58 | Bi 1% | Isopropoxide | Acetylacetone | Dry air | 5.30 | 1610 |
| Example D-59 | Bi 1% | t-pentoxide | Acetylacetone | Dry air | 5.23 | 1590 |
| Example D-60 | Bi 1% | Tetramethyl heptanedionate | Acetylacetone | Dry air | 5.27 | 1600 |
| Example D-61 | Bi 3% | 2-ethyl hexanoate | Acetylacetone | Dry air | 5.96 | 1810 |
| Example D-62 | Bi 3% | 2-ethyl butyrate | Acetylacetone | Dry air | 5.89 | 1790 |
| Example D-63 | Bi 3% | Isopropoxide | Acetylacetone | Dry air | 5.96 | 1810 |
| Example D-64 | Bi 3% | t-pentoxide | Acetylacetone | Dry air | 5.89 | 1790 |
| Example D-65 | Bi 3% | Tetramethyl heptanedionate | Acetylacetone | Dry air | 5.89 | 1790 |
| Example D-66 | Bi 5% | 2-ethyl hexanoate | Acetylacetone | Dry air | 6.22 | 1890 |
| Example D-67 | Bi 5% | 2-ethyl butyrate | Acetylacetone | Dry air | 6.22 | 1890 |
| Example D-68 | Bi 5% | Isopropoxide | Acetylacetone | Dry air | 6.16 | 1870 |

TABLE 12-continued

|  | Addition element species/Additive amount (mol %) | Added Bi compound form | Added stabilizer | Baking atmosphere | Capacitance (µF/cm$^2$) | Specific permittivity ∈r |
|---|---|---|---|---|---|---|
| Example D-69 | Bi 5% | t-pentoxide | Acetylacetone | Dry air | 6.16 | 1870 |
| Example D-70 | Bi 5% | Tetramethyl heptanedionate | Acetylacetone | Dry air | 6.22 | 1890 |
| Example D-71 | Bi 10% | 2-ethyl hexanoate | Acetylacetone | Dry air | 5.79 | 1760 |
| Example D-72 | Bi 10% | 2-ethyl butyrate | Acetylacetone | Dry air | 5.76 | 1750 |
| Example D-73 | Bi 10% | Isopropoxide | Acetylacetone | Dry air | 5.83 | 1770 |
| Example D-74 | Bi 10% | t-pentoxide | Acetylacetone | Dry air | 5.76 | 1750 |
| Example D-75 | Bi 10% | Tetramethyl heptanedionate | Acetylacetone | Dry air | 5.83 | 1770 |
| Comparative Example D-3 | Non dope PZT (110/52/48) | — | Acetylacetone | Dry air | 5.03 | 1530 |

As can be seen from Tables 10 to 12, as compared to the PZT ferroelectric thin films of Comparative Examples D-1 to D-3 with no addition of Bi, the ferroelectric thin films of Examples D-1 to D-75 with an addition of Bi at a concentration of 0.5% to 10% exhibited a high capacitance and a high specific permittivity at a thin film thickness of about 270 nm. From these results, it can be seen that the ferroelectric thin films of Examples D-1 to D-75 exhibit excellent basic characteristics as a capacitor.

In addition, according to the results of the ferroelectric thin films of Examples D-1 to D-75 with varying additive amounts of Bi, particularly Examples D-16 to D-20, D-41 to D-45, and D-66 to D-70 with a 5% addition of Bi exhibited high numerical results in terms of capacitance and specific permittivity, followed by in the order of: Examples D-11 to D-15, D-36 to D-40, and D-61 to D-65 with a 3% addition of Bi; Examples D-21 to D-25, D-46 to D-50, and D-71 to D-75 with a 10% addition of Bi; Examples D-6 to D-10, D-31 to D-35, and D-56 to D-60 with a 1% addition of Bi; and Examples D-1 to D-5, D-26 to D-30, and D-51 to D-55 with a 0.5% addition of Bi.

From these results, it was demonstrated that there is an appropriate range of the Bi additive amount capable of contributing to improvements of the capacitance and specific permittivity ∈r.

The ferroelectric thin films prepared in Examples D-1 to D-75 exhibit excellent basic characteristics as a capacitor, and can be used for a thin film capacitor with a high capacity density.

[Group 2]

Hereinafter, Examples E-1 to E-27 of the present invention in conjunction with Comparative Examples E-1 to E-8 will be described in more detail.

The following Examples E-1 to E-27 and Comparative Examples E-1 to E-8 were carried out using the raw materials below.

Pb compound: lead acetate trihydrate
La compound: lanthanum acetate 1.5 hydrate
Zr compound: zirconium tetra-t-butoxide
Ti compound: titanium tetraisopropoxide
Sn compound: tin acetate, tin octylate, tin acetate, tin tetra-n-butoxide, tin ethoxide Examples E-1 to E-27 and Comparative Examples E-1 to E-8

An organometallic compound (Pb, La, Sn compound, etc.) in the form of an organic acid salt and nitrate was dissolved in sufficiently dehydrated 2-methoxy ethanol as an organic solvent, and water of crystallization was removed by azeotropic distillation. Then, an organometallic compound or organic compound (Zr, Ti, Sn compound, etc.) in the form of an alkoxide was added and dissolved in the resulting solution. For the purpose of solution stabilization, a 2-fold mol of acetylacetone or diethanolamine was added relative to the metal alkoxide. Each element was added to PZT according to the addition element species and additive amount as given in Table 13 or 14 below, thereby preparing a solution for the formation of a thin film such that the total concentration of organometallic compounds in terms of the metal oxides was about 10% by weight.

Using each solution, a thin film was formed by a CSD method, according to the following procedure.

That is, each solution was applied by a spin coating method at 500 rpm for 3 seconds and then at 3000 rpm for 15 seconds to a 6 inch silicon substrate where a Pt thin film was sputtered on the surface thereof.

Then, pre-baking was carried out by heating the substrate on a hot plate at 350° C. for 10 minutes. After the application and pre-baking processes were repeated 6 times, the substrate was subjected to baking in a rapid thermal annealer (RTA) under a 100% oxygen atmosphere or dry air atmosphere at 700° C. for 1 minute, thereby forming a ferroelectric thin film having a film thickness of 300 nm.

Figure 12:
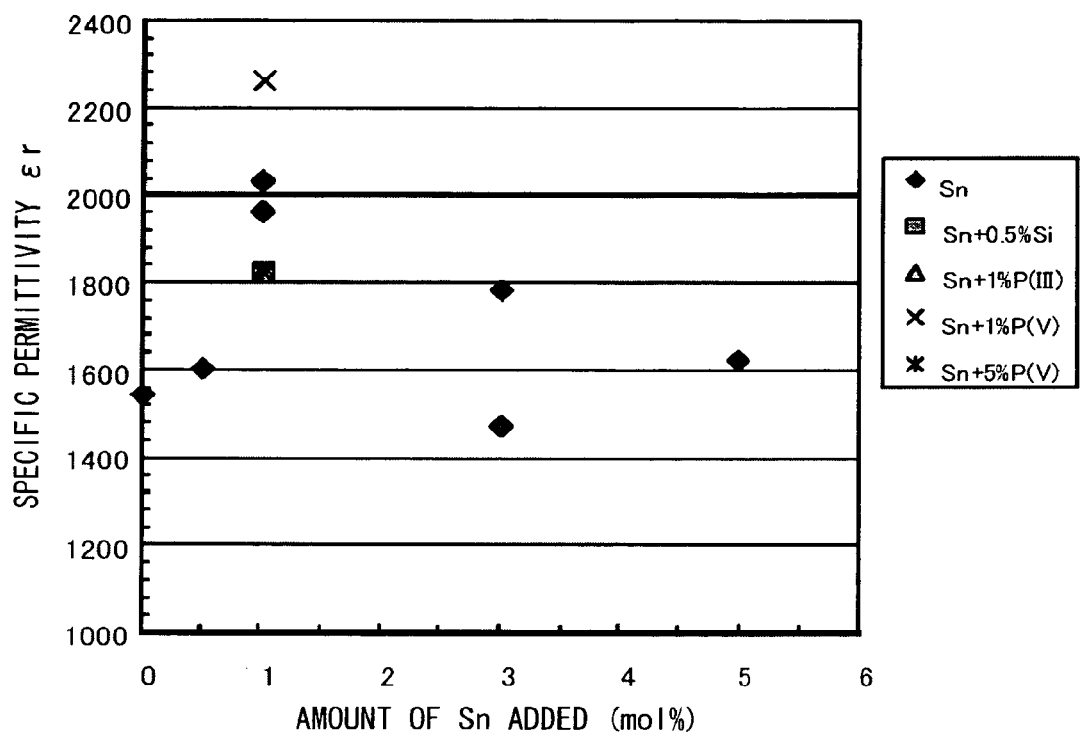
FIG. 12 is a view showing the relationship between the specific permittivity r and the Sn additive amount in Example E-1 to Example E-8, and Comparative Example E-1.
Figure 13:
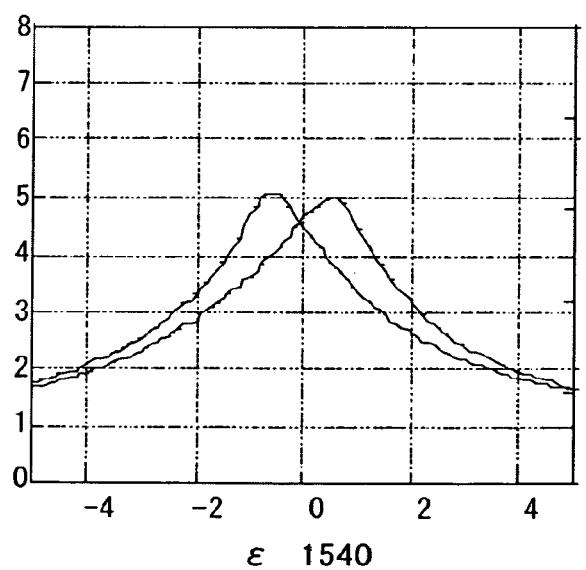
FIG. 13 is a view showing a C-V curve in Comparative Example E-1.
Figure 14:
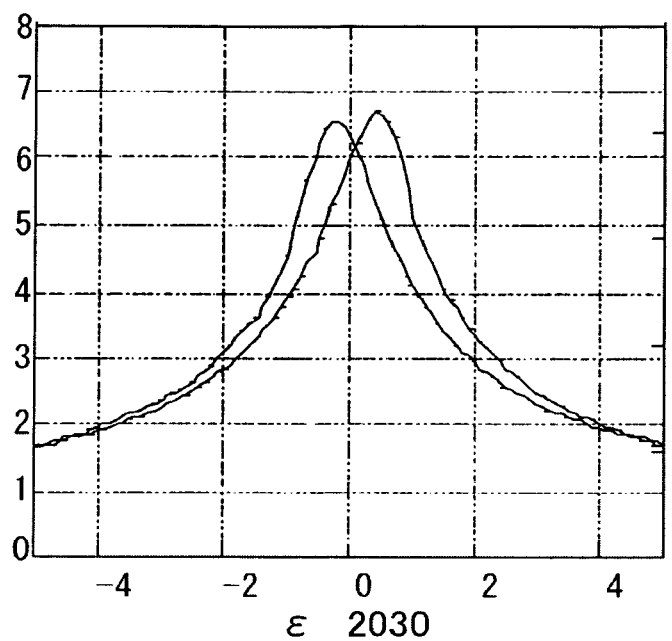
FIG. 14 is a view showing a C-V curve in Example E-2.
Figure 15:
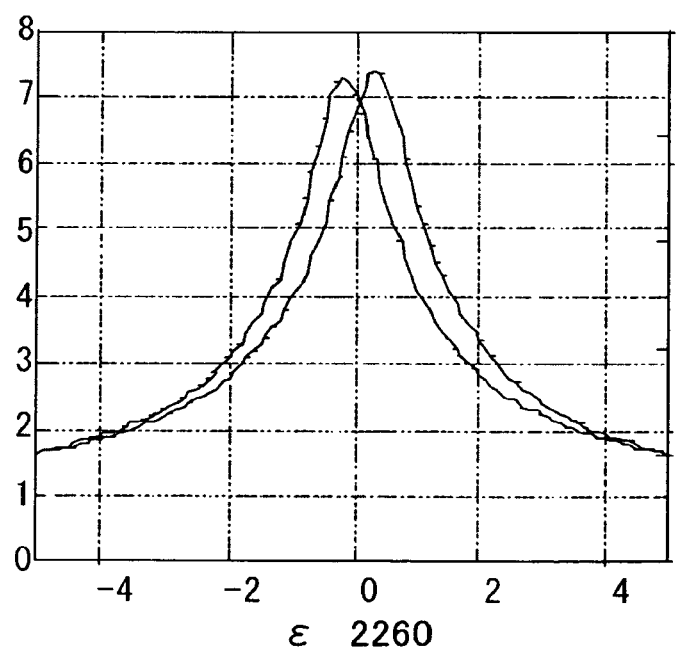
FIG. 15 is a view showing a C-V curve in Example E-7.

Next, a Pt upper electrode of about 250 µm☐ was fabricated on the surface of the substrate by a sputtering method using a metal mask, and C-V characteristics (voltage dependence of capacitance) were evaluated at a frequency of 1 kHz and at a voltage of −5 to 5 V, between Pt lower electrodes immediately under the ferroelectric thin film. The specific permittivity ∈r was calculated from the maximum value of capacitance. The measurement of C-V characteristics was carried out using a 4284A precision LCR meter (manufactured by HP) under the conditions of a bias step of 0.1 V, a frequency of 1 kHz, an oscillation level of 30 mV, a delay time of 0.2 sec, a temperature of 23° C., and a hygrometry of 50±10%. The results obtained are given in Tables 13 and 14 below, and FIG. 12. In addition, C-V curve diagrams of Examples E-2 and E-7 and Comparative Example E-1 are given in FIGS. 13 to 15, respectively.

TABLE 13

Figure 2:
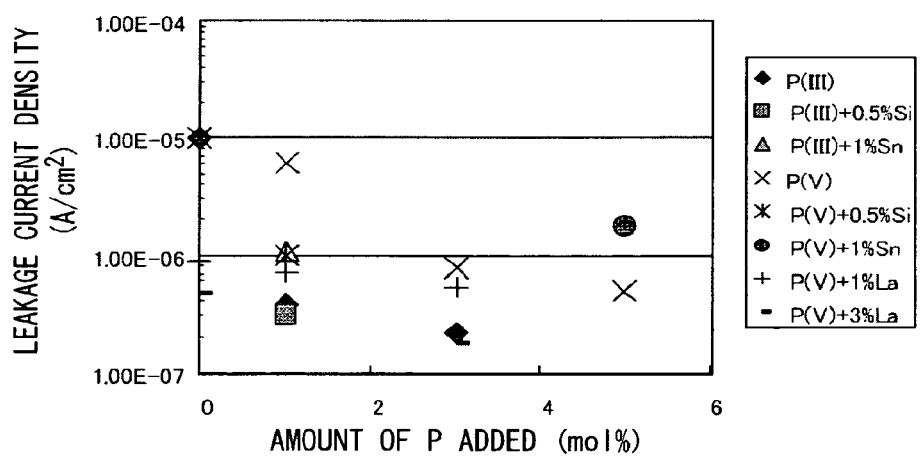
FIG. 2 is a view showing the relationship between the leakage current density and the P (phosphorus) additive amount, upon application of 20 V in Example A-1 to Example A-29, and Comparative Example A-1 to Comparative Example A-8.
Figure 3:
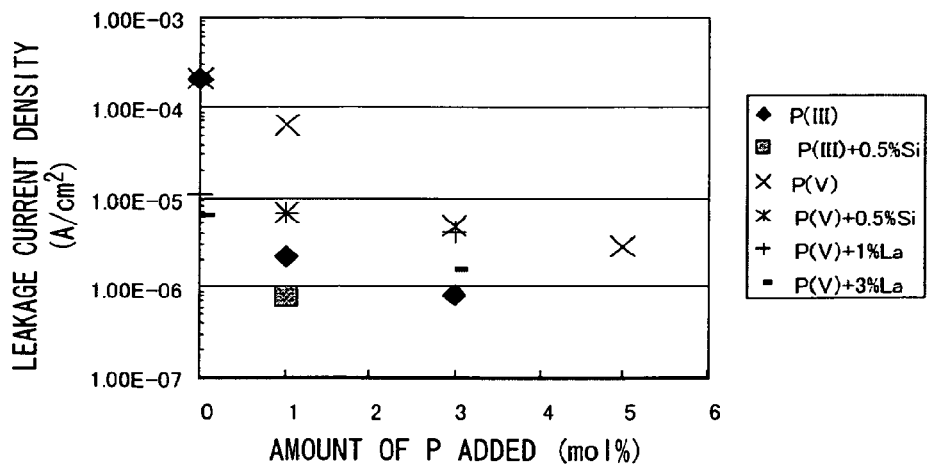
FIG. 3 is a view showing the relationship between the leakage current density and the P (phosphorus) additive amount, upon application of 50 V in Example A-1 to Example A-29, and Comparative Example A-1 to Comparative Example A-8.
Figure 4:
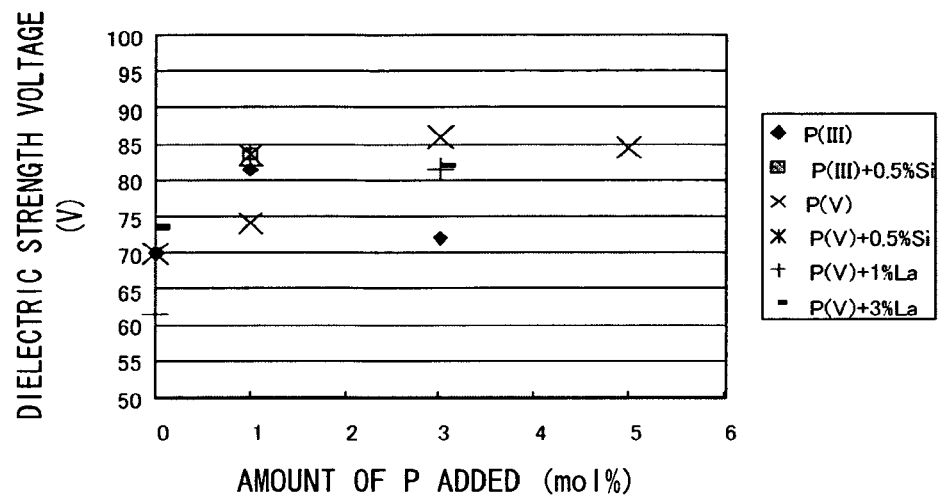
FIG. 4 is a view showing the relationship between the dielectric strength voltage and the P (phosphorus) additive amount, in Example A-1 to Example A-29, and Comparative Example A-1 to Comparative Example A-8.
Figure 5:
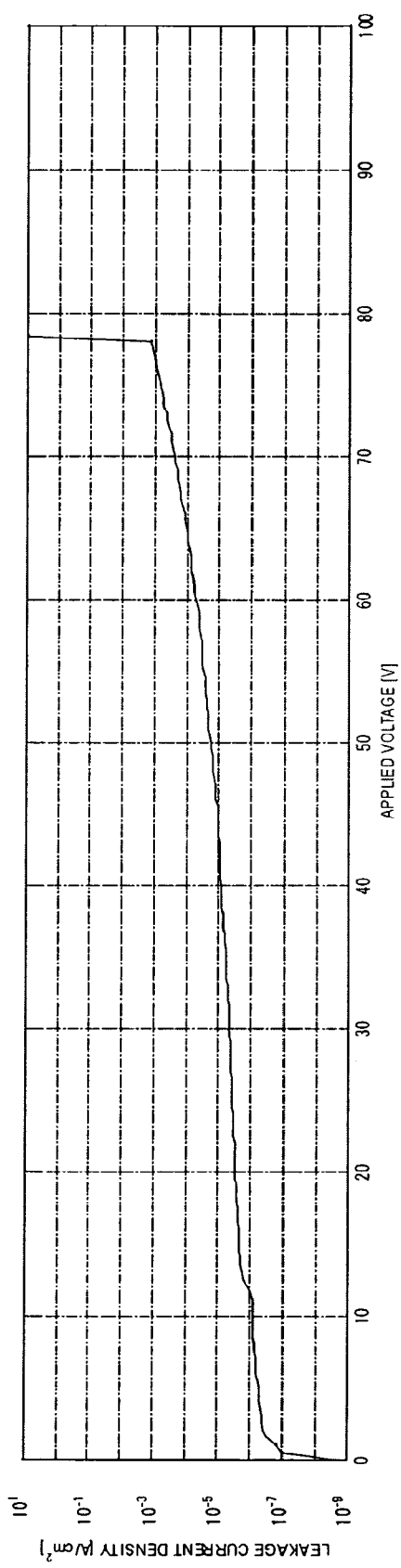
FIG. 5 is an I-V characteristic diagram of a thin film obtained in Example B-3.
Figure 6:
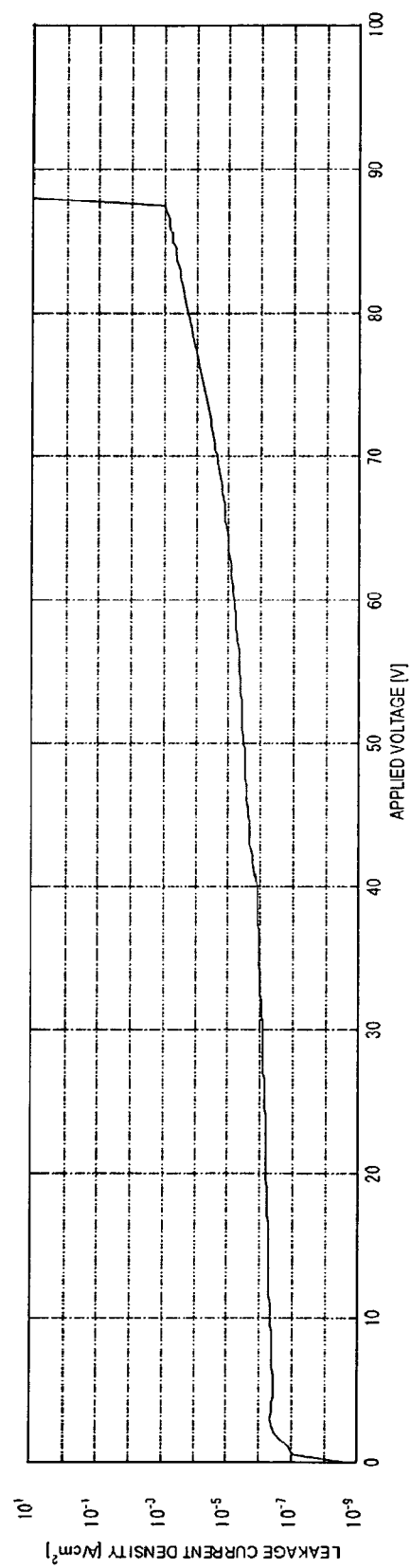
FIG. 6 is an I-V characteristic diagram of a thin film obtained in Example B-8.
Figure 7:
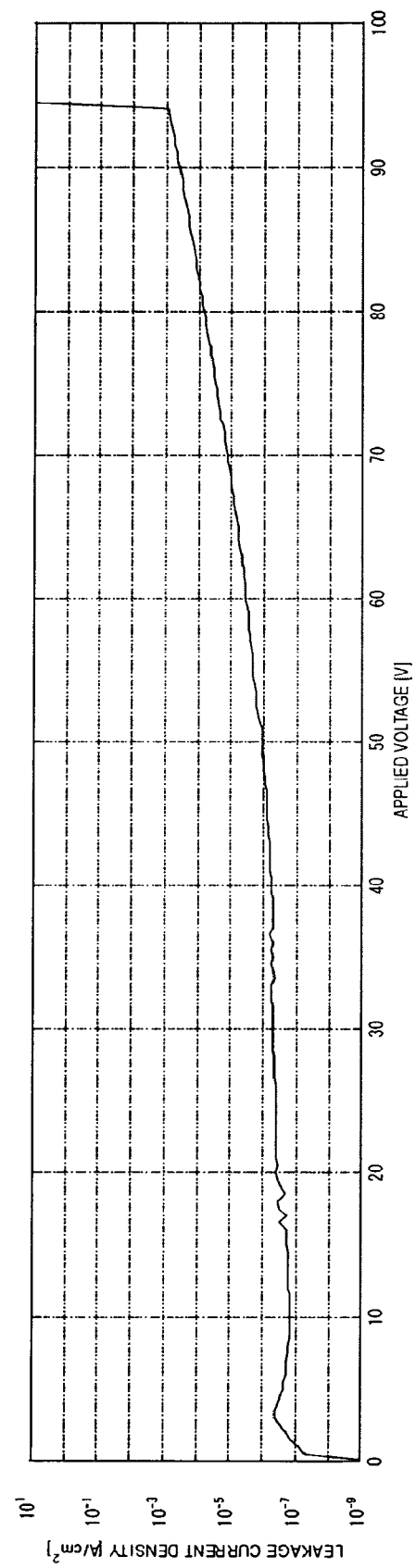
FIG. 7 is an I-V characteristic diagram of a thin film obtained in Example B-13.
Figure 8:
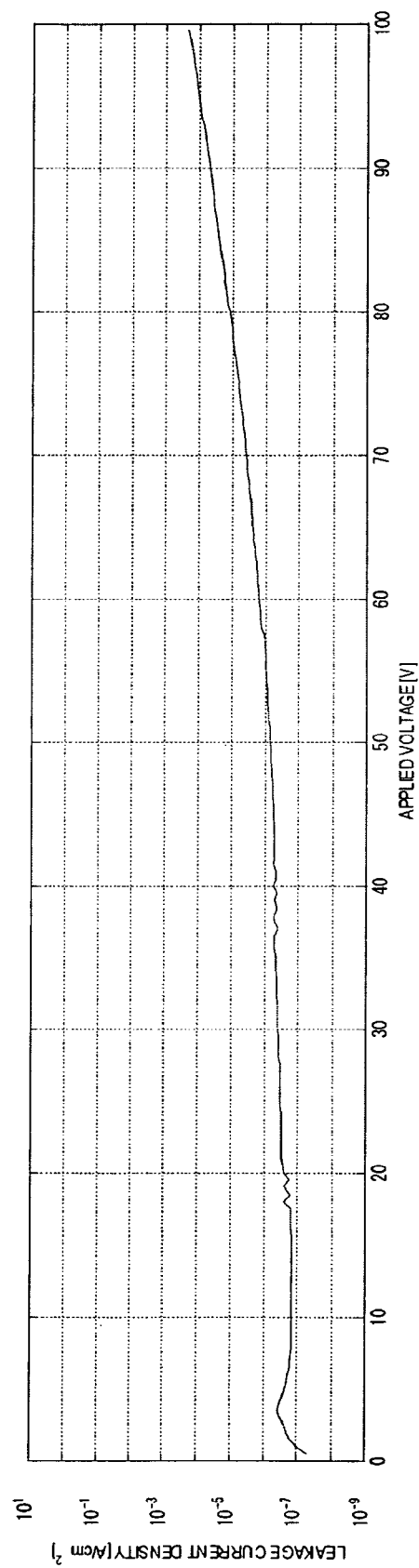
FIG. 8 is an I-V characteristic diagram of a thin film obtained in Example B-18.
Figure 9:
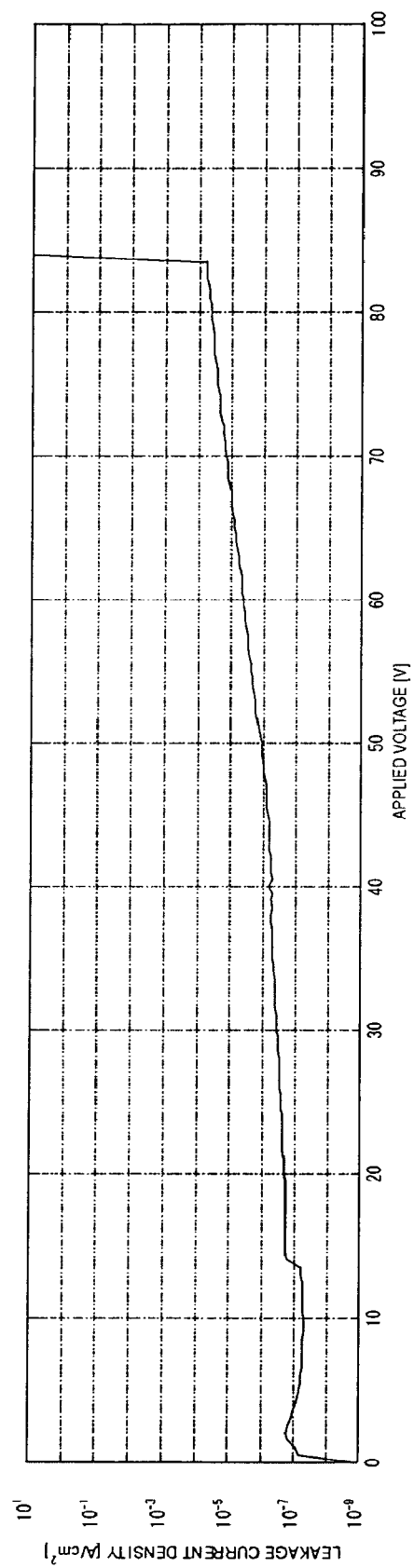
FIG. 9 is an I-V characteristic diagram of a thin film obtained in Example B-23.
Figure 10:
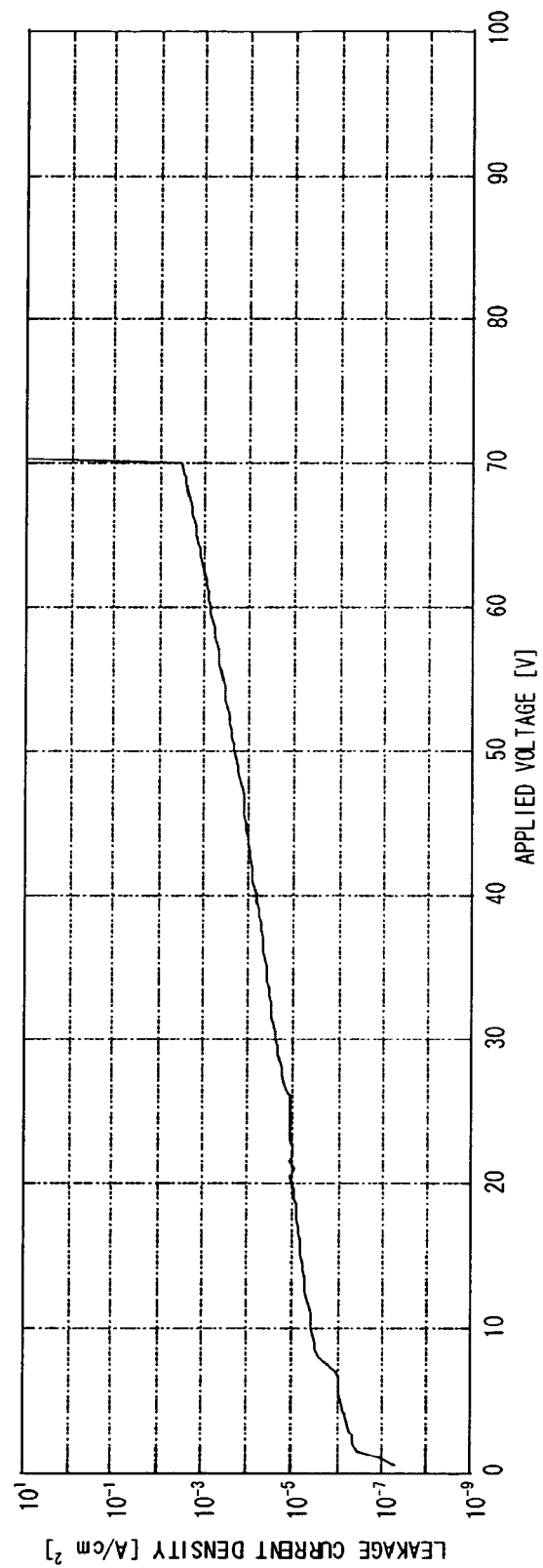
FIG. 10 is an I-V characteristic diagram of a thin film obtained in Comparative Example B-1.
Figure 11:
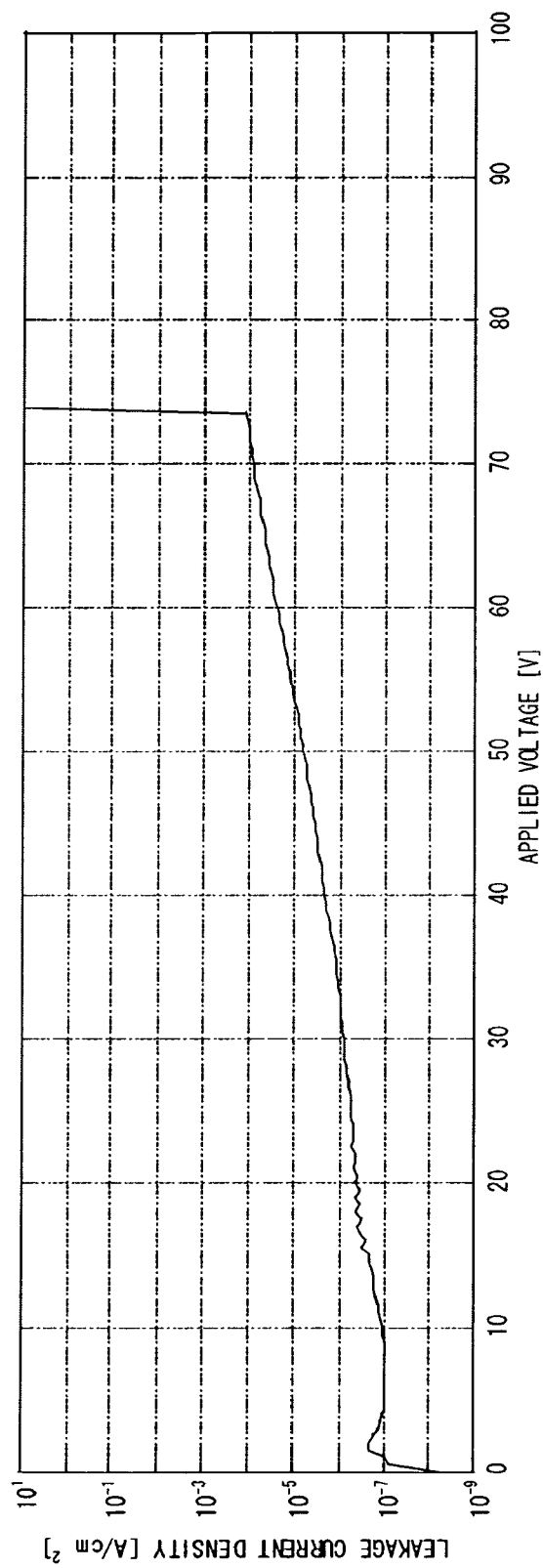
FIG. 11 is an I-V characteristic diagram of a thin film obtained in Comparative Example B-2.

| | Addition element species/Additive amount (mol %) | Added Sn compound form | Added stabilizer | Baking atmosphere | Specific permittivity $\epsilon r$ | C-V curve |
|---|---|---|---|---|---|---|
| Example E-1 | Sn 0.5% | Tin octylate | Acetylacetone | Oxygen | 1600 | — |
| Example E-2 | Sn 1% | Tin tetra-n-butoxide | Acetylacetone | Oxygen | 2030 | FIG. 3 |
| Example E-3 | Sn 3% | Tin tetra-n-butoxide | Acetylacetone | Oxygen | 1780 | — |
| Example E-4 | Sn 5% | Tin octylate | Acetylacetone | Oxygen | 1620 | — |
| Example E-5 | Sn 1%, Si 0.5% | Tin acetate | Acetylacetone | Oxygen | 1820 | — |
| Example E-6 | Sn 1%, P(III) 1% | Tin octylate | Acetylacetone | Oxygen | 1820 | — |
| Example E-7 | Sn 1%, P (V) 1% | Tin nitrate | Acetylacetone | Oxygen | 2260 | FIG. 4 |
| Example E-8 | Sn 1%, P(V) 5% | Tin ethoxide | Acetylacetone | Oxygen | 1820 | — |
| Example E-9 | Sn 1% | Tin 2-ethyl butyrate | Acetylacetone | Oxygen | 1900 | — |
| Comparative Example E-1 | Non dope PZT (110/52/48) | — | Acetylacetone | Oxygen | 1540 | FIG. 2 |
| Comparative Example E-2 | La 3% | — | Acetylacetone | Oxygen | 1550 | — |
| Comparative Example E-3 | Si 0.5% | — | Acetylacetone | Oxygen | 1400 | — |
| Comparative Example E-4 | P(III) 1% | — | Acetylacetone | Oxygen | 1470 | — |
| Comparative Example E-5 | P(V) 5% | — | Acetylacetone | Oxygen | 1400 | — |
| Comparative Example E-6 | Sn 10% | Tin tetra-n-butoxide | Acetylacetone | Oxygen | 1300 | — |

TABLE 14

| | Addition element species/Additive amount (mol %) | Added Sn compound form | Added stabilizer | Baking atmosphere | Specific permittivity $\epsilon r$ |
|---|---|---|---|---|---|
| Example E-10 | Sn 0.5% | Tin octylate | Diethanolamine | Oxygen | 1650 |
| Example E-11 | Sn 1% | Tin octylate | Diethanolamine | Oxygen | 1760 |
| Example E-12 | Sn 1% | Tin 2-ethyl butyrate | Diethanolamine | Oxygen | 1870 |
| Example E-13 | Sn 1% | Tin acetate | Diethanolamine | Oxygen | 1820 |
| Example E-14 | Sn 1% | Tin tetra-n-butoxide | Diethanolamine | Oxygen | 1760 |
| Example E-15 | Sn 1% | Tin ethoxide | Diethanolamine | Oxygen | 1770 |
| Example E-16 | Sn 1% | Tin nitrate | Diethanolamine | Oxygen | 1740 |
| Example E-17 | Sn 3% | Tin octylate | Diethanolamine | Oxygen | 1680 |
| Example E-18 | Sn 5% | Tin octylate | Diethanolamine | Oxygen | 1600 |
| Example E-19 | Sn 0.5% | Tin octylate | Acetylacetone | Dry air | 1640 |
| Example E-20 | Sn 1% | Tin octylate | Acetylacetone | Dry air | 1800 |
| Example E-21 | Sn 1% | Tin 2-ethyl butyrate | Acetylacetone | Dry air | 1900 |
| Example E-22 | Sn 1% | Tin acetate | Acetylacetone | Dry air | 1750 |
| Example E-23 | Sn 1% | Tin tetra-n-butoxide | Acetylacetone | Dry air | 1800 |
| Example E-24 | Sn 1% | Tin ethoxide | Acetylacetone | Dry air | 1720 |
| Example E-25 | Sn 1% | Tin nitrate | Acetylacetone | Dry air | 1660 |
| Example E-26 | Sn 3% | Tin octylate | Acetylacetone | Dry air | 1680 |
| Example E-27 | Sn 5% | Tin octylate | Acetylacetone | Dry air | 1590 |
| Comparative Example E-7 | Sn 7% | Tin octylate | Diethanolamine | Oxygen | 1480 |
| Comparative Example E-8 | Sn 10% | Tin octylate | Acetylacetone | Dry air | 1320 |

As can be seen from Tables 13 and 12, as compared to the PZT ferroelectric thin film of Comparative Example E-1 and the PLZT ferroelectric thin film of Comparative Example E-2, each with no addition of Sn, the ferroelectric thin films of Examples E-1 to E-9 with an addition of Sn exhibited a high specific permittivity $\epsilon r$. From these results, it was demonstrated that the ferroelectric thin films of Examples E-1 to E-9 exhibit excellent basic characteristics as a capacitor.

However, the PZT ferroelectric thin film of Comparative Example E-6 with a 10% addition of Sn exhibited results inferior to the PZT ferroelectric thin film of Comparative Example E-1 with no addition of Sn.

In addition, according to the results of the ferroelectric thin films of Examples E-1 to E-4 and Comparative Example E-6 with varying additive amounts of Sn, particularly Examples E-2 with a 1% addition of Sn exhibited high numerical results in terms of specific permittivity, followed by in the order of: Examples E-3 with a 3% addition of Sn; Example E-1 with a 0.5% addition of Sn and Example E-4 with a 5% addition of Sn, which exhibit substantially the same results; and Examples E-6 with a 10% addition of Sn. From these results, it was demonstrated that there is an appropriate range of the Sn additive amount capable of contributing to improvements of the specific permittivity $\epsilon r$.

In addition, as can be seen from the results of the ferroelectric thin films of Examples E-5 to E-8 and Comparative Examples E-3 to E-5, coexistence of Sn with another ingredient (such as Si or P) in an amount of about 1% also exhibited favorable effects of Sn. In particular, Example E-7 having coexistence of Sn with P(V) in an amount of about 1% also exhibited a high specific permittivity $\epsilon r$ as compared to other Examples.

Further, as shown Table 14, from the results of the ferroelectric thin films of Examples E-10 to E-18 and Comparative Example E-7, it was demonstrated that addition effects of Sn were obtained even when the stabilizer was changed to diethanolamine.

Further, from the results of the ferroelectric thin films of Examples E-19 to E-27 and Comparative Example E-8, it was demonstrated that addition effects of Sn were obtained even when the baking atmosphere was changed to dry air.

The ferroelectric thin films of Examples E-10 to E-27 exhibit excellent basic characteristics as a capacitor, and can be used for a thin film capacitor with a high capacity density.

Hereinafter, Examples F-1 to F-45 of the present invention in conjunction with Comparative Examples F-1 to F-18 will be described in more detail.

Examples F-1 to F-5

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various samarium compounds (samarium 2-ethyl hexanoate, samarium 2-ethyl butyrate, samarium triethoxide, samarium tri-n-butoxide, tris (acetylacetonate) samarium) samarium was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples F-6 to F-10

Ferroelectric thin films were formed on substrates in the same manner as in Examples F-1 to F-5, except that 1.0 mol % (in outer percent) of various samarium compounds was added to the sol-gel liquids to prepare thin film-forming solutions.

Examples F-11 to F-15

Ferroelectric thin films were formed on substrates in the same manner as in Examples F-1 to F-5, except that 2.0 mol % (in outer percent) of various samarium compounds was added to the sol-gel liquids to prepare thin film-forming solutions.

Comparative Example F-1

A ferroelectric thin film was formed on a substrate in the same manner as in Examples F-1 to F-5, except that a thin film-forming solution was prepared with no addition of samarium compounds to the sol-gel liquid.

Comparative Examples F-2 to F-6

Ferroelectric thin films were formed on substrates in the same manner as in Examples F-1 to F-5, except that 3.0 mol % (in outer percent) of various samarium compounds was added to the sol-gel liquids to prepare thin film-forming solutions.

Examples F-16 to F-20

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various samarium compounds (samarium 2-ethyl hexanoate, samarium 2-ethyl butyrate, samarium triethoxide, samarium tri-n-butoxide, tris (acetylacetonate) samarium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples F-21 to F-25

Ferroelectric thin films were formed on substrates in the same manner as in Examples F-16 to F-20, except that 1.0 mol % (in outer percent) of various samarium compounds was added to the sol-gel liquids to prepare thin film-forming solutions.

Examples F-26 to F-30

Ferroelectric thin films were formed on substrates in the same manner as in Examples F-16 to F-20, except that 2.0 mol % (in outer percent) of various samarium compounds was added to the sol-gel liquids to prepare thin film-forming solutions.

Comparative Example F-7

A ferroelectric thin film was formed on a substrate in the same manner as in Examples F-16 to F-20, except that a thin film-forming solution was prepared with no addition of samarium compounds to the sol-gel liquid.

Comparative Examples F-8 to F-12

Ferroelectric thin films were formed on substrates in the same manner as in Examples F-16 to F-20, except that 3.0 mol % (in outer percent) of various samarium compounds was added to the sol-gel liquids to prepare thin film-forming solutions.

Examples F-31 to F-35

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various samarium compounds (samarium 2-ethyl hexanoate, samarium 2-ethyl butyrate, samarium triethoxide, samarium tri-n-butoxide, tris (acetylacetonate) samarium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to high-temperature baking in a rapid thermal annealer (RTA) under a dry air atmosphere at 700° C. for 1 minute, thereby forming a ferroelectric thin film having a film thickness of 270 nm.

Examples F-36 to F-40

Ferroelectric thin films were formed on substrates in the same manner as in Examples F-31 to F-35, except that 1.0 mol % (in outer percent) of various samarium compounds was added to the sol-gel liquids to prepare thin film-forming solutions.

Examples F-41 to F-45

Ferroelectric thin films were formed on substrates in the same manner as in Examples F-31 to F-35, except that 2.0 mol % (in outer percent) of various samarium compounds was added to the sol-gel liquids to prepare thin film-forming solutions.

Comparative Example F-13

A ferroelectric thin film was formed on a substrate in the same manner as in Examples F-31 to F-35, except that a thin film-forming solution was prepared with no addition of samarium compounds to the sol-gel liquid.

Comparative Examples F-14 to F-18

Ferroelectric thin films were formed on substrates in the same manner as in Examples F-31 to F-35, except that 3.0 mol % (in outer percent) of various samarium compounds was added to the sol-gel liquids to prepare thin film-forming solutions.

<Comparative Evaluation>

For a substrate on which each of the ferroelectric thin films prepared in Examples F-1 to F-45 and Comparative Examples F-1 to F-18 was formed, a Pt upper electrode of about 250 μm□ was fabricated on the surface of the substrate by a sputtering method using a metal mask, and C-V characteristics (voltage dependence of capacitance) were evaluated at a frequency of 1 kHz and at a voltage of −5 to 5 V, between Pt lower electrodes immediately under the ferroelectric thin film. The specific permittivity ∈r was calculated from the maximum value of capacitance. The measurement of C-V characteristics was carried out using a 4284A precision LCR meter (manufactured by HP) under the conditions of a bias step of 0.1 V, a frequency of 1 kHz, an oscillation level of 30 mV, a delay time of 0.2 sec, a temperature of 23° C., and a hygrometry of 50±10%. The results obtained are given in Tables 15 to 17 below.

TABLE 15

| | Addition element species/Additive amount (mol %) | Added Sm compound form | Added stabilizer | Baking atmosphere | Capacitance (μF/cm$^2$) | Specific permittivity ∈r |
|---|---|---|---|---|---|---|
| Example F-1 | Sm 0.5% | 2-ethyl hexanoate | Acetylacetone | Oxygen | 5.40 | 1630 |
| Example F-2 | Sm 0.5% | 2-ethyl butyrate | Acetylacetone | Oxygen | 5.47 | 1650 |
| Example F-3 | Sm 0.5% | Ethoxide | Acetylacetone | Oxygen | 5.47 | 1650 |
| Example F-4 | Sm 0.5% | n-butoxide | Acetylacetone | Oxygen | 5.43 | 1640 |
| Example F-5 | Sm 0.5% | Acetylacetonate | Acetylacetone | Oxygen | 5.40 | 1630 |
| Example F-6 | Sm 1% | 2-ethyl hexanoate | Acetylacetone | Oxygen | 5.70 | 1720 |
| Example F-7 | Sm 1% | 2-ethyl butyrate | Acetylacetone | Oxygen | 5.80 | 1750 |
| Example F-8 | Sm 1% | Ethoxide | Acetylacetone | Oxygen | 5.73 | 1730 |
| Example F-9 | Sm 1% | n-butoxide | Acetylacetone | Oxygen | 5.70 | 1720 |
| Example F-10 | Sm 1% | Acetylacetonate | Acetylacetone | Oxygen | 5.70 | 1720 |
| Example F-11 | Sm 2% | 2-ethyl hexanoate | Acetylacetone | Oxygen | 5.96 | 1800 |

TABLE 15-continued

|  | Addition element species/Additive amount (mol %) | Added Sm compound form | Added stabilizer | Baking atmosphere | Capacitance ($\mu F/cm^2$) | Specific permittivity $\epsilon r$ |
|---|---|---|---|---|---|---|
| Example F-12 | Sm 2% | 2-ethyl butyrate | Acetylacetone | Oxygen | 6.03 | 1820 |
| Example F-13 | Sm 2% | Ethoxide | Acetylacetone | Oxygen | 6.03 | 1820 |
| Example F-14 | Sm 2% | n-butoxide | Acetylacetone | Oxygen | 5.96 | 1800 |
| Example F-15 | Sm 2% | Acetylacetonate | Acetylacetone | Oxygen | 6.00 | 1810 |
| Comparative Example F-1 | Non dope (PZT (110/52/48)) | — | Acetylacetone | Oxygen | 5.07 | 1530 |
| Comparative Example F-2 | Sm 3% | 2-ethyl hexanoate | Acetylacetone | Oxygen | 4.64 | 1400 |
| Comparative Example F-3 | Sm 3% | 2-ethyl butyrate | Acetylacetone | Oxygen | 4.61 | 1390 |
| Comparative Example F-4 | Sm 3% | Ethoxide | Acetylacetone | Oxygen | 4.71 | 1420 |
| Comparative Example F-5 | Sm 3% | n-butoxide | Acetylacetone | Oxygen | 4.67 | 1410 |
| Comparative Example F-6 | Sm 3% | Acetylacetonate | Acetylacetone | Oxygen | 4.67 | 1410 |

TABLE 16

|  | Addition element species/Additive amount (mol %) | Added Sm compound form | Added stabilizer | Baking atmosphere | Capacitance ($\mu F/cm^2$) | Specific permittivity $\epsilon r$ |
|---|---|---|---|---|---|---|
| Example F-16 | Sm 0.5% | 2-ethyl hexanoate | Diethanolamine | Oxygen | 5.43 | 1640 |
| Example F-17 | Sm 0.5% | 2-ethyl butyrate | Diethanolamine | Oxygen | 5.43 | 1640 |
| Example F-18 | Sm 0.5% | Ethoxide | Diethanolamine | Oxygen | 5.37 | 1620 |
| Example F-19 | Sm 0.5% | n-butoxide | Diethanolamine | Oxygen | 5.40 | 1630 |
| Example F-20 | Sm 0.5% | Acetylacetonate | Diethanolamine | Oxygen | 5.37 | 1620 |
| Example F-21 | Sm 1% | 2-ethyl hexanoate | Diethanolamine | Oxygen | 5.83 | 1760 |
| Example F-22 | Sm 1% | 2-ethyl butyrate | Diethanolamine | Oxygen | 5.83 | 1760 |
| Example F-23 | Sm 1% | Ethoxide | Diethanolamine | Oxygen | 5.80 | 1750 |
| Example F-24 | Sm 1% | n-butoxide | Diethanolamine | Oxygen | 5.80 | 1750 |
| Example F-25 | Sm 1% | Acetylacetonate | Diethanolamine | Oxygen | 5.73 | 1730 |
| Example F-26 | Sm 2% | 2-ethyl hexanoate | Diethanolamine | Oxygen | 6.00 | 1810 |
| Example F-27 | Sm 2% | 2-ethyl butyrate | Diethanolamine | Oxygen | 6.00 | 1810 |
| Example F-28 | Sm 2% | Ethoxide | Diethanolamine | Oxygen | 6.06 | 1830 |
| Example F-29 | Sm 2% | n-butoxide | Diethanolamine | Oxygen | 6.03 | 1820 |
| Example F-30 | Sm 2% | Acetylacetonate | Diethanolamine | Oxygen | 6.06 | 1830 |
| Comparative Example F-7 | Non dope (PZT (110/52/48)) | — | Diethanolamine | Oxygen | 5.04 | 1520 |
| Comparative Example F-8 | Sm 3% | 2-ethyl hexanoate | Diethanolamine | Oxygen | 4.64 | 1400 |
| Comparative Example F-9 | Sm 3% | 2-ethyl butyrate | Diethanolamine | Oxygen | 4.64 | 1400 |
| Comparative Example F-10 | Sm 3% | Ethoxide | Diethanolamine | Oxygen | 4.67 | 1410 |
| Comparative Example F-11 | Sm 3% | n-butoxide | Diethanolamine | Oxygen | 4.67 | 1410 |
| Comparative Example F-12 | Sm 3% | Acetylacetonate | Diethanolamine | Oxygen | 4.67 | 1410 |

TABLE 17

|  | Addition element species/Additive amount (mol %) | Added Sm compound form | Added stabilizer | Baking atmosphere | Capacitance ($\mu F/cm^2$) | Specific permittivity $\epsilon r$ |
|---|---|---|---|---|---|---|
| Example F-31 | Sm 0.5% | 2-ethyl hexanoate | Acetylacetone | Dry air | 5.50 | 1660 |
| Example F-32 | Sm 0.5% | 2-ethyl butyrate | Acetylacetone | Dry air | 5.47 | 1650 |
| Example F-33 | Sm 0.5% | Ethoxide | Acetylacetone | Dry air | 5.47 | 1650 |
| Example F-34 | Sm 0.5% | n-butoxide | Acetylacetone | Dry air | 5.47 | 1650 |
| Example F-35 | Sm 0.5% | Acetylacetonate | Acetylacetone | Dry air | 5.43 | 1640 |
| Example F-36 | Sm 1% | 2-ethyl hexanoate | Acetylacetone | Dry air | 5.76 | 1740 |
| Example F-37 | Sm 1% | 2-ethyl butyrate | Acetylacetone | Dry air | 5.76 | 1740 |
| Example F-38 | Sm 1% | Ethoxide | Acetylacetone | Dry air | 5.73 | 1730 |
| Example F-39 | Sm 1% | n-butoxide | Acetylacetone | Dry air | 5.70 | 1720 |
| Example F-40 | Sm 1% | Acetylacetonate | Acetylacetone | Dry air | 5.73 | 1730 |
| Example F-41 | Sm 2% | 2-ethyl hexanoate | Acetylacetone | Dry air | 6.03 | 1820 |
| Example F-42 | Sm 2% | 2-ethyl butyrate | Acetylacetone | Dry air | 6.00 | 1810 |
| Example F-43 | Sm 2% | Ethoxide | Acetylacetone | Dry air | 5.96 | 1800 |
| Example F-44 | Sm 2% | n-butoxide | Acetylacetone | Dry air | 6.00 | 1810 |

TABLE 17-continued

|  | Addition element species/Additive amount (mol %) | Added Sm compound form | Added stabilizer | Baking atmosphere | Capacitance ($\mu F/cm^2$) | Specific permittivity $\epsilon r$ |
|---|---|---|---|---|---|---|
| Example F-45 | Sm 2% | Acetylacetonate | Acetylacetone | Dry air | 6.06 | 1830 |
| Comparative Example F-13 | Non dope (PZT (110/52/48)) | — | Acetylacetone | Dry air | 5.03 | 1520 |
| Comparative Example F-14 | Sm 3% | 2-ethyl hexanoate | Acetylacetone | Dry air | 4.60 | 1390 |
| Comparative Example F-15 | Sm 3% | 2-ethyl butyrate | Acetylacetone | Dry air | 4.67 | 1410 |
| Comparative Example F-16 | Sm 3% | Ethoxide | Acetylacetone | Dry air | 4.64 | 1400 |
| Comparative Example F-17 | Sm 3% | n-butoxide | Acetylacetone | Dry air | 4.67 | 1410 |
| Comparative Example F-18 | Sm 3% | Acetylacetonate | Acetylacetone | Dry air | 4.67 | 1410 |

As can be seen from Tables 15 to 17, as compared to the PZT ferroelectric thin films of Comparative Examples F-1, F-7 and F-13 with no addition of Sm, the ferroelectric thin films of Examples F-1 to F-45 with an addition of Sm at a concentration of 0.5% to 2% exhibited a high capacitance and a high specific permittivity at a thin film thickness of about 270 nm. From these results, it can be seen that the ferroelectric thin films of Examples F-1 to F-45 exhibit excellent basic characteristics as a capacitor.

However, the ferroelectric thin film of Comparative Examples F-2 to F6, F-8 to F-12, and F-14 to F-18, each with a 3% addition of Sm, exhibited results inferior to the PZT ferroelectric thin film of Comparative Examples F-1, F-7 and F-13 with no addition of Sm.

In addition, according to the results of the ferroelectric thin films of Examples F-1 to F-45 and Comparative Examples F-2 to F-6, F-8 to F-12 and F-14 to F-18 with varying additive amounts of Sm, particularly Examples F-11 to F-15, F-26 to F-30 and F-41 to F-45 with a 2% addition of Sm exhibited high numerical results in terms of capacitance and specific permittivity, followed by in the order of: Examples F-6 to F-10, F-21 to F-25 and F-36 to F-40 with a 1% addition of Sm; Examples F-1 to F-5, F-16 to F-20 and F-31 to F-35 with a 0.5% addition of Sm; and Comparative Examples F-2 to F-6, F-8 to F-12 and F-14 to F-18 with a 3% addition of Sm.

From these results, it was demonstrated that there is an appropriate range of the Sm additive amount capable of contributing to improvements of the capacitance and specific permittivity $\epsilon r$.

The ferroelectric thin film-forming composition of Examples F-1 to F-45, a method for forming a ferroelectric thin film and a ferroelectric thin film formed by the same method exhibit excellent basic characteristics as a capacitor, and can be used for a thin film capacitor with a high capacity density.

Hereinafter, Examples G-1 to G-45 of the present invention in conjunction with Comparative Examples G-1 to G-18 will be described in more detail.

Examples G-1 to G-5

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various neodymium compounds (neodymium 2-ethyl hexanoate, neodymium 2-ethyl butyrate, neodymium triethoxide, neodymium tri-n-butoxide, tris (acetylacetonate) neodymium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples G-6 to G-10

Ferroelectric thin films were formed on substrates in the same manner as in Examples G-1 to G-5, except that 1.0 mol % (in outer percent) of various neodymium compounds was added to the sol-gel liquids to prepare thin film-forming solutions.

Examples G-11 to G-15

Ferroelectric thin films were formed on substrates in the same manner as in Examples G-1 to G-5, except that 2.0 mol % (in outer percent) of various neodymium compounds was added to the sol-gel liquids to prepare thin film-forming solutions.

Comparative Example G-1

A ferroelectric thin film was formed on a substrate in the same manner as in Examples G-1 to G-5, except that a thin film-forming solution was prepared with no addition of neodymium compounds to the sol-gel liquid.

Comparative Examples G-2 to G-6

Ferroelectric thin films were formed on substrates in the same manner as in Examples G-1 to G-5, except that 3.0 mol % (in outer percent) of various neodymium compounds was added to the sol-gel liquids to prepare thin film-forming solutions.

Examples G-16 to G-20

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various neodymium compounds (neodymium 2-ethyl hexanoate, neodymium 2-ethyl butyrate, neodymium triethoxide, neodymium tri-n-butoxide, tris (acetylacetonate) neodymium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples G-21 to G-25

Ferroelectric thin films were formed on substrates in the same manner as in Examples G-16 to G-20, except that 1.0 mol % (in outer percent) of various neodymium compounds was added to the sol-gel liquids to prepare thin film-forming solutions.

Examples G-26 to G-30

Ferroelectric thin films were formed on substrates in the same manner as in Examples G-16 to G-20, except that 2.0 mol % (in outer percent) of various neodymium compounds was added to the sol-gel liquids to prepare thin film-forming solutions.

Comparative Example G-7

A ferroelectric thin film was formed on a substrate in the same manner as in Examples G-16 to G-20, except that a thin film-forming solution was prepared with no addition of neodymium compounds to the sol-gel liquid.

Comparative Examples G-8 to G-12

Ferroelectric thin films were formed on substrates in the same manner as in Examples G-16 to G-20, except that 3.0 mol % (in outer percent) of various neodymium compounds was added to the sol-gel liquids to prepare thin film-forming solutions.

Examples G-31 to G-35

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various neodymium compounds (neodymium 2-ethyl hexanoate, neodymium 2-ethyl butyrate, neodymium triethoxide, neodymium tri-n-butoxide, tris (acetylacetonate) neodymium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a dry air atmosphere at 700° C. for 1 minute, thereby forming a ferroelectric thin film having a film thickness of 270 nm.

Examples G-36 to G-40

Ferroelectric thin films were formed on substrates in the same manner as in Examples G-31 to G-35, except that 1.0 mol % (in outer percent) of various neodymium compounds was added to the sol-gel liquids to prepare thin film-forming solutions.

Examples G-41 to G-45

Ferroelectric thin films were formed on substrates in the same manner as in Examples G-31 to G-35, except that 2.0 mol % (in outer percent) of various neodymium compounds was added to the sol-gel liquids to prepare thin film-forming solutions.

Comparative Example G-13

A ferroelectric thin film was formed on a substrate in the same manner as in Examples G-31 to G-35, except that a thin film-forming solution was prepared with no addition of neodymium compounds to the sol-gel liquid.

Comparative Examples G-14 to G-18

Ferroelectric thin films were formed on substrates in the same manner as in Examples G-31 to G-35, except that 3.0 mol % (in outer percent) of various neodymium compounds was added to the sol-gel liquids to prepare thin film-forming solutions.

<Comparative Evaluation>

For a substrate on which each of the ferroelectric thin films prepared in Examples G-1 to G-45 and Comparative Examples G-1 to G-18 was formed, a Pt upper electrode of about 250 μm☐ was fabricated on the surface of the substrate by a sputtering method using a metal mask, and C-V characteristics (voltage dependence of capacitance) were evaluated at a frequency of 1 kHz and at a voltage of −5 to 5 V, between Pt lower electrodes immediately under the ferroelectric thin film. The specific permittivity $\in r$ was calculated from the maximum value of capacitance. The measurement of C-V characteristics was carried out using a 4284A precision LCR meter (manufactured by HP) under the conditions of a bias step of 0.1 V, a frequency of 1 kHz, an oscillation level of 30 mV, a delay time of 0.2 sec, a temperature of 23° C., and a hygrometry of 50±10%. The results obtained are given in Tables 18 to 20 below.

TABLE 18

| | Addition element species/Additive amount (mol %) | Added Nd compound form | Added stabilizer | Baking atmosphere | Capacitance (μF/cm$^2$) | Specific permittivity $\in r$ |
|---|---|---|---|---|---|---|
| Example G-1 | Nd 0.5% | 2-ethyl hexanoate | Acetylacetone | Oxygen | 5.48 | 1650 |
| Example G-2 | Nd 0.5% | 2-ethyl butyrate | Acetylacetone | Oxygen | 5.38 | 1620 |
| Example G-3 | Nd 0.5% | Ethoxide | Acetylacetone | Oxygen | 5.45 | 1640 |
| Example G-4 | Nd 0.5% | n-butoxide | Acetylacetone | Oxygen | 5.41 | 1630 |
| Example G-5 | Nd 0.5% | Acetylacetonate | Acetylacetone | Oxygen | 5.45 | 1640 |
| Example G-6 | Nd 1% | 2-ethyl hexanoate | Acetylacetone | Oxygen | 6.35 | 1920 |
| Example G-7 | Nd 1% | 2-ethyl butyrate | Acetylacetone | Oxygen | 6.31 | 1900 |
| Example G-8 | Nd 1% | Ethoxide | Acetylacetone | Oxygen | 6.28 | 1890 |
| Example G-9 | Nd 1% | n-butoxide | Acetylacetone | Oxygen | 6.35 | 1920 |
| Example G-10 | Nd 1% | Acetylacetonate | Acetylacetone | Oxygen | 6.34 | 1910 |
| Example G-11 | Nd 2% | 2-ethyl hexanoate | Acetylacetone | Oxygen | 5.41 | 1650 |
| Example G-12 | Nd 2% | 2-ethyl butyrate | Acetylacetone | Oxygen | 5.51 | 1660 |
| Example G-13 | Nd 2% | Ethoxide | Acetylacetone | Oxygen | 5.41 | 1630 |
| Example G-14 | Nd 2% | n-butoxide | Acetylacetone | Oxygen | 5.35 | 1610 |
| Example G-15 | Nd 2% | Acetylacetonate | Acetylacetone | Oxygen | 5.45 | 1640 |
| Comparative Example G-1 | Non dope (PZT (110/52/48)) | — | Acetylacetone | Oxygen | 5.07 | 1530 |
| Comparative Example G-2 | Nd 3% | 2-ethyl hexanoate | Acetylacetone | Oxygen | 4.46 | 1360 |
| Comparative Example G-3 | Nd 3% | 2-ethyl butyrate | Acetylacetone | Oxygen | 4.45 | 1340 |
| Comparative Example G-4 | Nd 3% | Ethoxide | Acetylacetone | Oxygen | 4.55 | 1370 |
| Comparative Example G-5 | Nd 3% | n-butoxide | Acetylacetone | Oxygen | 4.48 | 1350 |
| Comparative Example G-6 | Nd 3% | Acetylacetonate | Acetylacetone | Oxygen | 4.46 | 1360 |

TABLE 19

| | Addition element species/Additive amount (mol %) | Added Nd compound form | Added stabilizer | Baking atmosphere | Capacitance (μF/cm$^2$) | Specific permittivity $\in r$ |
|---|---|---|---|---|---|---|
| Example G-16 | Nd 0.5% | 2-ethyl hexanoate | Diethanolamine | Oxygen | 5.51 | 1660 |
| Example G-17 | Nd 0.5% | 2-ethyl butyrate | Diethanolamine | Oxygen | 5.48 | 1650 |
| Example G-18 | Nd 0.5% | Ethoxide | Diethanolamine | Oxygen | 5.48 | 1650 |
| Example G-19 | Nd 0.5% | n-butoxide | Diethanolamine | Oxygen | 5.41 | 1630 |
| Example G-20 | Nd 0.5% | Acetylacetonate | Diethanolamine | Oxygen | 5.41 | 1630 |
| Example G-21 | Nd 1% | 2-ethyl hexanoate | Diethanolamine | Oxygen | 6.38 | 1920 |
| Example G-22 | Nd 1% | 2-ethyl butyrate | Diethanolamine | Oxygen | 6.31 | 1900 |
| Example G-23 | Nd 1% | Ethoxide | Diethanolamine | Oxygen | 6.38 | 1920 |
| Example G-24 | Nd 1% | n-butoxide | Diethanolamine | Oxygen | 6.31 | 1900 |
| Example G-25 | Nd 1% | Acetylacetonate | Diethanolamine | Oxygen | 6.28 | 1890 |
| Example G-26 | Nd 2% | 2-ethyl hexanoate | Diethanolamine | Oxygen | 5.48 | 1650 |
| Example G-27 | Nd 2% | 2-ethyl butyrate | Diethanolamine | Oxygen | 5.45 | 1640 |
| Example G-28 | Nd 2% | Ethoxide | Diethanolamine | Oxygen | 5.48 | 1650 |
| Example G-29 | Nd 2% | n-butoxide | Diethanolamine | Oxygen | 5.51 | 1660 |
| Example G-30 | Nd 2% | Acetylacetonate | Diethanolamine | Oxygen | 5.51 | 1660 |
| Comparative Example G-7 | Non dope (PZT (110/52/48)) | — | Diethanolamine | Oxygen | 5.05 | 1520 |
| Comparative Example G-8 | Nd 3% | 2-ethyl hexanoate | Diethanolamine | Oxygen | 4.58 | 1380 |
| Comparative Example G-9 | Nd 3% | 2-ethyl butyrate | Diethanolamine | Oxygen | 4.58 | 1380 |

TABLE 19-continued

|  | Addition element species/Additive amount (mol %) | Added Nd compound form | Added stabilizer | Baking atmosphere | Capacitance (μF/cm$^2$) | Specific permittivity ∈r |
|---|---|---|---|---|---|---|
| Comparative Example G-10 | Nd 3% | Ethoxide | Diethanolamine | Oxygen | 4.52 | 1360 |
| Comparative Example G-11 | Nd 3% | n-butoxide | Diethanolamine | Oxygen | 4.52 | 1360 |
| Comparative Example G-12 | Nd 3% | Acetylacetonate | Diethanolamine | Oxygen | 4.52 | 1360 |

TABLE 20

|  | Addition element species/Additive amount (mol %) | Added Nd compound form | Added stabilizer | Baking atmosphere | Capacitance (μF/cm$^2$) | Specific permittivity ∈r |
|---|---|---|---|---|---|---|
| Example G-31 | Nd 0.5% | 2-ethyl hexanoate | Acetylacetone | Dry air | 5.45 | 1640 |
| Example G-32 | Nd 0.5% | 2-ethyl butyrate | Acetylacetone | Dry air | 5.51 | 1660 |
| Example G-33 | Nd 0.5% | Ethoxide | Acetylacetone | Dry air | 5.41 | 1630 |
| Example G-34 | Nd 0.5% | n-butoxide | Acetylacetone | Dry air | 5.48 | 1650 |
| Example G-35 | Nd 0.5% | Acetylacetonate | Acetylacetone | Dry air | 5.48 | 1650 |
| Example G-36 | Nd 1% | 2-ethyl hexanoate | Acetylacetone | Dry air | 6.34 | 1910 |
| Example G-37 | Nd 1% | 2-ethyl butyrate | Acetylacetone | Dry air | 6.31 | 1900 |
| Example G-38 | Nd 1% | Ethoxide | Acetylacetone | Dry air | 6.34 | 1910 |
| Example G-39 | Nd 1% | n-butoxide | Acetylacetone | Dry air | 6.28 | 1890 |
| Example G-40 | Nd 1% | Acetylacetonate | Acetylacetone | Dry air | 6.28 | 1890 |
| Example G-41 | Nd 2% | 2-ethyl hexanoate | Acetylacetone | Dry air | 5.48 | 1650 |
| Example G-42 | Nd 2% | 2-ethyl butyrate | Acetylacetone | Dry air | 5.45 | 1640 |
| Example G-43 | Nd 2% | Ethoxide | Acetylacetone | Dry air | 5.48 | 1650 |
| Example G-44 | Nd 2% | n-butoxide | Acetylacetone | Dry air | 5.41 | 1630 |
| Example G-45 | Nd 2% | Acetylacetonate | Acetylacetone | Dry air | 5.41 | 1630 |
| Comparative Example G-13 | Non dope (PZT (110/52/48)) | — | Acetylacetone | Dry air | 5.05 | 1520 |
| Comparative Example G-14 | Nd 3% | 2-ethyl hexanoate | Acetylacetone | Dry air | 4.48 | 1350 |
| Comparative Example G-15 | Nd 3% | 2-ethyl butyrate | Acetylacetone | Dry air | 4.48 | 1350 |
| Comparative Example G-16 | Nd 3% | Ethoxide | Acetylacetone | Dry air | 4.52 | 1360 |
| Comparative Example G-17 | Nd 3% | n-butoxide | Acetylacetone | Dry air | 4.55 | 1370 |
| Comparative Example G-18 | Nd 3% | Acetylacetonate | Acetylacetone | Dry air | 4.55 | 1370 |

As can be seen from Tables 18 to 20, as compared to the PZT ferroelectric thin films of Comparative Examples G-1, G-7 and G-13 with no addition of Nd, the ferroelectric thin films of Examples G-1 to G-45 with an addition of Nd at a concentration of 0.5% to 2% exhibited a high capacitance and a high specific permittivity at a thin film thickness of about 270 nm. From these results, it can be seen that the ferroelectric thin films of Examples G-1 to G-45 exhibit excellent basic characteristics as a capacitor.

However, the ferroelectric thin film of Comparative Examples G-2 to G-6, G-8 to G-12, and G-14 to G-18, each with a 3% addition of Nd, exhibited results inferior to the PZT ferroelectric thin film of Comparative Examples G-1, G-7 and G-13 with no addition of Nd.

In addition, according to the results of the ferroelectric thin films of Examples G-1 to G-45, and Comparative Examples G-2 to G-6, G-8 to G-12 and G-14 to G-18 with varying additive amounts of Nd, particularly Examples G-6 to G-10, G-21 to G-25, and G-36 to G-40 with a 1% addition of Nd exhibited high numerical results in terms of capacitance and specific permittivity, followed by in the order of: Examples G-1 to G-5, G-16 to G-20 and G-31 to G-35 with a 0.5% addition of Nd, and Examples G-11 to G-15, G-26 to G-30 and G-41 to G-45 with a 2% addition of Nd, which exhibit substantially the same results; and Comparative Examples G-2 to G-6, G-8 to G-12, and G-14 to G-18 with a 3% addition of Nd.

From these results, it was demonstrated that there is an appropriate range of the Nd additive amount capable of contributing to improvements of the capacitance and specific permittivity ∈r.

The ferroelectric thin film-forming composition of Examples G-1 to G-45, a method for forming a ferroelectric thin film and a ferroelectric thin film formed by the same method exhibit excellent basic characteristics as a capacitor, and can be used for a thin film capacitor with a high capacity density.

Hereinafter, Examples H-1 to H-45 of the present invention in conjunction with Comparative Examples H-1 to H-18 will be described in more detail.

Examples H-1 to H-5

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various yttrium compounds (yttrium 2-ethyl hexanoate, yttrium 2-ethyl butyrate, yttrium triethoxide, yttrium tri-n-butoxide, tris (acetylacetonate) yttrium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples H-6 to H-10

Ferroelectric thin films were formed on substrates in the same manner as in Examples H-1 to H-5, except that 1.0 mol % (in outer percent) of various yttrium compounds was added to the sol-gel liquids to prepare thin film-forming solutions.

Examples H-11 to H-15

Ferroelectric thin films were formed on substrates in the same manner as in Examples H-1 to H-5, except that 2.0 mol % (in outer percent) of various yttrium compounds was added to the sol-gel liquids to prepare thin film-forming solutions.

Comparative Example H-1

A ferroelectric thin film was formed on a substrate in the same manner as in Examples H-1 to H-5, except that a thin film-forming solution was prepared with no addition of yttrium compounds to the sol-gel liquid.

Comparative Examples H-2 to H-6

Ferroelectric thin films were formed on substrates in the same manner as in Examples H-1 to H-5, except that 3.0 mol % (in outer percent) of various yttrium compounds was added to the sol-gel liquids to prepare thin film-forming solutions.

Examples H-16 to H-20

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various yttrium compounds (yttrium 2-ethyl hexanoate, yttrium 2-ethyl butyrate, yttrium triethoxide, yttrium tri-n-butoxide, tris (acetylacetonate) yttrium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples H-21 to H-25

Ferroelectric thin films were formed on substrates in the same manner as in Examples H-16 to H-20, except that 1.0 mol % (in outer percent) of various yttrium compounds was added to the sol-gel liquids to prepare thin film-forming solutions.

Examples H-26 to H-30

Ferroelectric thin films were formed on substrates in the same manner as in Examples H-16 to H-20, except that 2.0 mol % (in outer percent) of various yttrium compounds was added to the sol-gel liquids to prepare thin film-forming solutions.

Comparative Example H-7

A ferroelectric thin film was formed on a substrate in the same manner as in Examples H-16 to H-20, except that a thin film-forming solution was prepared with no addition of yttrium compounds to the sol-gel liquid.

Comparative Examples H-8 to H-12

Ferroelectric thin films were formed on substrates in the same manner as in Examples H-16 to H-20, except that 3.0 mol % (in outer percent) of various yttrium compounds was added to the sol-gel liquids to prepare thin film-forming solutions.

Examples H-31 to H-35

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.5 mol % (in outer percent) of various yttrium compounds (yttrium 2-ethyl hexanoate, yttrium 2-ethyl butyrate, yttrium triethoxide, yttrium tri-n-butoxide, tris (acetylacetonate) yttrium) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a dry air atmosphere at 700° C. for 1 minute, thereby forming a ferroelectric thin film having a film thickness of 270 nm.

Examples H-36 to H-40

Ferroelectric thin films were formed on substrates in the same manner as in Examples H-31 to H-35, except that 1.0 mol % (in outer percent) of various yttrium compounds was added to the sol-gel liquids to prepare thin film-forming solutions.

Examples H-41 to H-45

Ferroelectric thin films were formed on substrates in the same manner as in Examples H-31 to H-35, except that 2.0 mol % (in outer percent) of various yttrium compounds was added to the sol-gel liquids to prepare thin film-forming solutions.

Comparative Example H-13

A ferroelectric thin film was formed on a substrate in the same manner as in Examples H-31 to H-35, except that a thin film-forming solution was prepared with no addition of yttrium compounds to the sol-gel liquid.

Comparative Examples H-14 to H-18

Ferroelectric thin films were formed on substrates in the same manner as in Examples H-31 to H-35, except that 3.0 mol % (in outer percent) of various yttrium compounds was added to the sol-gel liquids to prepare thin film-forming solutions.

<Comparative Evaluation>

For a substrate on which each of the ferroelectric thin films prepared in Examples H-1 to H-45 and Comparative Examples H-1 to H-18 was formed, a Pt upper electrode of about 250 μm☐ was fabricated on the surface of the substrate by a sputtering method using a metal mask, and C-V characteristics (voltage dependence of capacitance) were evaluated at a frequency of 1 kHz and at a voltage of −5 to 5 V, between Pt lower electrodes immediately under the ferroelectric thin film. The specific permittivity ∈r was calculated from the maximum value of capacitance. The measurement of C-V characteristics was carried out using a 4284A precision LCR meter (manufactured by HP) under the conditions of a bias step of 0.1 V, a frequency of 1 kHz, an oscillation level of 30 mV, a delay time of 0.2 sec, a temperature of 23° C., and a hygrometry of 50±10%. The results obtained are given in Tables 21 to 23 below.

TABLE 21

| | Addition element species/Additive amount (mol %) | Added Y (yttrium) compound form | Added stabilizer | Baking atmosphere | Capacitance (μF/cm$^2$) | Specific permittivity ∈r |
|---|---|---|---|---|---|---|
| Example H-1 | Y (yttrium) 0.5% | 2-ethyl hexanoate | Acetylacetone | Oxygen | 5.30 | 1600 |
| Example H-2 | Y (yttrium) 0.5% | 2-ethyl butyrate | Acetylacetone | Oxygen | 5.37 | 1620 |
| Example H-3 | Y (yttrium) 0.5% | Ethoxide | Acetylacetone | Oxygen | 5.47 | 1650 |
| Example H-4 | Y (yttrium) 0.5% | n-butoxide | Acetylacetone | Oxygen | 5.37 | 1620 |
| Example H-5 | Y (yttrium) 0.5% | Acetylacetonate | Acetylacetone | Oxygen | 5.37 | 1620 |
| Example H-6 | Y (yttrium) 1% | 2-ethyl hexanoate | Acetylacetone | Oxygen | 6.16 | 1860 |
| Example H-7 | Y (yttrium) 1% | 2-ethyl butyrate | Acetylacetone | Oxygen | 6.20 | 1870 |
| Example H-8 | Y (yttrium) 1% | Ethoxide | Acetylacetone | Oxygen | 6.16 | 1860 |
| Example H-9 | Y (yttrium) 1% | n-butoxide | Acetylacetone | Oxygen | 6.23 | 1880 |
| Example H-10 | Y (yttrium) 1% | Acetylacetonate | Acetylacetone | Oxygen | 6.23 | 1880 |
| Example H-11 | Y (yttrium) 2% | 2-ethyl hexanoate | Acetylacetone | Oxygen | 5.47 | 1650 |
| Example H-12 | Y (yttrium) 2% | 2-ethyl butyrate | Acetylacetone | Oxygen | 5.43 | 1640 |
| Example H-13 | Y (yttrium) 2% | Ethoxide | Acetylacetone | Oxygen | 5.43 | 1640 |
| Example H-14 | Y (yttrium) 2% | n-butoxide | Acetylacetone | Oxygen | 5.40 | 1630 |
| Example H-15 | Y (yttrium) 2% | Acetylacetonate | Acetylacetone | Oxygen | 5.47 | 1650 |
| Comparative Example H-1 | Non dope (PZT (110/52/48)) | — | Acetylacetone | Oxygen | 5.07 | 1530 |
| Comparative Example H-2 | Y (yttrium) 3% | 2-ethyl hexanoate | Acetylacetone | Oxygen | 4.47 | 1350 |
| Comparative Example H-3 | Y (yttrium) 3% | 2-ethyl butyrate | Acetylacetone | Oxygen | 4.44 | 1340 |
| Comparative Example H-4 | Y (yttrium) 3% | Ethoxide | Acetylacetone | Oxygen | 4.64 | 1400 |
| Comparative Example H-5 | Y (yttrium) 3% | n-butoxide | Acetylacetone | Oxygen | 4.51 | 1360 |
| Comparative Example H-6 | Y (yttrium) 3% | Acetylacetonate | Acetylacetone | Oxygen | 4.47 | 1350 |

TABLE 22

| | Addition element species/Additive amount (mol %) | Added Y (yttrium) compound form | Added stabilizer | Baking atmosphere | Capacitance (μF/cm²) | Specific permittivity εr |
|---|---|---|---|---|---|---|
| Example H-16 | Y (yttrium) 0.5% | 2-ethyl hexanoate | Diethanolamine | Oxygen | 5.33 | 1610 |
| Example H-17 | Y (yttrium) 0.5% | 2-ethyl butyrate | Diethanolamine | Oxygen | 5.37 | 1620 |
| Example H-18 | Y (yttrium) 0.5% | Ethoxide | Diethanolamine | Oxygen | 5.37 | 1620 |
| Example H-19 | Y (yttrium) 0.5% | n-butoxide | Diethanolamine | Oxygen | 5.40 | 1630 |
| Example H-20 | Y (yttrium) 0.5% | Acetylacetonate | Diethanolamine | Oxygen | 5.37 | 1620 |
| Example H-21 | Y (yttrium) 1% | 2-ethyl hexanoate | Diethanolamine | Oxygen | 6.16 | 1860 |
| Example H-22 | Y (yttrium) 1% | 2-ethyl butyrate | Diethanolamine | Oxygen | 6.23 | 1880 |
| Example H-23 | Y (yttrium) 1% | Ethoxide | Diethanolamine | Oxygen | 6.19 | 1870 |
| Example H-24 | Y (yttrium) 1% | n-butoxide | Diethanolamine | Oxygen | 6.19 | 1870 |
| Example H-25 | Y (yttrium) 1% | Acetylacetonate | Diethanolamine | Oxygen | 6.16 | 1860 |
| Example H-26 | Y (yttrium) 2% | 2-ethyl hexanoate | Diethanolamine | Oxygen | 5.43 | 1640 |
| Example H-27 | Y (yttrium) 2% | 2-ethyl butyrate | Diethanolamine | Oxygen | 5.47 | 1650 |
| Example H-28 | Y (yttrium) 2% | Ethoxide | Diethanolamine | Oxygen | 5.47 | 1650 |
| Example H-29 | Y (yttrium) 2% | n-butoxide | Diethanolamine | Oxygen | 5.43 | 1640 |
| Example H-30 | Y (yttrium) 2% | Acetylacetonate | Diethanolamine | Oxygen | 5.43 | 1640 |
| Comparative Example H-7 | Non dope (PZT (110/52/48)) | — | Diethanolamine | Oxygen | 5.04 | 1520 |
| Comparative Example H-8 | Y (yttrium) 3% | 2-ethyl hexanoate | Diethanolamine | Oxygen | 4.54 | 1370 |
| Comparative Example H-9 | Y (yttrium) 3% | 2-ethyl butyrate | Diethanolamine | Oxygen | 4.57 | 1380 |
| Comparative Example H-10 | Y (yttrium) 3% | Ethoxide | Diethanolamine | Oxygen | 4.60 | 1390 |
| Comparative Example H-11 | Y (yttrium) 3% | n-butoxide | Diethanolamine | Oxygen | 4.50 | 1360 |
| Comparative Example H-12 | Y (yttrium) 3% | Acetylacetonate | Diethanolamine | Oxygen | 4.54 | 1370 |

TABLE 23

| | Addition element species/Additive amount (mol %) | Added Y (yttrium) compound form | Added stabilizer | Baking atmosphere | Capacitance (μF/cm²) | Specific permittivity εr |
|---|---|---|---|---|---|---|
| Example H-31 | Y (yttrium) 0.5% | 2-ethyl hexanoate | Acetylacetone | Dry air | 5.40 | 1630 |
| Example H-32 | Y (yttrium) 0.5% | 2-ethyl butyrate | Acetylacetone | Dry air | 5.47 | 1650 |
| Example H-33 | Y (yttrium) 0.5% | Ethoxide | Acetylacetone | Dry air | 5.43 | 1640 |
| Example H-34 | Y (yttrium) 0.5% | n-butoxide | Acetylacetone | Dry air | 5.43 | 1640 |
| Example H-35 | Y (yttrium) 0.5% | Acetylacetonate | Acetylacetone | Dry air | 5.37 | 1620 |
| Example H-36 | Y (yttrium) 1% | 2-ethyl hexanoate | Acetylacetone | Dry air | 6.23 | 1880 |
| Example H-37 | Y (yttrium) 1% | 2-ethyl butyrate | Acetylacetone | Dry air | 6.23 | 1880 |
| Example H-38 | Y (yttrium) 1% | Ethoxide | Acetylacetone | Dry air | 6.23 | 1880 |
| Example H-39 | Y (yttrium) 1% | n-butoxide | Acetylacetone | Dry air | 6.16 | 1860 |
| Example H-40 | Y (yttrium) 1% | Acetylacetonate | Acetylacetone | Dry air | 6.16 | 1860 |
| Example H-41 | Y (yttrium) 2% | 2-ethyl hexanoate | Acetylacetone | Dry air | 5.43 | 1640 |
| Example H-42 | Y (yttrium) 2% | 2-ethyl butyrate | Acetylacetone | Dry air | 5.50 | 1660 |
| Example H-43 | Y (yttrium) 2% | Ethoxide | Acetylacetone | Dry air | 5.50 | 1660 |
| Example H-44 | Y (yttrium) 2% | n-butoxide | Acetylacetone | Dry air | 5.43 | 1640 |
| Example H-45 | Y (yttrium) 2% | Acetylacetonate | Acetylacetone | Dry air | 5.43 | 1640 |
| Comparative Example H-13 | Non dope (PZT (110/52/48)) | — | Acetylacetone | Dry air | 5.03 | 1520 |
| Comparative Example H-14 | Y (yttrium) 3% | 2-ethyl hexanoate | Acetylacetone | Dry air | 4.57 | 1380 |
| Comparative Example H-15 | Y (yttrium) 3% | 2-ethyl butyrate | acetylacetone | Dry air | 4.50 | 1360 |
| Comparative Example H-16 | Y (yttrium) 3% | Ethoxide | Acetylacetone | Dry air | 4.57 | 1380 |
| Comparative Example H-17 | Y (yttrium) 3% | n-butoxide | Acetylacetone | Dry air | 4.54 | 1370 |
| Comparative Example H-18 | Y (yttrium) 3% | acetylacetonate | Acetylacetone | Dry air | 4.60 | 1390 |

As can be seen from Tables 21 to 23, as compared to the PZT ferroelectric thin films of Comparative Examples H-1, H-7 and H-13 with no addition of Y (yttrium), the ferroelectric thin films of Examples H-1 to H-45 with an addition of Y (yttrium) at a concentration of 0.5% to 2% exhibited a high capacitance and a high specific permittivity at a thin film thickness of about 270 nm. From these results, it can be seen that the ferroelectric thin films of Examples H-1 to H-45 exhibit excellent basic characteristics as a capacitor.

However, the ferroelectric thin film of Comparative Examples H-2 to H6, H-8 to H-12, and H-14 to H-18, each with a 3% addition of Y (yttrium), exhibited results inferior to the PZT ferroelectric thin film of Comparative Examples H-1, H-7 and H-13 with no addition of Y (yttrium).

In addition, according to the results of the ferroelectric thin films of Examples H-1 to H-45, and Comparative Examples H-2 to H-6, H-8 to H-12 and H-14 to H-18 with varying additive amounts of Y (yttrium), particularly Examples H-6 to H-10, H-21 to H-25, and H-36 to H-40 with a 1% addition of Y (yttrium) exhibited high numerical results in terms of capacitance and specific permittivity, followed by in the order of: Examples H-1 to H-5, H-16 to H-20 and H-31 to H-35 with a 0.5% addition of Y (yttrium), and Examples H-11 to H-15, H-26 to H-30 and H-41 to H-45 with a 2% addition of Y (yttrium), which exhibit substantially the same results; and Comparative Examples H-2 to H-6, H-8 to H-12, and H-14 to H-18 with a 3% addition of Y (yttrium).

From these results, it was demonstrated that there is an appropriate range of the Y (yttrium) additive amount capable of contributing to improvements of the capacitance and specific permittivity $\in$r.

The ferroelectric thin film-forming composition of Examples H-1 to H-45, a method for forming a ferroelectric thin film and a ferroelectric thin film formed by the same method exhibit excellent basic characteristics as a capacitor, and can be used for a thin film capacitor with a high capacity density.

[Group 3]

Hereinafter, Examples I-1 to I-75 of the present invention in conjunction with Comparative Examples I-1 to I-9 will be described in more detail.

Examples I-1 to I-5

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.1 mol % (in outer percent) of various carboxylic acids (2-ethyl hexanoic acid, 3-ethyl pentanoic acid, 2-ethyl butyric acid, iso-valeric acid, n-butyric acid) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate (Pt/TiO$_2$/SiO$_2$/Si(100) substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples I-6 to I-10

Ferroelectric thin films were formed on substrates in the same manner as in Examples I-1 to I-5, except that 1.0 mol % (in outer percent) of various carboxylic acids was added to the sol-gel liquids to prepare thin film-forming solutions.

Examples I-11 to I-15

Ferroelectric thin films were formed on substrates in the same manner as in Examples I-1 to I-5, except that 3.0 mol % (in outer percent) of various carboxylic acids was added to the sol-gel liquids to prepare thin film-forming solutions.

Examples I-16 to I-20

Ferroelectric thin films were formed on substrates in the same manner as in Examples I-1 to I-5, except that 5.0 mol % (in outer percent) of various carboxylic acids was added to the sol-gel liquids to prepare thin film-forming solutions.

Examples I-21 to I-25

Ferroelectric thin films were formed on substrates in the same manner as in Examples I-1 to I-5, except that 10.0 mol % (in outer percent) of various carboxylic acids was added to the sol-gel liquids to prepare thin film-forming solutions.

Comparative Example I-1

A ferroelectric thin film was formed on a substrate in the same manner as in Examples I-1 to I-5, except that a thin film-forming solution was prepared with no addition of various carboxylic acids to the sol-gel liquid.

Comparative Example I-2

Ferroelectric thin films were formed on substrates in the same manner as in Examples I-1 to I-5, except that 5.0 mol % (in outer percent) of propionic acid was added to the sol-gel liquids to prepare thin film-forming solutions.

Comparative Example I-3

Ferroelectric thin films were formed on substrates in the same manner as in Examples I-1 to I-5, except that 5.0 mol % (in outer percent) of n-octanoic acid was added to the sol-gel liquids to prepare thin film-forming solutions.

Examples I-26 to I-30

First, zirconium tetra-n-butoxide and diethanolamine (stabilizer) were added to a reaction container, followed by reflux under a nitrogen atmosphere at a temperature of 150° C. Titanium tetraisopropoxide and diethanolamine (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.1 mol % (in outer percent) of various carboxylic acids (2-ethyl hexanoic acid, 3-ethyl pentanoic acid, 2-ethyl butyric acid, iso-valeric acid, n-butyric acid) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate ($Pt/TiO_2/SiO_2/Si(100)$ substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a 100% oxygen atmosphere at 700° C. for 1 minute, thereby forming a ferroelectric thin film having a film thickness of 270 nm.

Examples I-31 to I-35

Ferroelectric thin films were formed on substrates in the same manner as in Examples I-26 to I-30, except that 1.0 mol % (in outer percent) of various carboxylic acids was added to the sol-gel liquids to prepare thin film-forming solutions.

Examples I-36 to I-40

Ferroelectric thin films were formed on substrates in the same manner as in Examples I-26 to I-30, except that 3.0 mol % (in outer percent) of various carboxylic acids was added to the sol-gel liquids to prepare thin film-forming solutions.

Examples I-41 to I-45

Ferroelectric thin films were formed on substrates in the same manner as in Examples I-26 to I-30, except that 5.0 mol % (in outer percent) of various carboxylic acids was added to the sol-gel liquids to prepare thin film-forming solutions.

Examples I-46 to I-50

Ferroelectric thin films were formed on substrates in the same manner as in Examples I-26 to I-30, except that 10.0 mol % (in outer percent) of various carboxylic acids was added to the sol-gel liquids to prepare thin film-forming solutions.

Comparative Example I-4

A ferroelectric thin film was formed on a substrate in the same manner as in Examples I-26 to I-30, except that a thin film-forming solution was prepared with no addition of various carboxylic acids to the sol-gel liquid.

Comparative Example I-5

Ferroelectric thin films were formed on substrates in the same manner as in Examples I-26 to I-30, except that 5.0 mol % (in outer percent) of propionic acid was added to the sol-gel liquids to prepare thin film-forming solutions.

Comparative Example I-6

Ferroelectric thin films were formed on substrates in the same manner as in Examples I-26 to I-30, except that 5.0 mol % (in outer percent) of n-octanoic acid was added to the sol-gel liquids to prepare thin film-forming solutions.

Examples I-51 to I-55

First, zirconium tetra-n-butoxide and acetylacetone (stabilizer) were added to a reaction container, followed by reflux under a nitrogen atmosphere at a temperature of 150° C. Titanium tetraisopropoxide and acetylacetone (stabilizer) were added thereto, followed by reflux under a nitrogen atmosphere at a temperature of 150° C. Then, lead acetate trihydrate and propylene glycol (solvent) were added thereto, followed by reflux under a nitrogen atmosphere at a temperature of 150° C. Then, by-products were removed by distillation under reduced pressure at 150° C., and propylene glycol was added thereto, followed by concentration adjustment to obtain a liquid containing a 30% by mass concentration of a metal compound in terms of oxides. Thereafter, dilute alcohol was added to obtain a sol-gel liquid containing a 10% by mass concentration of a metal compound with a metal ratio of Pb/Zr/Ti=110/52/48 in terms of oxides.

Next, the sol-gel liquid was divided into five equal portions, and 0.1 mol % (in outer percent) of various carboxylic acids (2-ethyl hexanoic acid, 3-ethyl pentanoic acid, 2-ethyl butyric acid, iso-valeric acid, n-butyric acid) was added to these sol-gel liquids, thereby obtaining five thin film-forming solutions.

Using these five thin film-forming solutions, thin films were formed by a CSD method, according to the following procedure. That is, each solution was applied by a spin coating method at 500 rpm for 3 seconds and then at 3000 rpm for 15 seconds to a 6 inch silicon substrate ($Pt/TiO_2/SiO_2/Si(100)$ substrate) where a Pt thin film was sputtered on the surface thereof. Subsequently, pre-baking was carried out by heating the substrate on a hot plate at 350° C. for 5 minutes. After the application and pre-baking processes were repeated 6 times, the substrate was subjected to baking in a rapid thermal annealer (RTA) under a dry air atmosphere at 700° C. for 1 minute, thereby forming a ferroelectric thin film having a film thickness of 270 nm.

Examples I-56 to I-60

Ferroelectric thin films were formed on substrates in the same manner as in Examples I-51 to I-55, except that 1.0 mol % (in outer percent) of various carboxylic acids was added to the sol-gel liquids to prepare thin film-forming solutions.

Examples I-61 to I-65

Ferroelectric thin films were formed on substrates in the same manner as in Examples I-51 to I-55, except that 3.0 mol % (in outer percent) of various carboxylic acids was added to the sol-gel liquids to prepare thin film-forming solutions.

Examples I-66 to I-70

Ferroelectric thin films were formed on substrates in the same manner as in Examples I-51 to I-55, except that 5.0 mol % (in outer percent) of various carboxylic acids was added to the sol-gel liquids to prepare thin film-forming solutions.

Examples I-71 to I-75

Ferroelectric thin films were formed on substrates in the same manner as in Examples I-51 to I-55, except that 10.0 mol % (in outer percent) of various carboxylic acids was added to the sol-gel liquids to prepare thin film-forming solutions.

Comparative Example I-7

A ferroelectric thin film was formed on a substrate in the same manner as in Examples I-51 to I-55, except that a thin film-forming solution was prepared with no addition of various carboxylic acids to the sol-gel liquid.

Comparative Example I-8

Ferroelectric thin films were formed on substrates in the same manner as in Examples I-51 to I-55, except that 5.0 mol % (in outer percent) of propionic acid was added to the sol-gel liquids to prepare thin film-forming solutions.

Comparative Example I-9

Ferroelectric thin films were formed on substrates in the same manner as in Examples I-51 to I-55, except that 5.0 mol % (in outer percent) of n-octanoic acid was added to the sol-gel liquids to prepare thin film-forming solutions.

<Comparative Evaluation>

For a substrate on which each of the ferroelectric thin films prepared in Examples I-1 to I-75 and Comparative Examples I-1 to H-9 was formed, a Pt upper electrode of about 250 μm☐ was fabricated on the surface of the substrate by a sputtering method using a metal mask, and C-V characteristics (voltage dependence of capacitance) were evaluated at a frequency of 1 kHz and at a voltage of –5 to 5 V, between Pt lower electrodes immediately under the ferroelectric thin film. The specific permittivity ∈r was calculated from the maximum value of capacitance. The measurement of C-V characteristics was carried out using a 4284A precision LCR meter (manufactured by HP) under the conditions of a bias step of 0.1 V, a frequency of 1 kHz, an oscillation level of 30 mV, a delay time of 0.2 sec, a temperature of 23° C., and a hygrometry of 50±10%. The results obtained are given in Tables 24 to 26 below.

TABLE 24

|  | Carboxylic acid additive amount (mol %) | Added carboxylic acid form | Added stabilizer | Baking atmosphere | Capacitance (μF/cm²) | Specific permittivity ∈r |
|---|---|---|---|---|---|---|
| Example I-1 | 0.1% | 2-ethyl hexanoic acid | Acetylacetone | Oxygen | 5.07 | 1540 |
| Example I-2 | 0.1% | 3-ethyl pentanoic acid | Acetylacetone | Oxygen | 5.04 | 1530 |
| Example I-3 | 0.1% | 2-ethylbutyric acid | Acetylacetone | Oxygen | 5.10 | 1550 |
| Example I-4 | 0.1% | iso-valeric acid | Acetylacetone | Oxygen | 5.04 | 1530 |
| Example I-5 | 0.1% | n-butyric acid | Acetylacetone | Oxygen | 5.04 | 1530 |
| Example I-6 | 1% | 2-ethyl hexanoic acid | Acetylacetone | Oxygen | 5.07 | 1540 |
| Example I-7 | 1% | 3-ethyl pentanoic acid | Acetylacetone | Oxygen | 5.07 | 1540 |
| Example I-8 | 1% | 2-ethylbutyric acid | Acetylacetone | Oxygen | 5.14 | 1560 |
| Example I-9 | 1% | iso-valeric acid | Acetylacetone | Oxygen | 5.07 | 1540 |
| Example I-10 | 1% | n-butyric acid | Acetylacetone | Oxygen | 5.10 | 1550 |
| Example I-11 | 3% | 2-ethyl hexanoic acid | Acetylacetone | Oxygen | 5.17 | 1570 |
| Example I-12 | 3% | 3-ethyl pentanoic acid | Acetylacetone | Oxygen | 5.20 | 1580 |
| Example I-13 | 3% | 2-ethylbutyric acid | Acetylacetone | Oxygen | 5.27 | 1600 |
| Example I-14 | 3% | iso-valeric acid | Acetylacetone | Oxygen | 5.20 | 1580 |
| Example I-15 | 3% | n-butyric acid | Acetylacetone | Oxygen | 5.20 | 1580 |
| Example I-16 | 5% | 2-ethyl hexanoic acid | Acetylacetone | Oxygen | 5.93 | 1800 |
| Example I-17 | 5% | 3-ethyl pentanoic acid | Acetylacetone | Oxygen | 5.99 | 1820 |
| Example I-18 | 5% | 2-ethylbutyric acid | Acetylacetone | Oxygen | 5.93 | 1800 |
| Example I-19 | 5% | iso-valeric acid | Acetylacetone | Oxygen | 5.96 | 1810 |
| Example I-20 | 5% | n-butyric acid | Acetylacetone | Oxygen | 5.99 | 1820 |
| Example I-21 | 10% | 2-ethyl hexanoic acid | Acetylacetone | Oxygen | 5.76 | 1750 |
| Example I-22 | 10% | 3-ethyl pentanoic acid | Acetylacetone | Oxygen | 5.83 | 1770 |
| Example I-23 | 10% | 2-ethylbutyric acid | Acetylacetone | Oxygen | 5.73 | 1740 |
| Example I-24 | 10% | iso-valeric acid | Acetylacetone | Oxygen | 5.79 | 1760 |
| Example I-25 | 10% | n-butyric acid | Acetylacetone | Oxygen | 5.79 | 1760 |
| Comparative Example I-1 | 0% | — | Acetylacetone | Oxygen | 4.97 | 1510 |
| Comparative Example I-2 | 5% | Propionic acid | Acetylacetone | Oxygen | 4.94 | 1500 |
| Comparative Example I-3 | 5% | n-octanoic acid | Acetylacetone | Oxygen | 4.97 | 1510 |

TABLE 25

|  | Carboxylic acid additive amount (mol %) | Added carboxylic acid form | Added stabilizer | Baking atmosphere | Capacitance (μF/cm²) | Specific permittivity ∈r |
|---|---|---|---|---|---|---|
| Example I-26 | 0.1% | 2-ethyl hexanoic acid | Diethanolamine | Oxygen | 5.00 | 1520 |
| Example I-27 | 0.1% | 3-ethyl pentanoic acid | Diethanolamine | Oxygen | 5.04 | 1530 |
| Example I-28 | 0.1% | 2-ethylbutyric acid | Diethanolamine | Oxygen | 5.04 | 1530 |
| Example I-29 | 0.1% | iso-valeric acid | Diethanolamine | Oxygen | 5.07 | 1540 |
| Example I-30 | 0.1% | n-butyric acid | Diethanolamine | Oxygen | 5.00 | 1520 |
| Example I-31 | 1% | 2-ethyl hexanoic acid | Diethanolamine | Oxygen | 5.13 | 1560 |
| Example I-32 | 1% | 3-ethyl pentanoic acid | Diethanolamine | Oxygen | 5.10 | 1550 |
| Example I-33 | 1% | 2-ethylbutyric acid | Diethanolamine | Oxygen | 5.10 | 1550 |
| Example I-34 | 1% | iso-valeric acid | Diethanolamine | Oxygen | 5.13 | 1560 |
| Example I-35 | 1% | n-butyric acid | Diethanolamine | Oxygen | 5.10 | 1550 |
| Example I-36 | 3% | 2-ethyl hexanoic acid | Diethanolamine | Oxygen | 5.20 | 1580 |
| Example I-37 | 3% | 3-ethyl pentanoic acid | Diethanolamine | Oxygen | 5.23 | 1590 |

TABLE 25-continued

|  | Carboxylic acid additive amount (mol %) | Added carboxylic acid form | Added stabilizer | Baking atmosphere | Capacitance ($\mu$F/cm$^2$) | Specific permittivity $\epsilon r$ |
|---|---|---|---|---|---|---|
| Example I-38 | 3% | 2-ethylbutyric acid | Diethanolamine | Oxygen | 5.23 | 1590 |
| Example I-39 | 3% | iso-valeric acid | Diethanolamine | Oxygen | 5.20 | 1580 |
| Example I-40 | 3% | n-butyric acid | Diethanolamine | Oxygen | 5.23 | 1590 |
| Example I-41 | 5% | 2-ethyl hexanoic acid | Diethanolamine | Oxygen | 5.99 | 1820 |
| Example I-42 | 5% | 3-ethyl pentanoic acid | Diethanolamine | Oxygen | 5.96 | 1810 |
| Example I-43 | 5% | 2-ethylbutyric acid | Diethanolamine | Oxygen | 5.96 | 1810 |
| Example I-44 | 5% | iso-valeric acid | Diethanolamine | Oxygen | 5.96 | 1810 |
| Example I-45 | 5% | n-butyric acid | Diethanolamine | Oxygen | 5.92 | 1800 |
| Example I-46 | 10% | 2-ethyl hexanoic acid | Diethanolamine | Oxygen | 5.76 | 1750 |
| Example I-47 | 10% | 3-ethyl pentanoic acid | Diethanolamine | Oxygen | 5.83 | 1770 |
| Example I-48 | 10% | 2-ethylbutyric acid | Diethanolamine | Oxygen | 5.76 | 1750 |
| Example I-49 | 10% | iso-valeric acid | Diethanolamine | Oxygen | 5.79 | 1760 |
| Example I-50 | 10% | n-butyric acid | Diethanolamine | Oxygen | 5.79 | 1760 |
| Comparative Example I-4 | 0% | — | Diethanolamine | Oxygen | 4.97 | 1510 |
| Comparative Example I-5 | 5% | Propionic acid | Diethanolamine | Oxygen | 4.94 | 1500 |
| Comparative Example I-6 | 5% | n-octanoic acid | Diethanolamine | Oxygen | 4.94 | 1500 |

TABLE 26

|  | Carboxylic acid additive amount (mol %) | Added carboxylic acid form | Added stabilizer | Baking atmosphere | Capacitance ($\mu$F/cm$^2$) | Specific permittivity $\epsilon r$ |
|---|---|---|---|---|---|---|
| Example I-51 | 0.1% | 2-ethyl hexanoic acid | Acetylacetone | Dry air | 5.04 | 1530 |
| Example I-52 | 0.1% | 3-ethyl pentanoic acid | Acetylacetone | Dry air | 5.04 | 1530 |
| Example I-53 | 0.1% | 2-ethylbutyric acid | Acetylacetone | Dry air | 5.07 | 1540 |
| Example I-54 | 0.1% | iso-valeric acid | Acetylacetone | Dry air | 5.07 | 1540 |
| Example I-55 | 0.1% | n-butyric acid | Acetylacetone | Dry air | 5.04 | 1530 |
| Example I-56 | 1% | 2-ethyl hexanoic acid | Acetylacetone | Dry air | 5.16 | 1570 |
| Example I-57 | 1% | 3-ethyl pentanoic acid | Acetylacetone | Dry air | 5.13 | 1560 |
| Example I-58 | 1% | 2-ethylbutyric acid | Acetylacetone | Dry air | 5.13 | 1560 |
| Example I-59 | 1% | iso-valeric acid | Acetylacetone | Dry air | 5.10 | 1550 |
| Example I-60 | 1% | n-butyric acid | Acetylacetone | Dry air | 5.10 | 1550 |
| Example I-61 | 3% | 2-ethyl hexanoic acid | Acetylacetone | Dry air | 5.23 | 1590 |
| Example I-62 | 3% | 3-ethyl pentanoic acid | Acetylacetone | Dry air | 5.26 | 1600 |
| Example I-63 | 3% | 2-ethylbutyric acid | Acetylacetone | Dry air | 5.20 | 1580 |
| Example I-64 | 3% | iso-valeric acid | Acetylacetone | Dry air | 5.26 | 1600 |
| Example I-65 | 3% | n-butyric acid | Acetylacetone | Dry air | 5.26 | 1600 |
| Example I-66 | 5% | 2-ethyl hexanoic acid | Acetylacetone | Dry air | 5.98 | 1820 |
| Example I-67 | 5% | 3-ethyl pentanoic acid | Acetylacetone | Dry air | 5.95 | 1810 |
| Example I-68 | 5% | 2-ethylbutyric acid | Acetylacetone | Dry air | 5.98 | 1820 |
| Example I-69 | 5% | iso-valeric acid | Acetylacetone | Dry air | 5.92 | 1800 |
| Example I-70 | 5% | n-butyric acid | Acetylacetone | Dry air | 5.95 | 1810 |
| Example I-71 | 10% | 2-ethyl hexanoic acid | Acetylacetone | Dry air | 5.82 | 1770 |
| Example I-72 | 10% | 3-ethyl pentanoic acid | Acetylacetone | Dry air | 5.82 | 1770 |
| Example I-73 | 10% | 2-ethylbutyric acid | Acetylacetone | Dry air | 5.75 | 1750 |
| Example I-74 | 10% | iso-valeric acid | Acetylacetone | Dry air | 5.75 | 1750 |
| Example I-75 | 10% | n-butyric acid | Acetylacetone | Dry air | 5.79 | 1760 |
| Comparative Example I-7 | 0% | — | Acetylacetone | Dry air | 5.00 | 1520 |
| Comparative Example I-8 | 5% | Propionic acid | Acetylacetone | Dry air | 4.97 | 1510 |
| Comparative Example I-9 | 5% | n-octanoic acid | Acetylacetone | Dry air | 4.97 | 1510 |

As can be seen from Tables 24 to 26, as compared to the PZT ferroelectric thin films of Comparative Examples I-1, I-4 and I-7 with no addition of carboxylic acid and the PZT ferroelectric thin films of Comparative Examples I-2, I-3, I-5, I-6, I-8 and I-9 with an addition of carboxylic acid which does not take a 6-membered ring structure upon coordination with a metal, the ferroelectric thin films of Examples I-1 to I-75 with a 0.1% to 10% addition of carboxylic acid which can take a 6-membered ring structure upon coordination with a metal exhibited a high capacitance and a high specific permittivity at a thin film thickness of about 270 nm. From these results, it can be seen that the ferroelectric thin films of Examples I-1 to I-75 exhibit excellent basic characteristics as a capacitor.

In addition, according to the results of the ferroelectric thin films of Examples I-1 to G-75 with varying additive amounts of carboxylic acid which can take a 6-membered ring structure upon coordination with a metal, particularly Examples I-16 to I-20, I-41 to I-45 and I-66 to I-70 with a 5% addition of carboxylic acid exhibited high numerical results in terms of capacitance and specific permittivity, followed by in the order of: Examples I-21 to I-25, I-46 to I-50 and I-71 to I-75 with a 10% addition of carboxylic acid; Examples I-11 to I-15, I-36 to I-40 and I-61 to I-65 with a 3% addition of carboxylic acid; Examples I-6 to I-10, I-31 to I-35 and I-56 to I-60 with a 1% addition of carboxylic acid; and Examples I-1 to I-5, I-26 to I-30 and I-51 to I-55 with a 0.1% addition of carboxylic acid.

From these results, when carboxylic acid is added which can take a 6-membered ring structure upon coordination with a metal, it was demonstrated that there is an appropriate range of the additive amount capable of contributing to improvements of the capacitance and specific permittivity r.

The ferroelectric thin film-forming composition of Examples I-1 to I-75, a method for forming a ferroelectric thin film and a ferroelectric thin film formed by the same method exhibit excellent basic characteristics as a capacitor, and can be used for a thin film capacitor with a high capacity density.

Although the preferred embodiments of the present invention have been disclosed for illustrative purposes, those skilled in the art will appreciate that additions, omissions, substitutions and other modifications are possible, without departing from the scope and spirit of the invention. The present invention is not limited by the aforementioned description, and is confined only by the accompanying claims.

INDUSTRIAL APPLICABILITY

The ferroelectric thin film-forming composition, the method for forming a ferroelectric thin film and the ferroelectric thin film formed by the same method, in accordance with the present invention, can be applied for use in composite electronic components of capacitors, IPDs, DRAM memory condensers, multilayer capacitors, transistor gate insulators, nonvolatile memories, pyroelectric infrared detection devices, piezoelectric devices, electro-optical devices, actuators, resonators, ultrasonic motors, or LC noise filter devices.

What is claimed is:

1. A composition for the formation of a ferroelectric thin film which is used in the formation of a ferroelectric thin film of one material selected from the group consisting of PLZT, PZT, and PT, wherein the composition is a liquid composition for the formation of a thin film of a mixed composite metal oxide formed of a mixture of a composite metal oxide A represented by the general formula (1): $(Pb_xLa_y)(Zr_zTi_{(1-z)})O_3$ [In the formula (1), $0.9 < x < 1.3$, $0 < y < 0.1$, and $0 < z < 0.9$] with a composite oxide B including Ce, the composition comprising an organometallic compound solution wherein a raw material of the composite metal oxide A and a raw material of the composite oxide B are dissolved in an organic solvent in such a proportion as to provide the metal atom ratio represented by the general formula (1), wherein, the raw material of the composite metal oxide A and the raw material of the composite oxide B are an organometallic compound, and a total concentration of the organometallic compound in the organometallic compound solution of the composition for the formation of a ferroelectric thin film is in the range of 0.1 to 10% by mass.

2. The composition for the formation of a ferroelectric thin film according to claim 1, wherein the raw material of the composite metal oxide A is a compound whose organic radical is bound to a metal element through oxygen or nitrogen atoms thereof.

3. The composition for the formation of a ferroelectric thin film according to claim 2, wherein the raw material of the composite metal oxide A is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

4. The composition for the formation of a ferroelectric thin film according to claim 1, wherein the raw material of the composite oxide B includes Ce, and is a compound whose organic radical is bound to a metal element through oxygen or nitrogen atoms thereof.

5. The composition for the formation of a ferroelectric thin film according to claim 4, wherein the raw material of the composite oxide B includes Ce and is one or more selected from the group consisting of a metal alkoxide, a metal diol complex, a metal triol complex, a metal carboxylate, a metal β-diketonato complex, a metal β-diketoester complex, a metal β-iminoketo complex, and a metal amino complex.

6. The composition for the formation of a ferroelectric thin film according to claim 1, further comprising one or more stabilizers selected from the group consisting of β-diketone, β-ketonic acid, β-ketoester, oxy-acid, diol, triol, higher carboxylic acid, alkanol amine and polyamine, in a proportion of 0.2 to 3 mol per 1 mol of the total amount of metals in the composition.

7. The composition for the formation of a ferroelectric thin film according to claim 1, wherein the composite oxide B includes Ce, and the molar ratio B/A of the composite oxide B to the composite metal oxide A is in the range of $0<B/A<0.05$.

8. The composition for the formation of a ferroelectric thin film according to claim 7, wherein the composite oxide B includes Ce, and the molar ratio B/A of the composite oxide B to the composite metal oxide A is in the range of $0.005 \leq B/A \leq 0.03$.

9. The composition for the formation of a ferroelectric thin film according to claim 7, wherein the composite oxide B includes Ce, and the molar ratio B/A of the composite oxide B to the composite metal oxide A is in the range of $0.03 \leq B/A < 0.05$.

10. The composition for the formation of a ferroelectric thin film according to claim 1, wherein a leakage current density is $2.41 \times 10^{-7}$ (A/cm$^2$) or less upon application of 5 V in the ferroelectric thin film which is formed using the composition and which has a thickness of 50 to 500nm.

11. The composition for the formation of a ferroelectric thin film according to claim 1, wherein a leakage current density is $4.79 \times 10^{-7}$ (A/cm$^2$) or less upon application of 20 V in the ferroelectric thin film which is formed using the composition and which has a thickness of 50 to 500nm.

12. The composition for the formation of a ferroelectric thin film according to claim 1, wherein a specific permittivity ∈r is 1300 or more on a frequency of 1 kHz in the ferroelectric thin film which is formed using the composition and which has a thickness of 50 to 500 nm.

13. The composition for the formation of a ferroelectric thin film according to claim 1, wherein a specific permittivity ∈r is 1570 or less on a frequency of 1 kHz in the ferroelectric thin film which is formed using the composition and which has a thickness of 50 to 500 nm.

* * * * *